United States Patent
Yang

(12) 
(10) Patent No.: US 6,263,484 B1
(45) Date of Patent: Jul. 17, 2001

(54) PROTOTYPING SYSTEM AND A METHOD OF OPERATING THE SAME

(76) Inventor: Yang-Sei Yang, 101-2108 Shindonga Apt., Kuseo-dong, Keumjeong-Ku, Pusan (KR)

( * ) Notice: Subject to any disclaimer, the term of this patent is extended or adjusted under 35 U.S.C. 154(b) by 0 days.

(21) Appl. No.: 09/164,758

(22) Filed: Oct. 1, 1998

(30) Foreign Application Priority Data

Oct. 1, 1997 (KR) .................................................. 97-50810
Sep. 19, 1998 (KR) .................................................. 98-38834

(51) Int. Cl.⁷ ...................................................... G06F 17/50
(52) U.S. Cl. ................................... 716/18; 716/4; 703/16
(58) Field of Search ....................... 716/1–21; 703/13–16

(56) References Cited

U.S. PATENT DOCUMENTS

| | | | |
|---|---|---|---|
| 4,862,399 | * 8/1989 | Freeman | 714/738 |
| 5,448,496 | 9/1995 | Butts et al. | 716/16 |
| 5,452,231 | 9/1995 | Butts et al. | 716/16 |
| 5,452,239 | 9/1995 | Dai et al. | 703/19 |
| 5,563,829 | 10/1996 | Huang | 365/189.04 |
| 5,574,388 | 11/1996 | Barbier et al. | 326/41 |
| 5,612,891 | 3/1997 | Butts et al. | 716/16 |
| 5,633,813 | * 5/1997 | Srinivasan | 703/14 |
| 5,657,241 | 8/1997 | Butts et al. | 716/16 |
| 5,661,662 | 8/1997 | Butts et al. | 716/16 |
| 5,680,332 | * 10/1997 | Raimi et al. | 703/13 |
| 5,699,283 | 12/1997 | Okazaki et al. | 703/15 |
| 5,715,172 | 2/1998 | Tzeng | 716/6 |
| 5,734,581 | 3/1998 | Butts et al. | 703/15 |
| 5,862,361 | * 1/1999 | Jain | 703/16 |
| 6,009,256 | * 12/1999 | Tseng et al. | 703/13 |
| 6,026,230 | * 2/2000 | Lin et al. | 703/13 |
| 6,049,662 | * 4/2000 | Saha et al. | 703/16 |
| 6,080,203 | * 6/2000 | Njinda et al. | 716/4 |

OTHER PUBLICATIONS

Manku et al. ("Circuit partitioning with partial order for mixed simulation emulation environment", Proceedings of Sixth IEEE International Workshop on Rapid System Prototyping, Jun. 7, 1995, pp. 201–207).*

Kim et al. ("PESE: an efficient partition–based electrical simulation environment", Proceedings of the 38th Midwest Symposium on Circuits and Systems, Aug. 13, 1995, vol. 1, pp. 57–60).*

Lo et al. ("Hardware emulation board based on FPGAs and programmable interconnections", Proceedings of Fifth International Workshop on Rapid System Prototyping, Shortening the Path from Specification to Prototype, Jun. 21, 1994, pp. 126–130).*

* cited by examiner

Primary Examiner—Matthew Smith
Assistant Examiner—Phallaka Kik
(74) Attorney, Agent, or Firm—Senniger, Powers, Leavitt & Roedel

(57) ABSTRACT

The present invention provides a prototyping system which is capable of the verification of a designed circuit by using various IPs in verifying the designed circuit with ease, which prototyping system includes a prototyping engine, a server computer, and an interface module. The prototyping engine has many component devices, for example, RFPDs and communication ports connecting the RFPDs to one another, and each of the communication ports has an additional circuit for R-communication which is to transmit signal values among the RFPDs. The server computer partitions the designed circuit to be verified with partial circuits by executing a prototyping system software, allocates the partitioned partial circuits to the respective components devices including RFPDs of the engine, and produces a programming pattern for some of the partial circuits of the designed circuit to be verified. The interface module is in charge of interfacing between the server computer and the prototyping engine.

38 Claims, 40 Drawing Sheets

FIG. 29
(a)
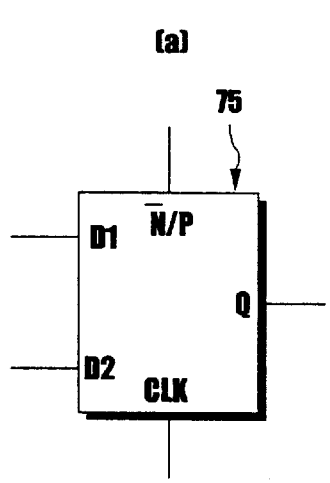
(b)
| N̄/P | D1 | D2 | CLK | Q |
|---|---|---|---|---|
| 0 | 0 | — | ↑ | 0 |
| 0 | 1 | — | ↑ | 1 |
| 1 | — | 0 | ↑ | 0 |
| 1 | — | 1 | ↑ | 1 |
(c)
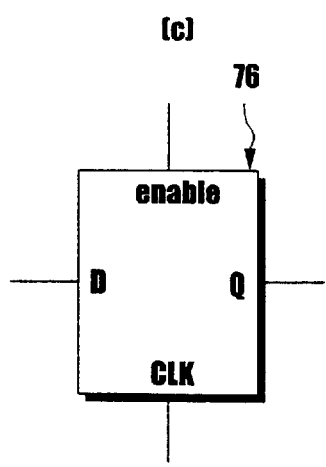
(d)
| enable | D | CLK | Q |
|---|---|---|---|
| 1 | 0 | ↑ | 0 |
| 1 | 1 | ↑ | 1 |
| 0 | — | ↑ | NOT CHANGE |

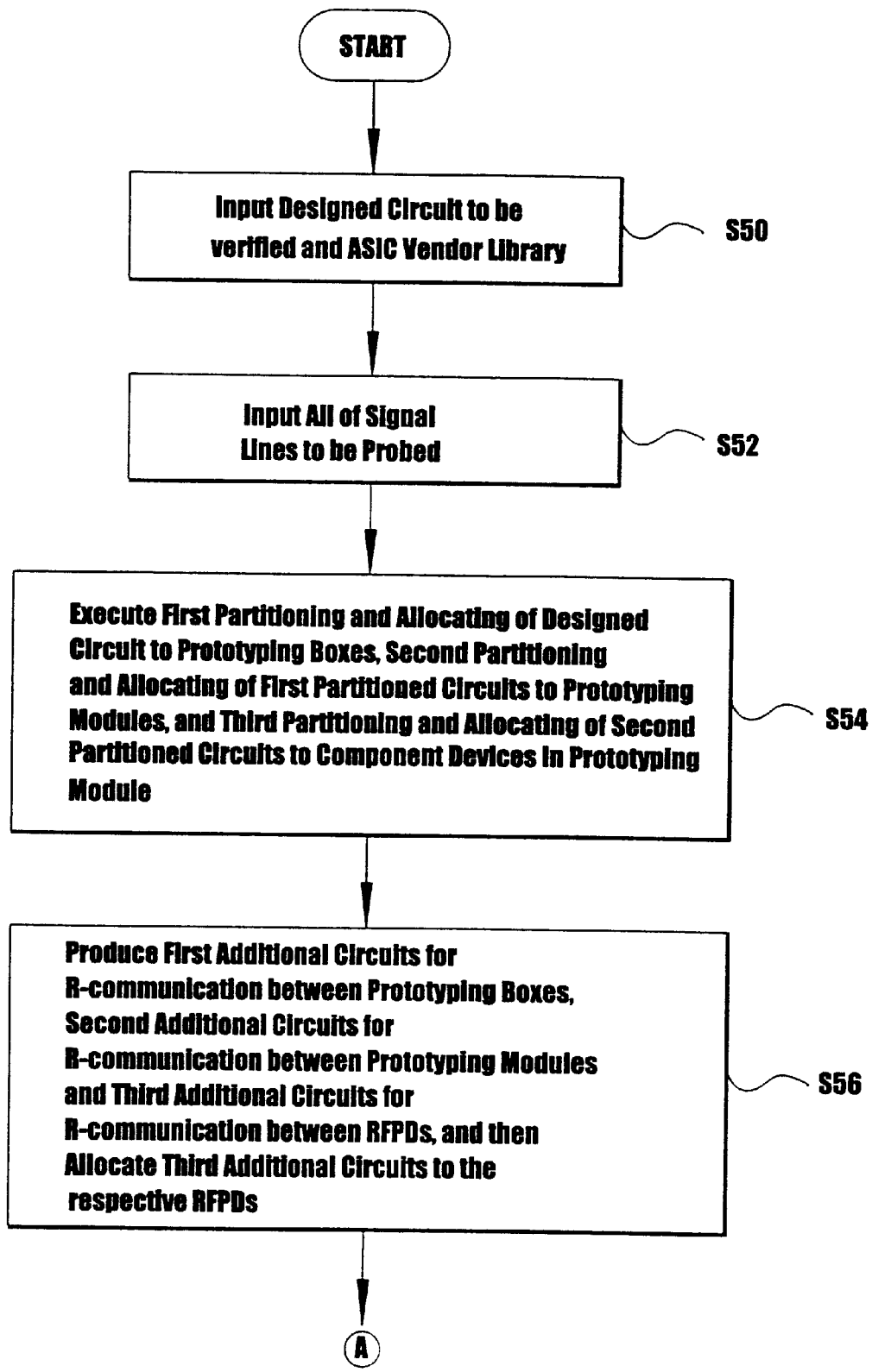

FIG. 36
(a)
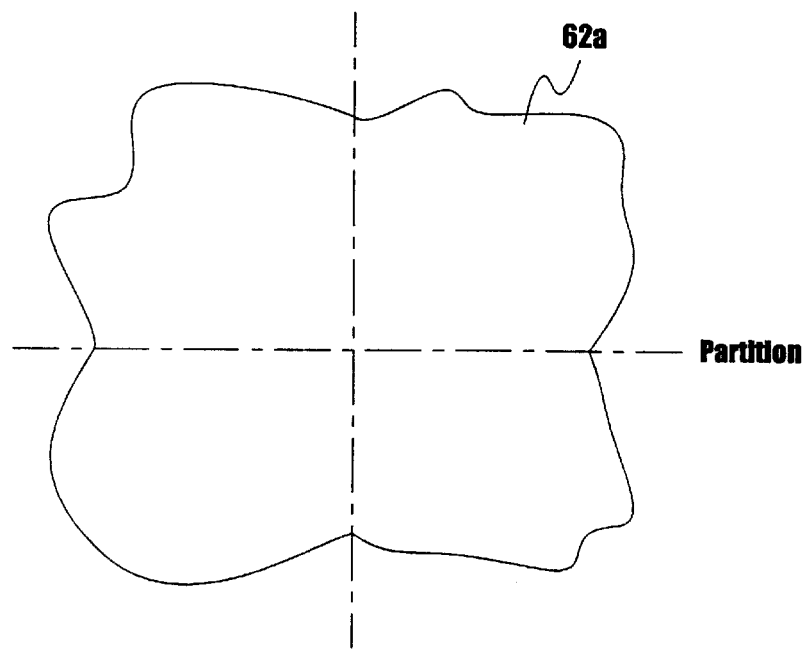
(b)
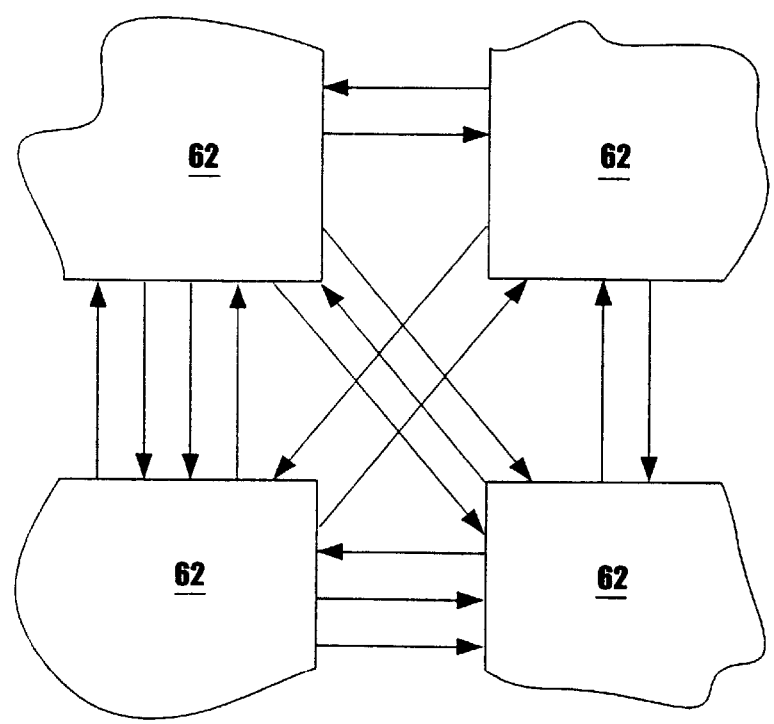

PROTOTYPING SYSTEM AND A METHOD OF OPERATING THE SAME

BACKGROUND OF THE INVENTION

1. Field of the Invention

This invention relates to the verification of, based on emulation, system-level digital circuits which have been designed; more particularly, relates to a prototyping system which implements rapidly a designed digital circuit in the same form of actual hardware with "Reusable Field Programmable Devices" (or chips) and other discrete devices and verifies the designed digital circuit in a short time, and to a method for operating the prototyping system.

2. Description of Prior Art

As technologies for the design of integrated circuits and the manufacture of semiconductor improve rapidly, the scale and complexity of digital circuit design has increased tremendously, and it has been possible to design and manufacture system-level digital circuits capable of implementing microprocessors, digital signal processors, memory devices, application specific logic circuits, etc. on a single chip. Meanwhile, since it becomes necessary to develop a new high quality product in a very short time in order to survive the vicious competition in the market, high-speed prototyping systems capable of implementing and verifying designed circuits effectively have become increasingly important.

Up to now, a logic simulator based on software has been used to verify the operation of designed digital circuits; however, the logic simulator is not absolutely reliable since it is based on software modeling in a virtual environment, not on implementing an actual circuit. The capability of simulation software and computer cannot affiliate the size and complexity of digital circuits to be verified. To overcome the shortcomings of the logic simulator and to verify a designed circuit more accurately, it has been developed a technology for verifying a designed circuit based on hardware emulation which is closer to the actual digital circuit and which technology is capable of verifying the designed circuit more accurately (hereinafter referred to as "Rapid Prototyping"). The verification of a designed digital circuit by using the "Rapid Prototyping" can be executed at high speed since it is executed by an actual hardware implementation. The verification of a designed digital circuit by using the "Rapid Prototyping" also allows the design verification to be performed in an environment close to the actual hardware. The verification process for a digital circuit design using this prototyping is such that verifying signals are applied at the input of hardware on where the designed circuit to be verified is implemented, and logic values appearing on many signal lines existing in the circuits including output lines are probed to see if they match the logic values intended by the designer by rigorously probing the signal lines.

Recently, "Reusable Field Programmable Devices" (hereinafter referred to as "RFPDs") have been frequently used in industry, since any digital circuit can be implemented in the RFPDs by being simply programmed onto the devices, and further, due to the unlimited programmable number, the devices can be reused. There are several types of RFPDs such as a field programmable gate array, a complex programmable logic device, etc. In general prototyping systems based on emulation, the digital circuit to be verified is implemented in the prototyping engine which is composed by interconnecting several ten to several thousand RFPDs and other discrete devices such as microprocessors, digital signal processors, application specific non-memory devices or memories. The capacity of a prototyping system is determined based on an important factor, which is whether the prototyping system can provide solutions for the following problems. First, probing signal lines is inherently difficult since many signal lines existing within the digital circuits to be verified exist inside RFPDs; this problem becomes more serious when more highly integrated RFPDs are used. Second, in a circuit design using the so called "Intellectual Property" (hereinafter referred to as "IP") which has begun to be used frequently in system-level designs, it is required that a variety of IPs can be used in convenience by the prototyping system, since the system uses different IPs to execute the verification of a designed circuit effectively. To solve this problem, a method for replacing the existing devices or boards into prototyping engine with devices or boards needed by a user or for newly adding the needed devices or boards should be provided. Third, the usage rate of RFPDs by the prototyping engine is very low when a digital circuit is implemented in the prototyping engine, since the number of pins of RFPDs cannot be increased proportionally regardless of increasing RFPDs' integration degree. Fourth, it is required that low integrated RFPDs used in conventional prototyping engine can be replaced with high integrated RFPDs with ease so as to increase the capability of the prototyping engine.

As a conventional prototyping system, for example, U.S. patent publication No. 5,452,231 has been disclosed, and the content of the publication is incorporated in this specification as a reference. FIG. 38 is a schematic diagram of a conventional prototyping system. As shown in FIG. 38, in the conventional system, a conventional prototyping engine 8 is connected to a server computer 40 through an interface module 42. In the prototyping engine 8, a plurality of RFPDs 2 used for implementing logic gates and a plurality of RFPDs 4 which are used for connection are connected to an emulation system bus 6, and the emulation system bus 6 is connected to a system interface bus 26. To form the conventional prototyping engine (8), the RFPDs used in the prototyping engine are divided into two groups, RFPDs used for implementing logic gates and RFPDs used for interconnection of logic gates. The connection between the two groups is implemented in partial crossbar, where there is no direct connection between the RFPDs in the same group. This connection type can be a solution for the timing problems, which occur in logic emulation, but also causes other problems. In the conventional prototyping systems, other devices accept the RFPDs, such as microprocessors, digital signal processors and application specific non-memory devices cannot be used easily in the prototyping engine, and it is not easy to replace the RFPDs used in the prototyping engine with high integrated and high speed RFPDs. Further, in case that signal lines existing in a designed circuit to be verified exist also in certain RFPDs, real time probing is impossible, and too many RFPDs are needed in the emulation since the rate of using the resources in the RFPDs is too low due to the physical limitation of the number of input/output pins of each RFPD.

SUMMARY OF THE INVENTION

It is therefore an object of the present invention to provide a prototyping system and a method for operating the prototyping system which would resolve the above mentioned problems. More specifically, it is an object of the present invention to provide a prototyping system capable of probing signal lines in designed system-level digital circuits in real time and an automated operating method for the system. It is another object of the present invention to provide a unique additional circuit for communication to the designed circuits to be verified which is designed by using various IPs in verifying the designed circuits by using the prototyping system with ease, and to use various semiconductor devices such as RFPDs, memories, microprocessors, digital signal processors, application specific non-memory devices, etc. and/or circuit boards using these semiconductor devices with ease in the prototyping engine for fast and effectively verifying a system-level digital circuit. The additional communication circuit of the present invention provides consistent and seamless interface, which makes more systematic and hierarchical connection possible. It is a further object of the present invention to increase the usage rate of RFPDs in the prototyping engine even with the limited number of pins of RFPDs. It is still a further object of the present invention to replace the RFPDs having low integration degree used in the prototyping engine by RFPDs having high integration degree with ease, and to increase the capability of the prototyping engine.

To achieve the object, the prototyping system in accordance with the present invention includes a prototyping engine, a server computer, and an interface module. The prototyping engine has many component devices, for example, RFPDs and communication ports connecting the RFPDs to one another, and each of the communication ports has an additional communication circuit (called additional circuit for R-communication, and will be explained later) which is to transmit signal values among the RFPDs. The server computer partitions the designed circuit to be verified with partial circuits by executing prototyping system software, allocates the partitioned partial circuits to the respective RFPDs or other component devices in the engine, and produces a programming pattern for each (or some) of the partial circuits of the designed circuit to be verified for the RFPDs. The interface module is in charge of interfacing between the server computer and the prototyping engine.

A prototyping engine may be formed by a reconfigurable logic module, and each of the component devices in the reconfigurable logic module may be a RFPD capable of implementing various forms of the digital hardware through programming the RFPD, and each RFPD may include at least one inter-RFPD communication port connected to its input/output terminals. Or, the engine may be formed by a prototyping engine box, and each of the component devices in the engine box may be a prototyping engine module, and the prototyping engine module may have at least one RFPD. Or, the engine may be formed by a prototyping engine cabinet, and each of the component devices in the engine cabinet may be a prototyping engine box, and the engine box may have at least one prototyping engine module, and the prototyping engine module may have at least one RFPD.

Each of the prototyping engine modules including a reconfigurable logic module may also include output probe lines and/or input probe lines connected to the input/output terminals of the RFPDs. Further, the prototyping system software may include a synthesizer of additional logic for probing which generates additional circuits for P-probe.

It is desirable that the prototyping system includes some ASIC vendor libraries, and that the additional circuit for R-communication and/or the additional circuit for P-probe be implemented in each of the RFPDs by executing the system software on the server computer.

It is desirable that for connecting logic signal lines among the component devices in the prototyping engine, the communication channels separated from each of the partial circuits of the designed circuit to be verified which is implemented by partitioning and allocating to RFPDs in the prototyping engine be composed of RFPD external communication channels and RFPD internal communication channels, and be shared among all RFPDs in the prototyping engine. The additional circuit for R-communication in each of the RFPDs is composed of a signal transmitter, a signal receiver, a finite state machine, and an internal communication channel of each RFPD. The communication channel composed of the RFPD external communication channel and the RFPD internal communication channel comprised as pipeline method, and connects logic signal lines among the devices in the prototyping engine by communication in pipelined fashion in which signal values are transmitted and received in parallel between at least two pairs of a signal transmitter and a signal receiver group in at least two additional circuits for R-communication.

The additional circuit for R-communication is composed of a signal transmitter, a signal receiver, a finite state machine, and an internal communication channel. In detail, the internal communication channel is formed by a flip-flop having an enable input portion which connects its data input portion of the RFPD internal communicational channel to the RFPD external communication channel and one side data input portion of the multiplexer connected to the data output portion of the flip-flop. The signal transmitter is composed of the other data input portion of the multiplexer, and the signal receiver is composed of a D flip-flop having an enable input portion which connects data input portion to the external communication channel. To control these devices and their timings of signal transmitter, signal receiver and RFPD internal communication channel by output signals of finite state machine, the output signals of the finite state machine are connected to the enable inputs of the flip-flops and selection input of the multiplexer.

One emulation clock cycle is divided into an R-communication phase and an execution phase. In the R-communication phase, all signal value transmission among all the additional circuits for R-communication is carried out by pipelined ring topology communication. In execution phase it is desirable that the partial circuits of the designed circuit to be verified be executed with the transmitted signal values.

The additional circuit for P-probe executes a closed register circulating operation while keeping the logic values of flip-flops which are not included in a circular ring feedback register same as the logic values just before the circulating operation in the output probe mode, and an opened register shifting operation while keeping the logic values of flip-flops which are not included in a circular ring feedback register same as the logic values just before the shifting operation in the input probe mode. Also, the additional circuit for P-probe does not change the logical functionality of the designed circuit to be verified in the normal mode.

In probe mode, additional circuit for P-probe is comprised by forming at least one circular ring feedback register array structure same in length (length means the number of the flip-flops in circular ring feedback register array structure) logically, or the longest circular ring feedback register array structure being positive multiples of the rest of the ring feedback register arrays logically with the partial circuits of the designed circuit to be verified which is allocated to RFPD, signal lines to be probed, and double input flip-flops. During the output probe mode, the output of a flip-flop existing in circular ring feedback register array structure is logically connected to one of the output probe lines of RFPDs. During the input probe mode, the data input of a flip-flop existing in circular ring feedback register array structures is logically connected to one of the input probe lines. In normal mode, the additional circuit for P-probe does not alter the functionality of the partial circuit of the designed circuit to be verified allocated to RFPD. The circular ring feedback register array in the additional circuit for P-probe can be formed by a series of double input flip-flops, or a series of double input flip-flops and a multiplexer whose another data input is connected to an input probe line and its selection input is connected to the probe mode control line. A single clock can be applied to the clock input of all double input flip-flops of circular ring feedback register arrays of additional circuit for P-probe in probe mode.

The output probe line and the input probe line may be independent unidirectional probe lines individually, or a bidirectional probe line combining the output probe line and the input probe line.

The partial circuit of the designed circuit to be verified, the additional circuit for R-communication, and the additional circuit for P-probe can be implemented together in RFPDs in the prototyping engine, or the partial circuit of the designed circuit to be verified and additional circuit for P-probe can be implemented in RFPDs for logic implementation, and the additional circuit for R-communication can be implemented in RFPDs for communication in the prototyping engine.

Each RFPD in the prototyping engine can be either a "field programmable gate array" or a "complex programmable logic device".

The prototyping system software may include a scheduler for R-communication and a synthesizer of additional circuit for R-communication.

The prototyping engine module can be one of a reconfigurable logic module, a memory device mounted module, a microprocessor mounted module, a digital signal processor mounted module, an application specific non-memory device mounted module, or an input/output port mounted module. The reconfigurable logic module has at least two RFPDs, at least one inter-RFPD communication port which is connected to the input/output terminal of each of at least two RFPDs, at least one inter-module communication port which is connected to the input/output terminal of each of said at least two RFPDs, and at least one inter-box communication port which is connected to the input/output terminal of each of said at least two RFPDs. The memory device mounted module has at least one RAM or ROM memory device, at least one RFPD connected to said at least one memory device, at least one inter-RFPD communication port which is connected to the input/output terminal of said at least one RFPD, at least one inter-module communication port which is connected to the input/output terminal of said at least one RFPD, and at least one inter-box communication port which is connected to the input/output terminal of said at least one RFPD. The microprocessor mounted module has at least one microprocessor, at least one RFPD connected to said at least one microprocessor, at least one inter-module communication port which is connected to the input/output terminal of said at least one RFPD, and at least one inter-box communication port which is connected to the input/output terminal of said at least one RFPD. The digital signal processor mounted module has at least one digital signal processor, at least one RFPD connected to said at least one digital signal processor, at least one inter-module communication port which is connected to the input/output terminal of said at least one RFPD, and at least one inter-box communication port which is connected to the input/output terminal of said at least one RFPD. The application specific non-memory device mounted module has at least one application specific non-memory device, at least one RFPD connected to said at least one application specific non-memory device, at least one inter-module communication port which is connected to the input/output terminal of said at least one RFPD, and at least one inter-box communication port which is connected to the input/output terminal of said at least one RFPD. The input/output port mounted module has at least one input/output port, at least one RFPD connected to said at least one input/output port, at least one inter-module communication port which is connected to the input/output terminal of said at least one RFPD, and at least one inter-box communication port which is connected to the input/output terminal of said at least one RFPD.

The prototyping method of present invention includes the following steps: a step for inputting the designed circuit to be verified by server computer; a step for partitioning the input the designed circuit to be verified and allocating the partial circuits to multiple RFPDs; a step for producing additional circuit for R-communication which carries out communication among RFPDs which makes the circuit produced through communication among RFPDs functionally equivalent to the designed circuit to be verified; s step for producing programming pattern, which implements the partial circuit of the designed circuit to be verified and the additional circuit for R-communication on related RFPDs, from the first extended partial circuit of designed circuit to be verified; a step for downloading the produced programming pattern to each RFPD of the prototyping engine through interface module from server computer and for implementing equivalent circuit of the designed circuit to be verified in the prototyping engine; and a step for applying input stimuli to the implemented equivalent circuit of the designed circuit to be verified and for observing output responses and for carrying out verifying the designed circuit to be verified.

The prototyping engine can be formed by reconfigurable logic module which includes at least two RFPDs, or by an engine box. The component device of the engine box may be prototyping engine module. The prototyping engine module includes at least one RFPD and can include a step for re-partitioning the partial circuit which has been pre-partitioned to specific prototyping engine module and allocating these partial circuits to RFPDs in the engine module. The prototyping engine can be composed of prototyping engine cabinet. The component device of the engine cabinet is prototyping engine box. The engine box includes at least one RFPD and can include a step for re-partitioning the partial circuit which has been pre-partitioned to specific prototyping engine box and allocating these partial circuits to engine modules in the engine box and a step for re-partitioning the partial circuit which has been pre-partitioned to specific prototyping engine module and allocating these to RFPDs in the engine module.

The prototyping engine module can be one of the configurable logic module, the memory device mounted module, microprocessor mounted module, the digital signal processor mounted module, the application specific non-memory device mounted module, or the input/output port mounted module.

The input step can include a step for inputting the title of an ASIC vendor library in server computer.

The prototyping engine module having at least one RFPD may have at least one input probe line and output probe line connected to the input/output terminal of at least one RFPD and the additional circuit for P-probe, and the prototyping method may includes a step for determining whether it is an input-probe signal line or an output-probe signal line if the signal line to be probed is allocated to the inside of a RFPD may be necessary. The input step includes a step for inputting signal lines to be probed existing in the designed circuit to be verified by the server computer. The step for producing programming patterns may include a step for producing a second extended partial circuit of the designed circuit to be verified by the adding additional circuit for P-probe to the partial circuit of the designed circuit to be verified allocated to the RFPD and to the additional circuit for R-communication so as to make the output-probe signal lines in a predetermined time frame to appear at the output probe line during the certain time period and some input-probe signal lines to have the signal values on input probe line applied at the predetermined time frame.

The value appeared on the output probe line is transmitted to the server computer through the system interface port and the interface module, and analyzed in it. For the input-probe signal lines, after data for input probe is produced from the server computer, the data is applied to the input probe line, while being synchronized with only the probing clock, through interface module and system interface port, or while being synchronized with probing clock and probing mode control signal line which alternates probing mode between input probing mode and output probing mode so that input-probe signal lines can have input probe value transmitted through input probe line.

The prototyping method in accordance with the present invention may include following several steps: a step for inputting the designed circuit to be verified and the name of ASIC vendor library in server computer; a step for partitioning the input circuit into partial circuits and allocating the partitioned partial circuits of designed circuit to be verified to prototyping engine boxes, if necessary, and to the configurable logic modules, the memory device mounted modules, the microprocessor mounted modules, the digital signal processor mounted modules, the application specific non-memory device mounted modules, or the input/output port mounted modules if necessary, and re-partitioning the partial circuit allocated to specified prototyping engine module and allocating them to individual devices of engine module; a step for synthesizing the additional circuit for R-communication which performs communications among the devices in different engine boxes, among devices in different engine modules, and among devices in an engine module so that the circuit produced from the communications can be functionally equivalent to the designed circuit to be verified; a step for producing extended partial circuit of the designed circuit to be verified by combining the partial circuit of the designed circuit to be verified and the additional circuit for R-communication of the partial circuit of the designed circuit to be verified which is partitioned and allocated to each RFPD of engine modules in prototyping engine; a step for performing technology mapping, placement and routing, and generating programming pattern to implement extended partial circuit of the designed circuit to be verified on RFPDs; a step for implementing the functionally equivalent circuit of the designed circuit to be verified in prototyping engine by downloading produced programming pattern to RFPDs in prototyping engine through interface module and system interface port from the server computer; and a step for applying input stimuli to equivalent circuit of the designed circuit to be verified implemented in prototyping engine and observing output responses, and carrying out verifying of the designed circuit to be verified.

The prototyping method in accordance with the present invention may include the following several steps: a step for inputting the designed circuit to be verified and the name of an ASIC vendor library on the server computer; a step for inputting signal lines to be probed which exist in the designed circuit to be verified on the server computer; a step for partitioning the input circuit into partial circuits and allocating the partitioned partial circuits to reconfigurable logic modules, memory device mounted modules, microprocessor mounted modules, digital signal processor mounted modules, application specific non-memory device mounted modules or an input/output port mounted modules, and re-partitioning the partial circuit allocated to a specified prototyping engine module and allocating these to individual devices of the prototyping engine module; a step for combining additional circuit for R-communication which communicate among devices in different prototyping engine boxes, among devices in different prototyping engine modules, and among devices in an prototyping engine module with the corresponding partial circuit so that the produced circuits from the communication among devices in different engine boxes, among devices in different engine modules, and among devices in an engine module can be functionally equivalent to the designed circuit to be verified; a step for combining partial circuits of the designed circuit to be verified which are needed to be implemented in RFPDs and additional circuits for R-communication for the partial circuits of the designed circuit to be verified, each of which is partitioned and allocated to each engine module, and producing each of extended partial circuits of the designed circuit to be verified, and then determining whether each of the signal lines to be probed is an input probe signal line or an output probe signal line if the signal lines to be probed are allocated to the inside of RFPD; a step for enforcing signal values on the output-probe signal lines at the predetermined time frame to appear on the output probe lines, and for producing a plurality of extended partial circuits of the designed circuit to be verified for the partial circuits allocated to the RFPDs, the additional circuit for R-communication and the additional circuits for P-probe so that the signal lines to be input-probed have the signal values applied on the input probe lines at a predetermined time period; a step for performing technological mapping, placement and routing, and generating programming patterns to implement extended partial circuits of the designed circuit to be verified on RFPDs; a step for implementing the functionally equivalent circuit of the designed circuit to be verified in prototyping engine by downloading the produced programming patterns to the RFPDs of each prototyping engine module of the prototyping engine through the interface module and the system interface port from the server computer; and a step for applying input stimuli to the equivalent circuit of the designed circuit to be verified implemented in the prototyping engine and observing output responses, and for enforcing signal values on the output-probe signal lines at the predetermined time frame to appear on the output probe lines by using the additional circuits for P-probe if the signal lines to be probed are inside of RFPD. If necessary, the following steps may be included: a step for transmitting the signal values appearing on the output probe lines to the server computer through a system interface port and interface module, and analyzing the transmitted values, as to the output-probe signal lines; and, as to the input-probe signal lines, a step for enforcing the signal values of the input-probe signal lines to have the input probe values transmitted via the input probe lines.

As described above, prototyping systems and the operation methods in accordance with the present invention can probe all the signal lines in real time, use various IPs in prototyping with the standarized interface which allows use of various types of prototyping engines, increase the resource utilization rate of prototyping engines under thee limitation of the number of pins of RFPDs, and replace low integration RFPDs used in the prototyping engine with high integration RFPDs to improve the capability of the prototyping engine.

These and other objects and advantages of this invention will become apparent from the following detailed description of the embodiments with reference to the accompany drawings.

BRIEF DESCRIPTION OF THE DRAWINGS

FIG. 29 (*a*) is a schematic diagram representing a symbol of a double input D flip-flop having two data inputs and one extra enable input.

FIG. 29 (*b*) is a diagram representing the characteristic table of the double input D flip-flop shown in FIG. 29 (*a*).

FIG. 29 (*c*) is a schematic diagram representing a symbol of a single input D flip-flop having one data input and one extra enable input.

FIG. 29 (*d*) is a diagram representing the characteristic table of the single input D flip-flop shown in FIG. 29 (*c*).

FIG. 35A to FIG. 35C illustrates a flowchart representing prototyping method in accordance with a preferred embodiment of the present invention.

FIG 36 (*a*) and (*b*) are schematic diagrams illustrating a prototyping method in accordance with another preferred embodiment of the present invention.

DETAILED DESCRIPTION OF THE INVENTION

A detailed description of the present invention will be given in conjunction with the embodiment and the drawings.

Figure 1:
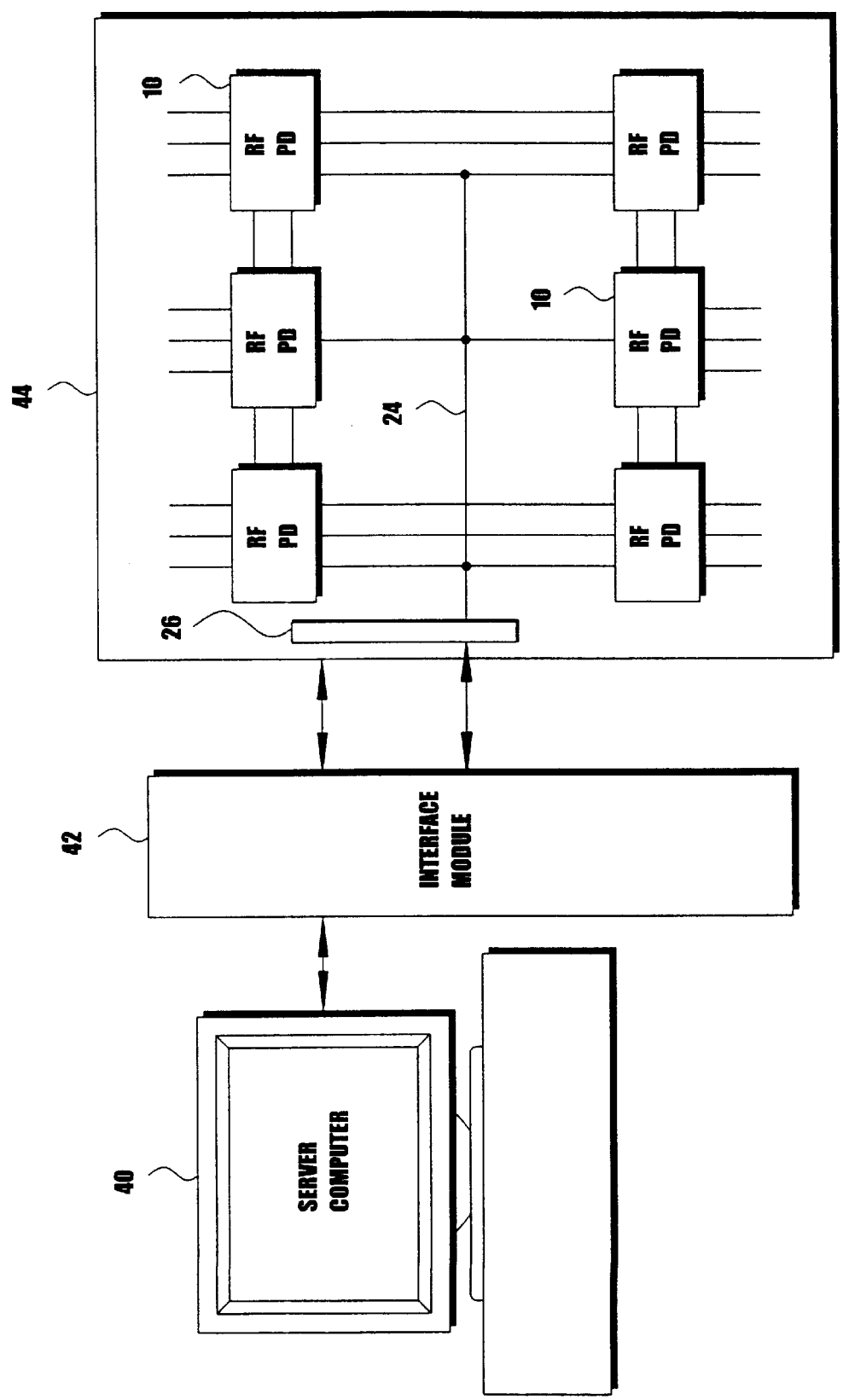
FIG. 1 is a schematic diagram showing the prototyping system of the present invention.

FIG. 1 is a schematic diagram illustrating the relationship between the prototyping engine in accordance with the present invention and server computer 40. The prototyping engine 44 is connected to server computer 40 through interface module 42. In prototyping engine 44, at least on RFPD 10 capable of implementing various types of digital hardware for the devices is/ are interconnected through chip I/O terminals and connected to system interface port 26 through probe line 24. System interface port 26 is connected to an interface module 42.

Figure 2:
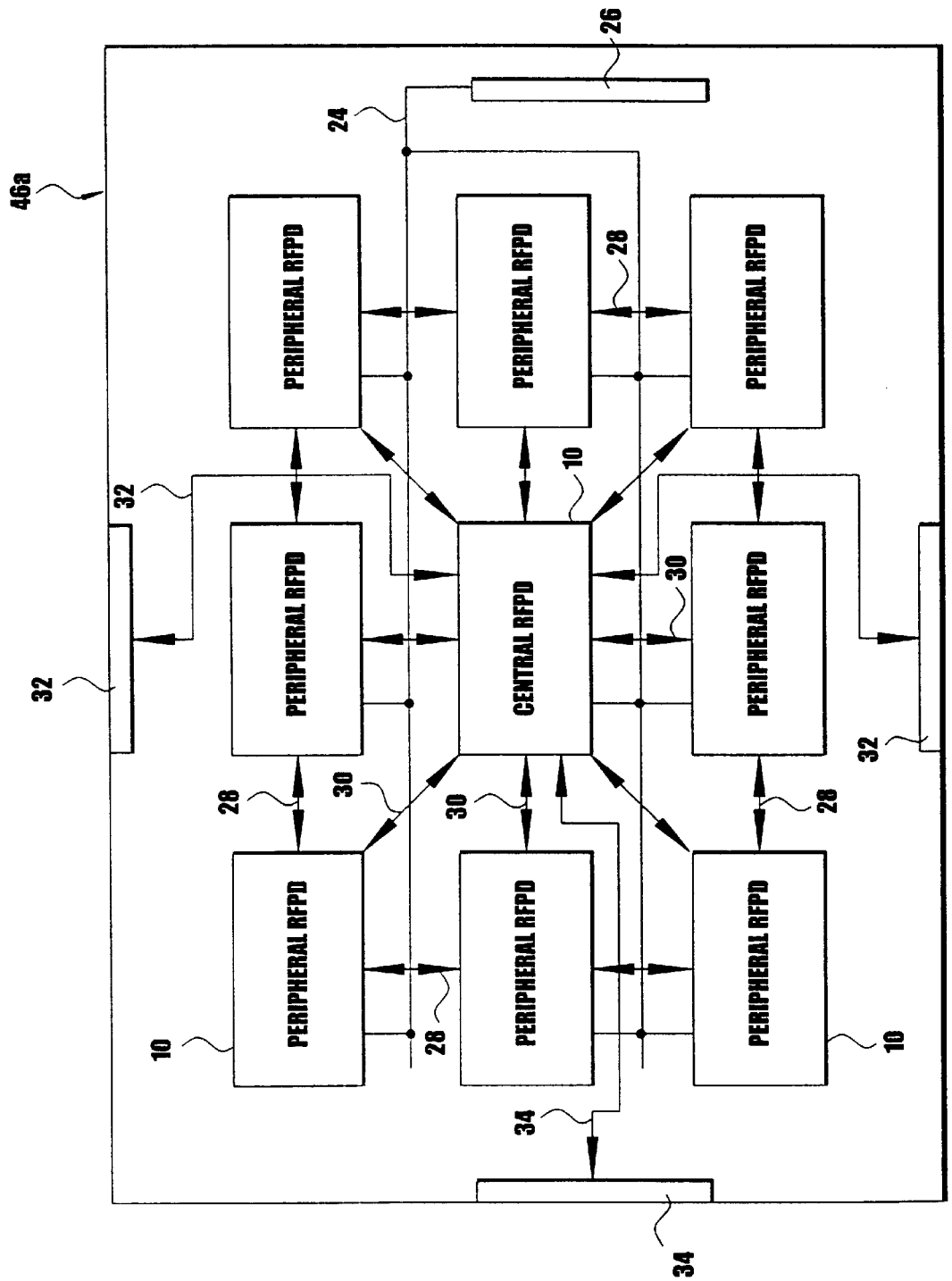
FIG. 2 is a schematic diagram showing one example of a reconfigurable logic module of the present invention.
Figure 13:
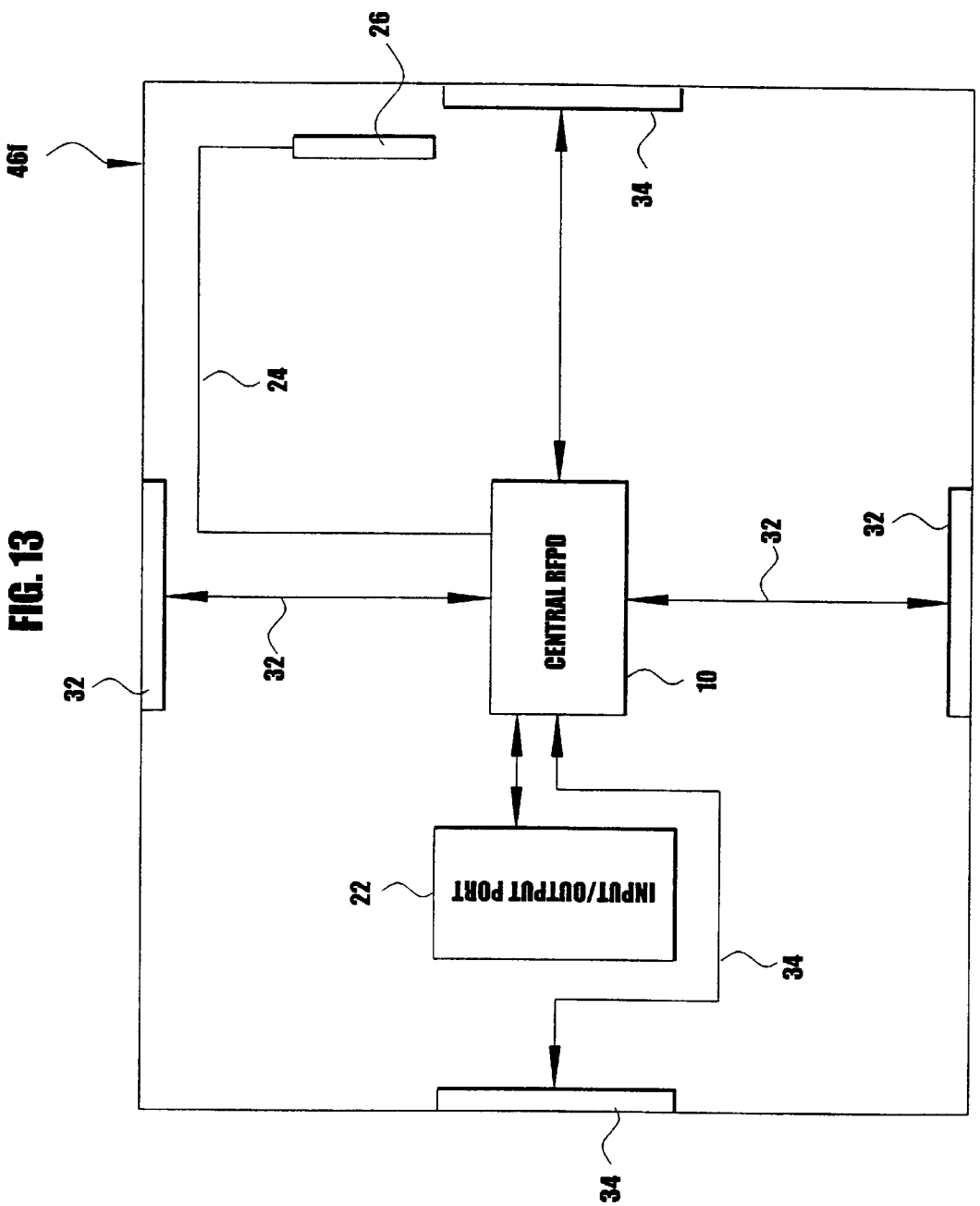
FIG. 13 is a schematic diagram showing another example of the input/output port mounted module in relation to FIG. 12.
Figure 14:
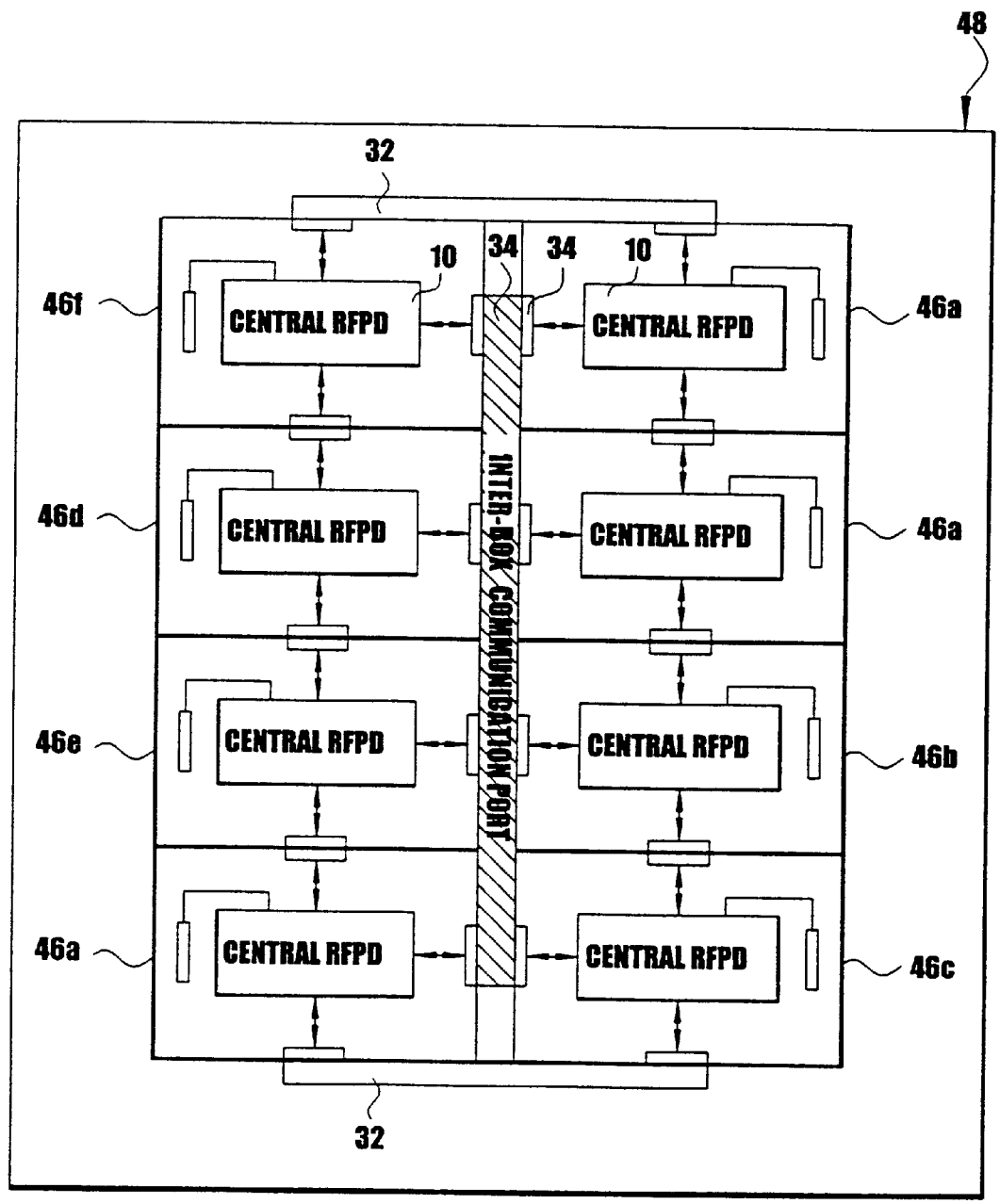
FIG. 14 is a schematic diagram showing one example of a prototyping engine box of the present invention.
Figure 15:
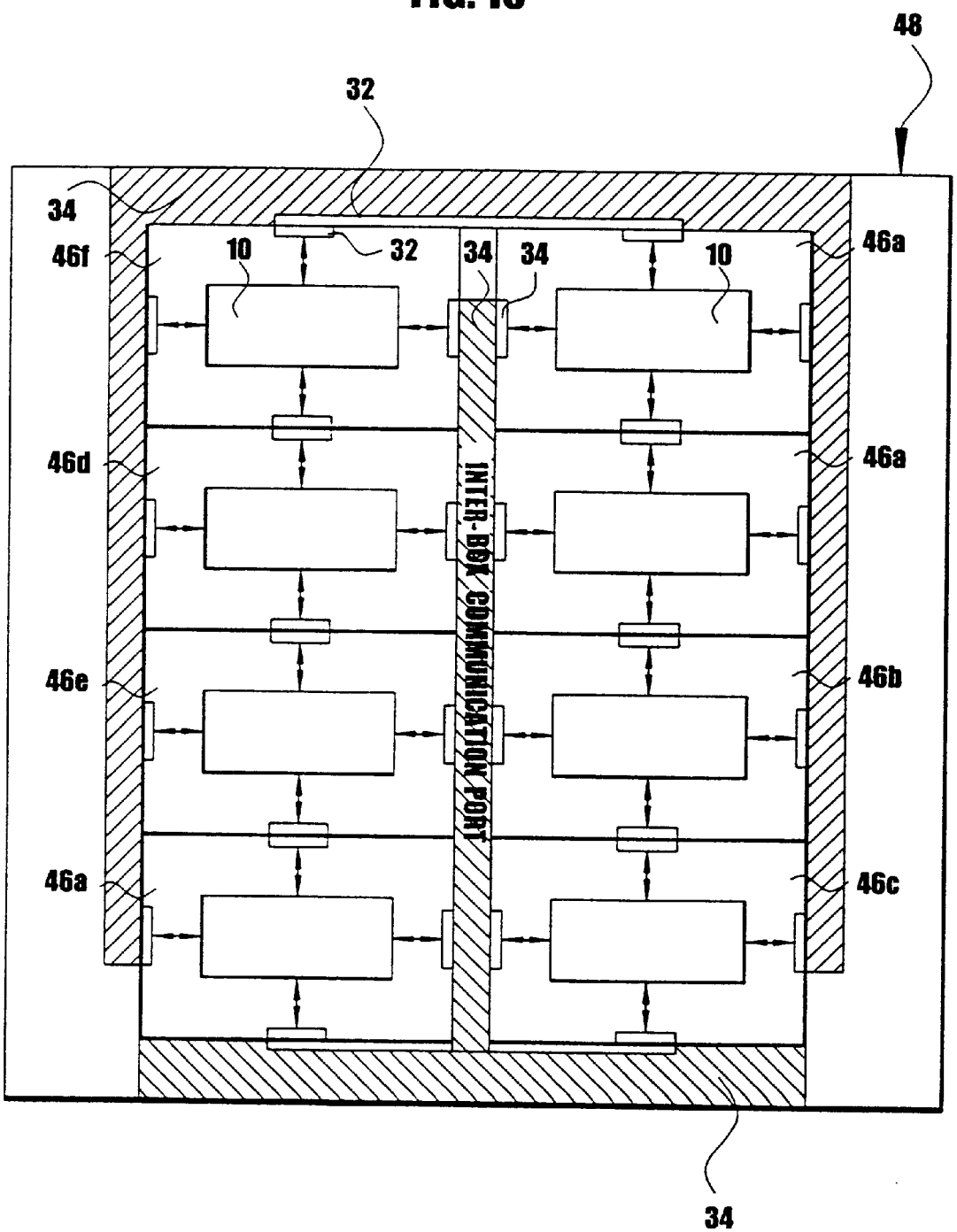
FIG. 15 is a schematic diagram showing another example of the prototyping engine box in relation to FIG. 14.
Figure 16:
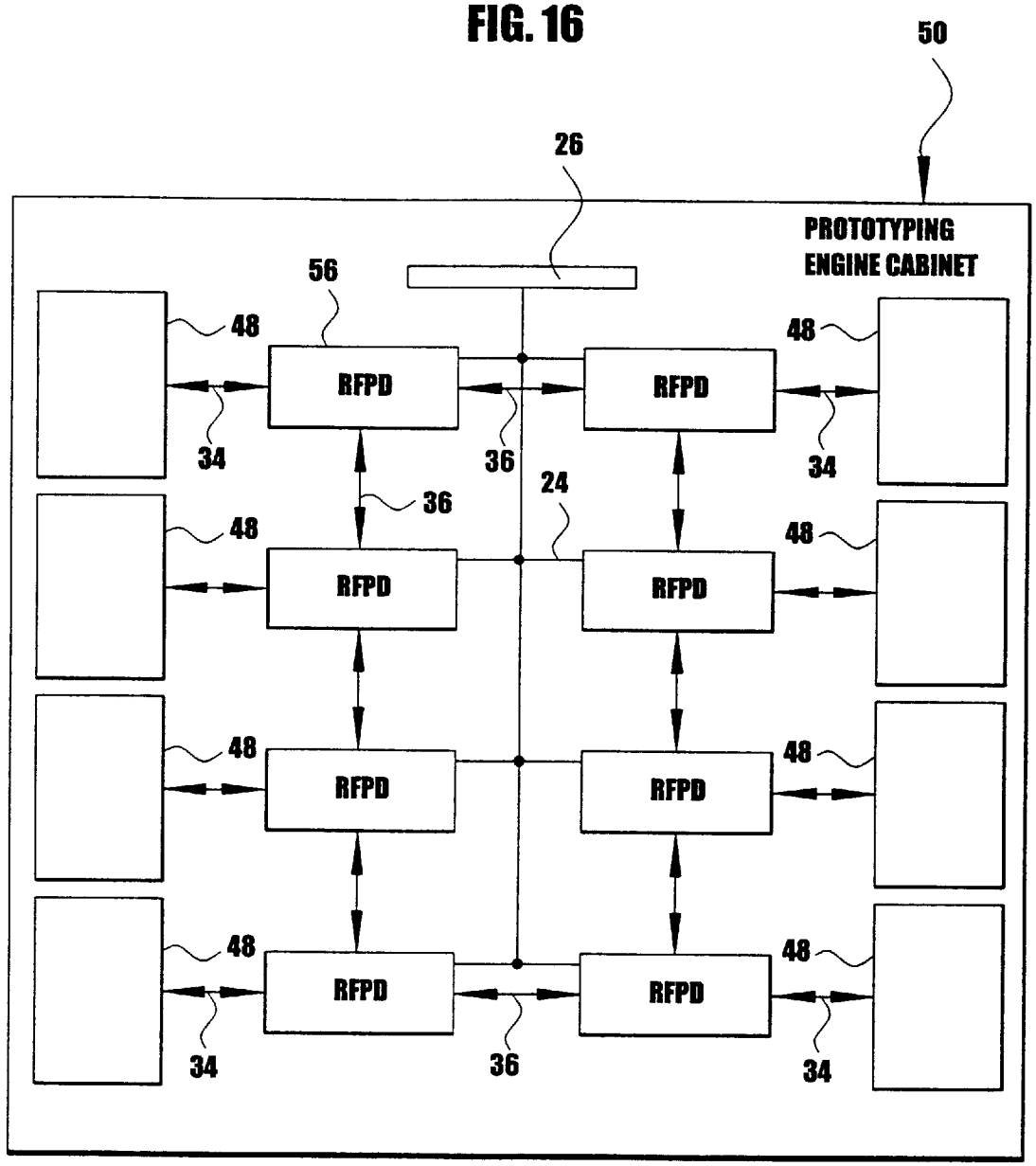
FIG. 16 is a schematic diagram showing one example of the prototyping engine cabinet of the present invention.
Figure 17:
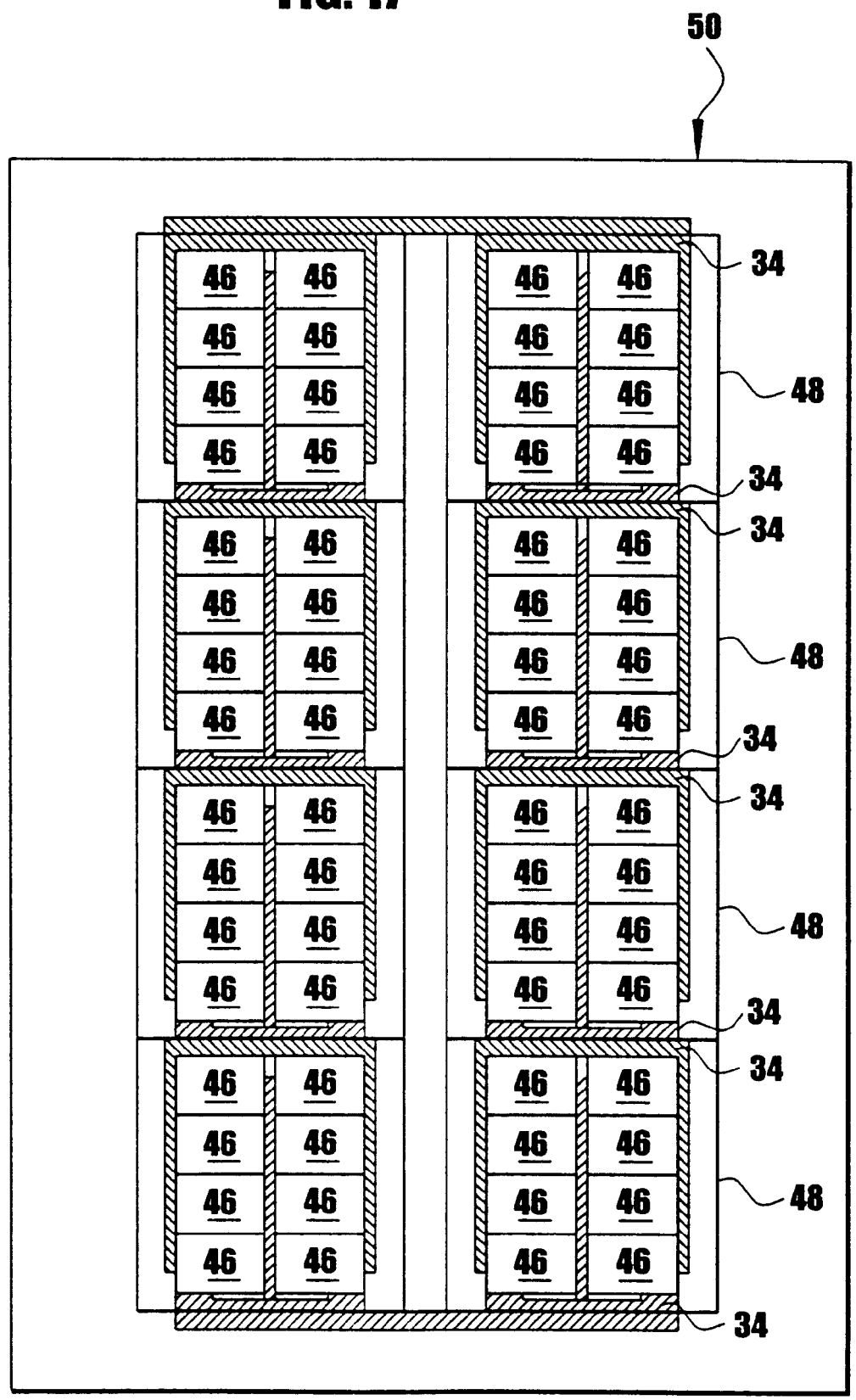
FIG. 17 is a schematic diagram showing another example of the prototyping engine cabinet in relation to FIG. 16.

The prototyping engine can also be composed of the prototyping engine modules with various forms and different functions as shown in FIG. 2 or FIG. 13. It can be formed by a prototyping engine box as shown in FIG. 14 and FIG. 15, and by a prototyping engine cabinet as shown in FIG. 16 and FIG. 17.

FIG. 2 is a schematic diagram of configurable logic module 42a of the prototyping engine modules used in the present invention. As shown in FIG. 2, configurable logic module 46a has at least two RFPDs 10 capable of implementing various types of digital hardware by programming the device, and at least one output probe line and input probe line 24 connected to the input/output terminals of the RFPDs, and at least one inter-RFPD communication port pair 28 and 30 connected to input/output terminals of at least one RFPD, at least one inter-module communication port 32 connected to the input/output terminals of RFPDs, and at least one inter-box communication port 34 connected to input/output terminals of at least on RFPD. There are two types of RFPDs; a central RFPD and a peripheral RFPD. The peripheral RFPDs are connected as a circular ring structure by R-type inter-RFPD communication port 28. The peripheral RFPDs and the central RFPD are connected by S-type inter-RFPD communication port 30. The probe lines from each RFPD are connected to system interface port 26. The number of central RFPD is not limited to one RFPD even though the Figure only shows one RFPD.

Figure 3:
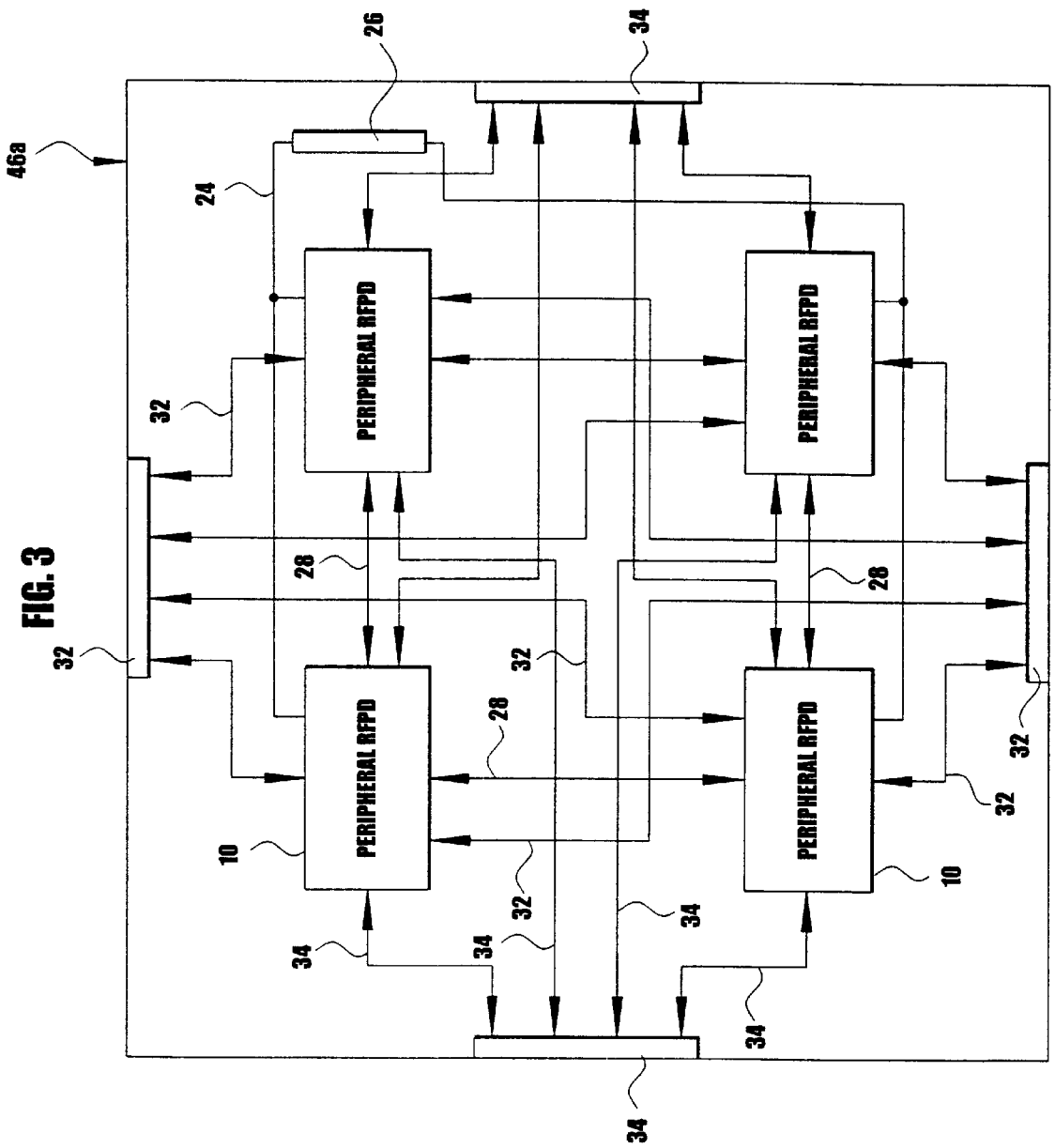
FIG. 3 is a schematic diagram showing another example of the reconfigurable logic module in a relation to FIG. 2.

FIG. 3 is a schematic diagram of another configurable logic module. Only peripheral RFPDs exist in the configurable logic module 46a in FIG. 3. All RFPDs are connected as circular ring to each other by R-type inter-RFPD communication port 20, and to one pair of inter-module communication ports 32 and to one pair of inter-box communication ports 34.

Figure 4:
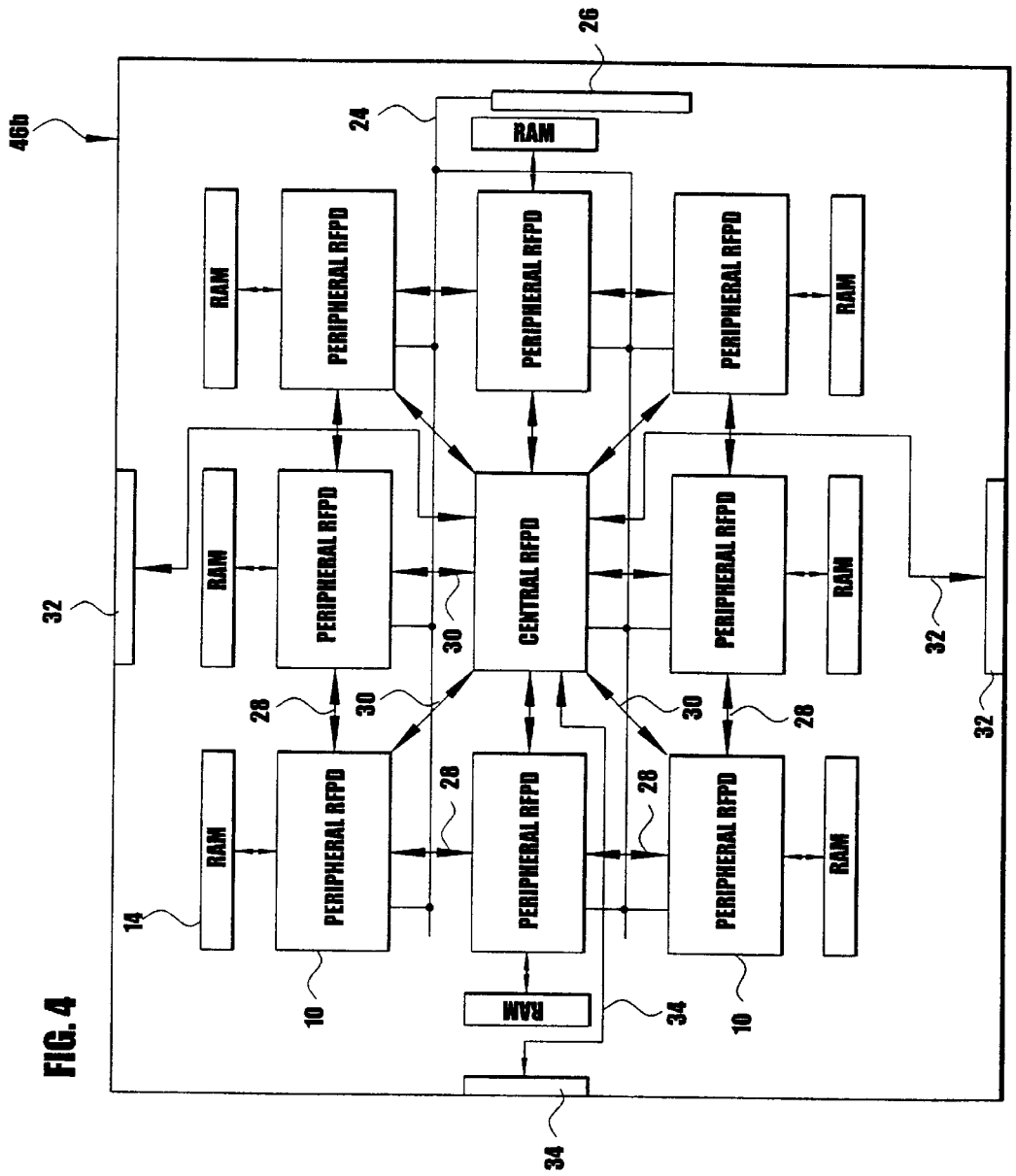
FIG. 4 is a schematic diagram showing one example of the memory device mounted module with memory devices.
Figure 5:
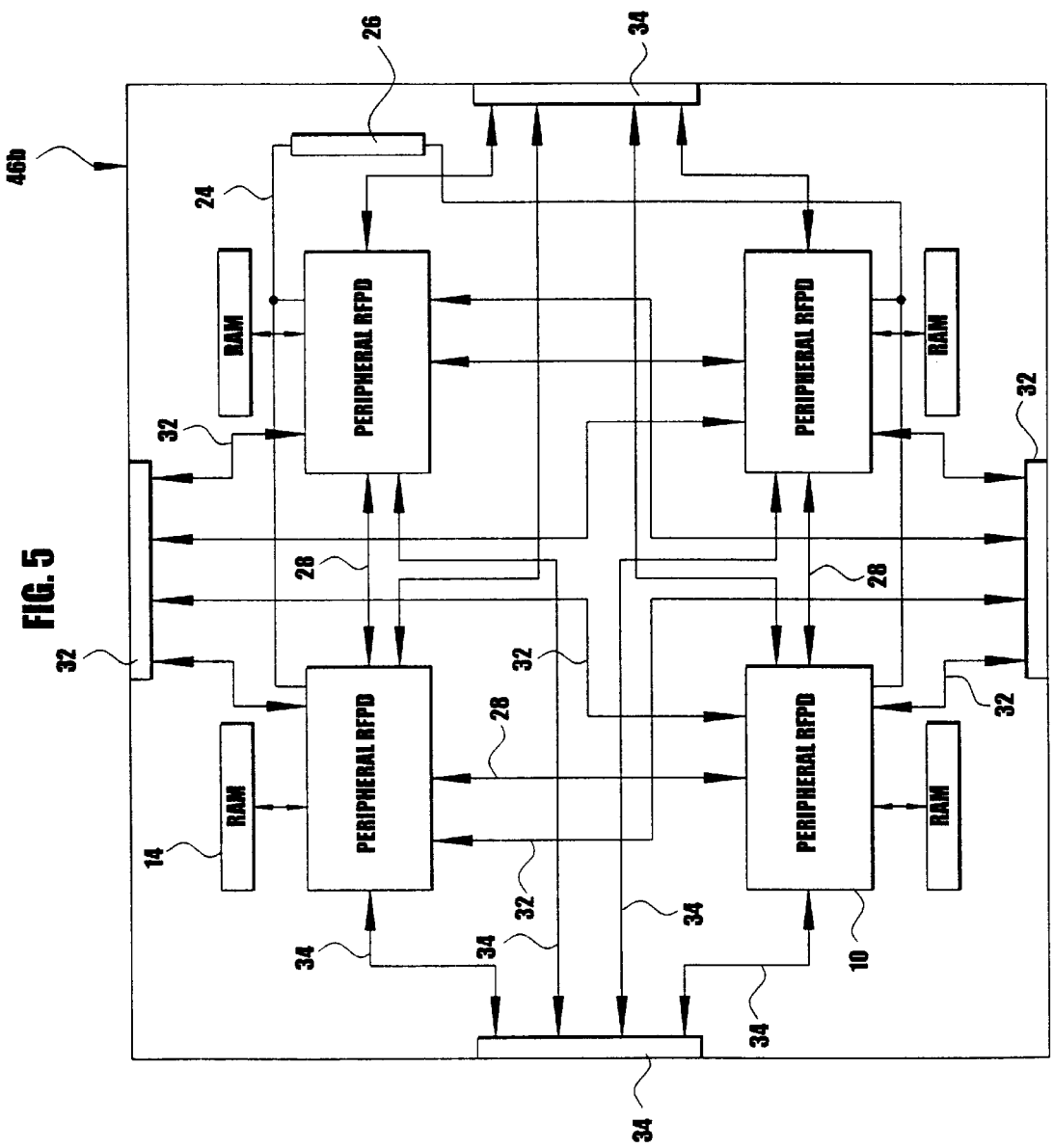
FIG. 5 is a schematic diagram showing another example of the memory device mounted module in relation to FIG. 4

FIG. 4 is a schematic diagram of memory device mounted module 46b. FIG. 5 is a schematic diagram of another memory device mounted module. As shown in FIGS. 4 and 5, the difference of memory device mounted module 46b and configurable logic module is that peripheral RFPDs are connected to memory devices 14 such as RAM or ROM.

Figure 6:
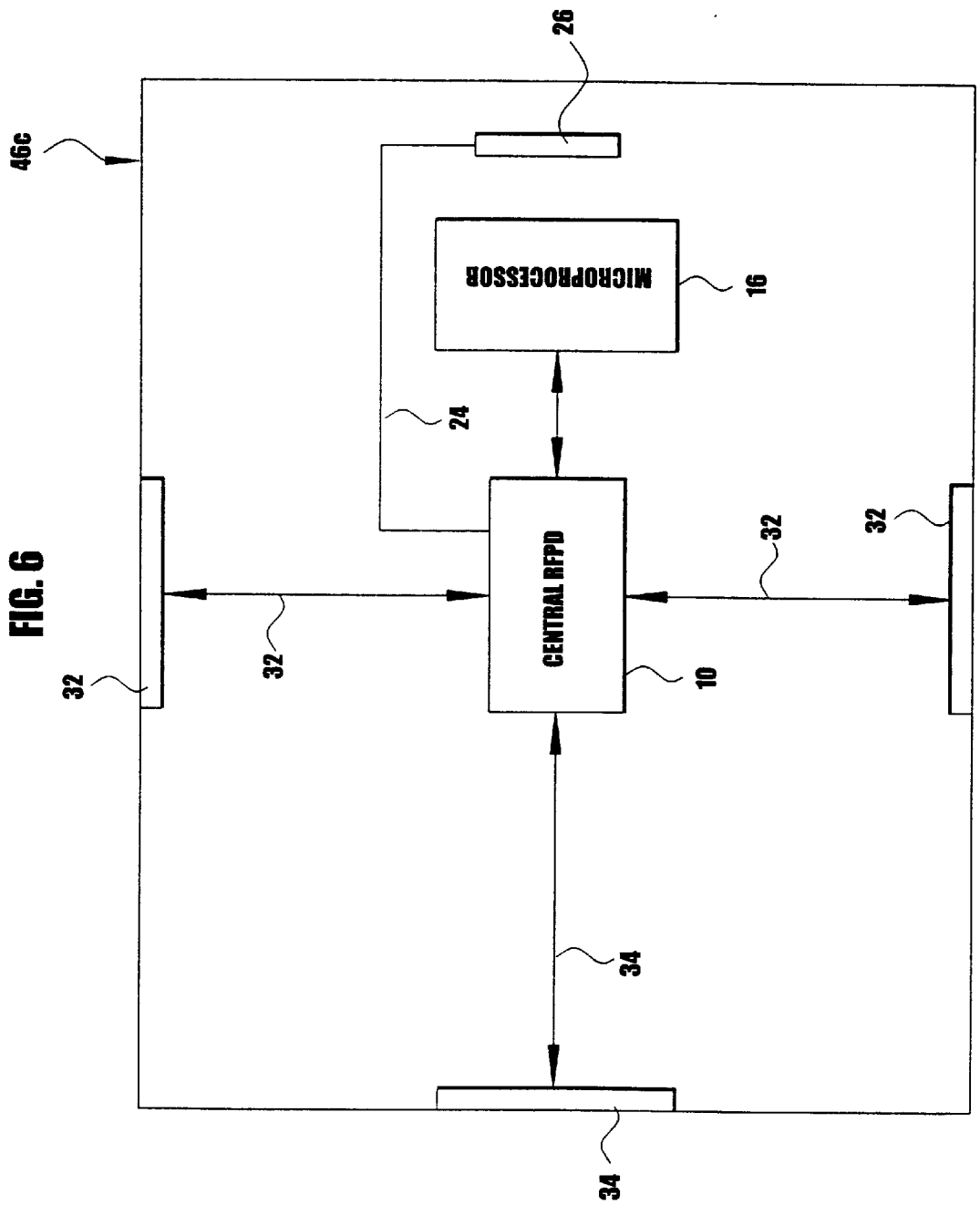
FIG. 6 is a schematic diagram showing one example of the microprocessor mounted module with microprocessors.
Figure 7:
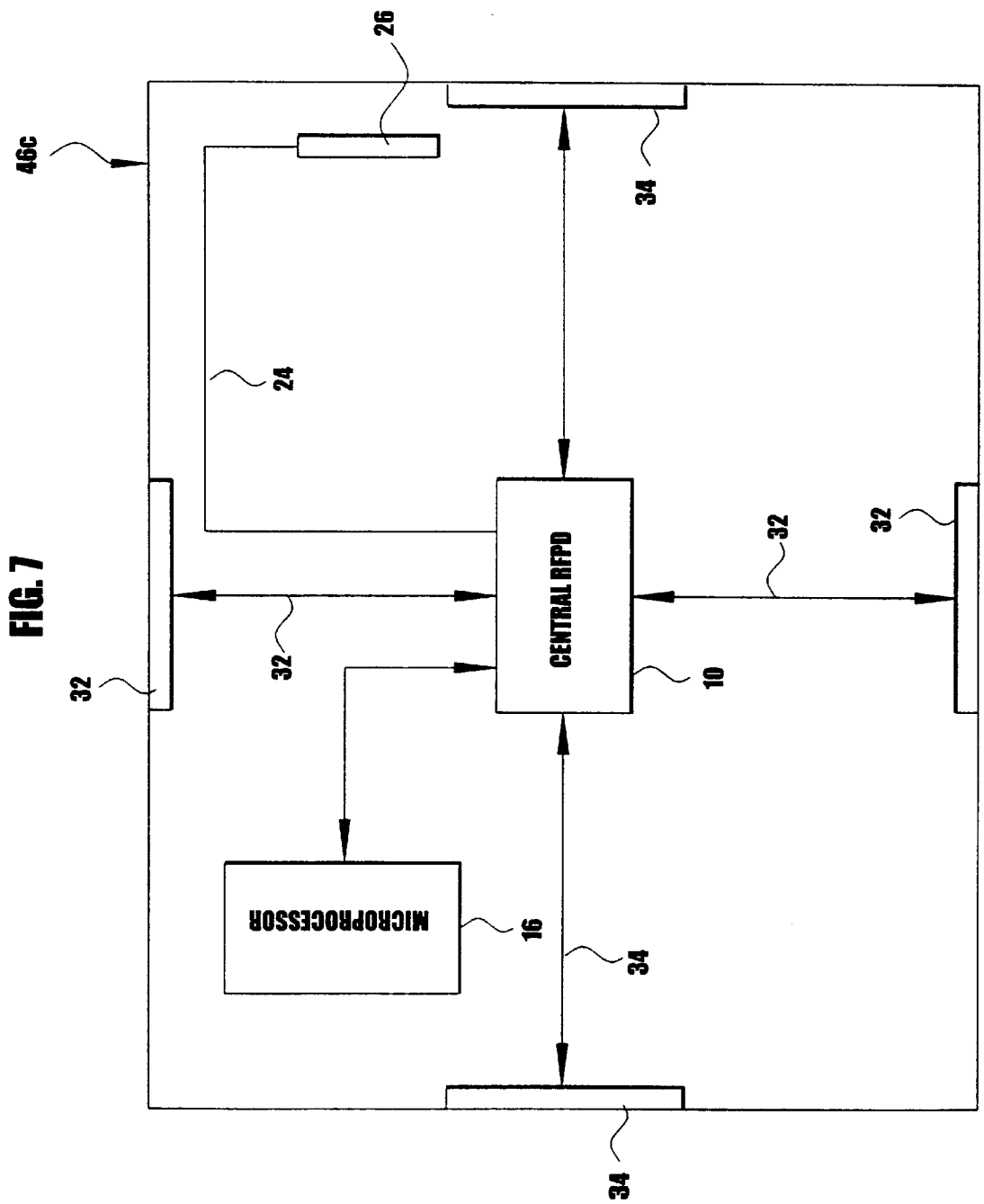
FIG. 7 is a schematic diagram showing another example of the microprocessor mounted module in relation to FIG. 6.

FIG. 6 is a schematic diagram of a microprocessor mounted module 46c having a microprocessor used in the present invention. FIG. 7 is a schematic diagram of another a microprocessor mounted module. As shown in FIGS. 6 and 7, microprocessor mounted module 46c has at least one RFPD 10 and microprocessor (or microcontroller) 16, and the RFPD is connected to inter-module communication port 32, to inter-box communication port 34, and to a microprocessor 16.

Figure 8:
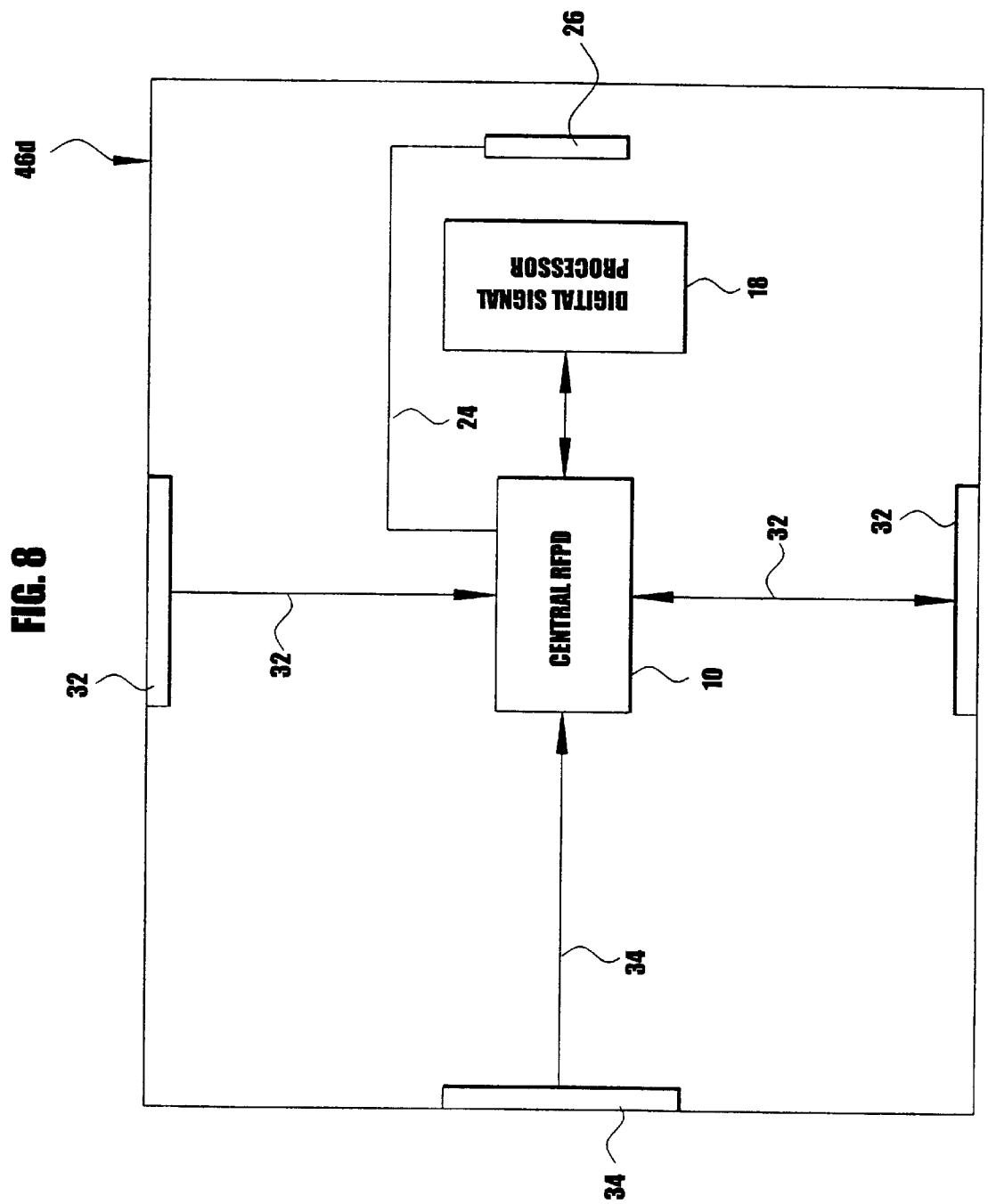
FIG. 8 is a schematic diagram showing one example of the digital signal processor mounted module with a digital signal processor.
Figure 9:
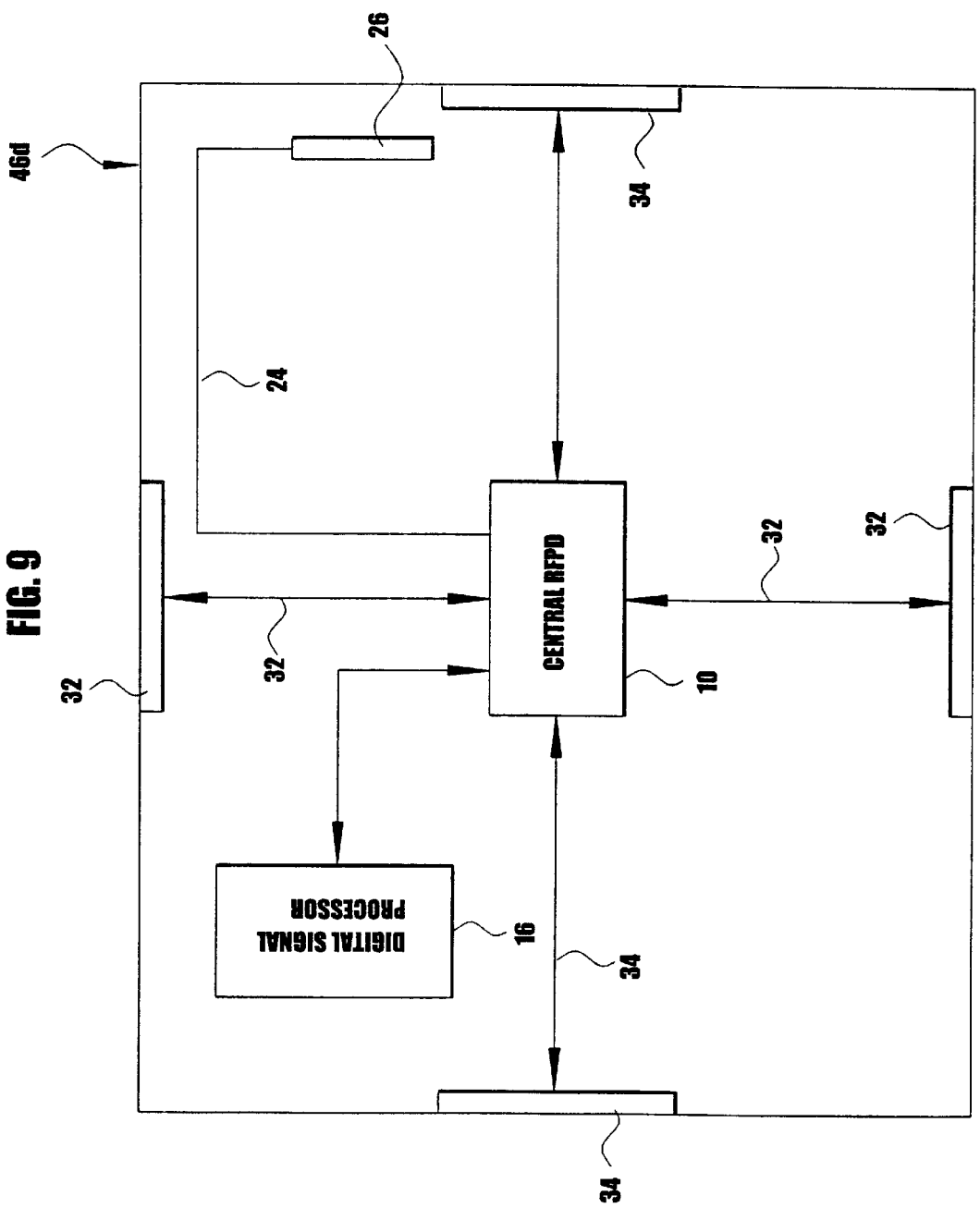
FIG. 9 is a schematic diagram showing another example of the digital signal processor mounted module in relation to FIG. 8.

FIG. 8 is a schematic diagram of a digital signal processor mounted module 46d having a digital signal processor used in the present invention. FIG. 9 is a schematic diagram of another a digital signal processor mounted module. As shown in FIGS. 8 and 9, digital signal processor mounted module 46d has at least one RFPD 10 and digital signal processors 18, and the RFPDs are connected to inter-module communication port 32, to inter-box communication port 34, and to digital signal processor.

Figure 10:
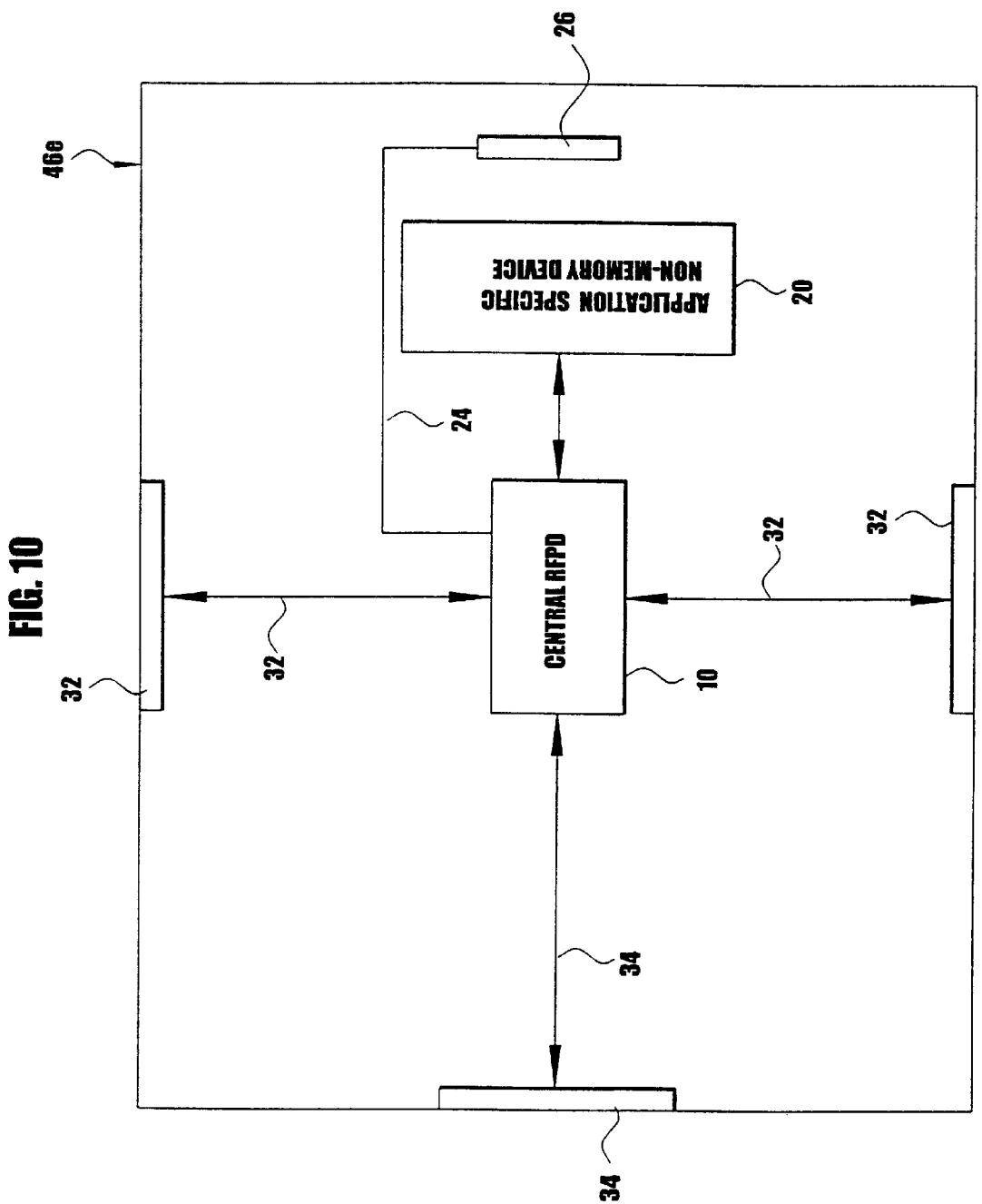
FIG. 10 is a schematic diagram showing one example of the application specific non-memory device mounted module with an application specific non-memory device.
Figure 11:
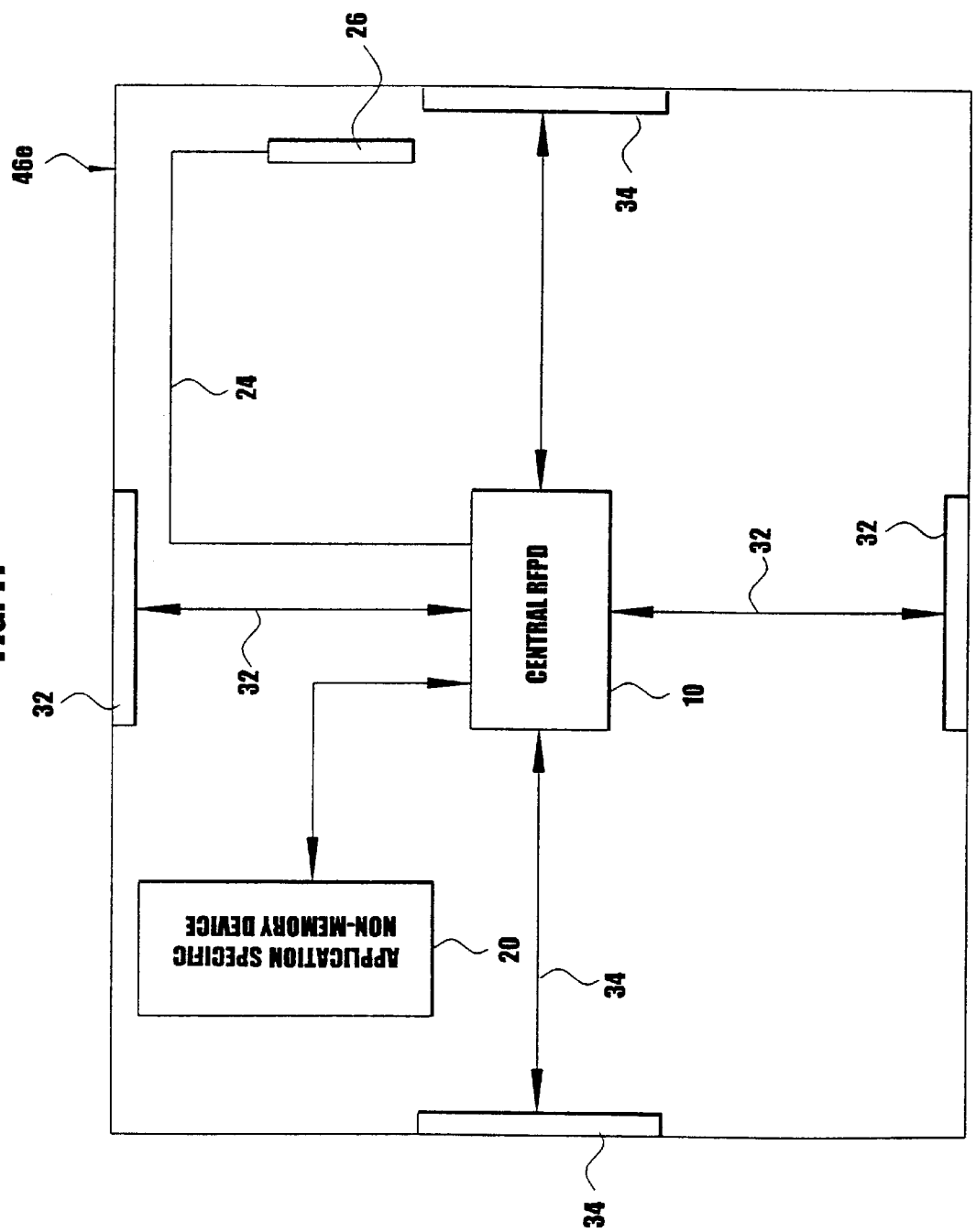
FIG. 11 is a schematic diagram showing another example of the application specific non-memory device mounted module in relation to FIG. 10.

FIG. 10 is a schematic diagram of an application specific non-memory device mounted module 46e having an application specific non-memory device used in the present invention. FIG. 11 is a schematic diagram of another application specific non-memory device mounted module. As shown in FIGS. 10 and 11, application specific non-memory device mounted module 46e has at least one RFPD 10 and application specific non-memory device 20, and the RFPDs are connected to inter-module communication port 32, to inter-box communication port 34, and to application specific non-memory device.

Figure 12:
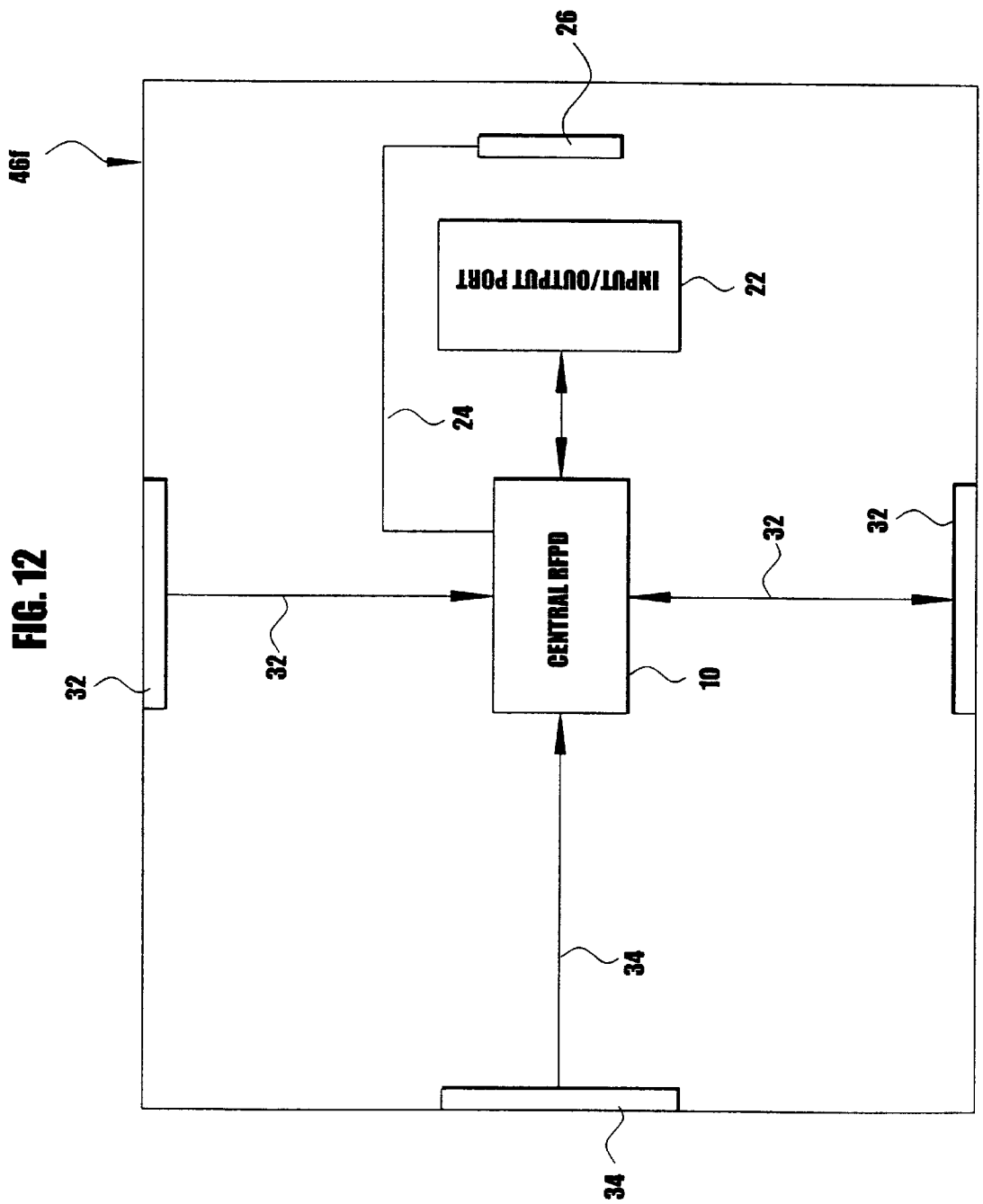
FIG. 12 is a schematic diagram showing one example of the input/output port mounted module with an input/output port.

FIG. 12 is a schematic diagram of an input/output port mounted module 46f having an input/output port used in the present invention. FIG. 11 is a schematic diagram of another input/output port mounted module. As shown in FIGS. 12 and 13, input/output port mounted module 46f has at least one RFPD 10 and input/output port 22, and the RFPD is connected to inter-module communication port 32, to inter-box communication port 34, and to input/output port.

In the memory device mounted module 46b, the microprocessor mounted module 46c, the digital signal processor mounted module 46d, application specific non-memory device mounted module 46e, and input/output port mounted module 46f the number of RFPDs are not limited to one even though there is only one RFPD in the Figures.

FIG. 14 is a schematic diagram of a prototyping engine box 48 in accordance with the present invention. Referring to FIGS. 2 to 14, at least one RFPD of each prototyping engine module (46a–46f) and the inter-module communication port 32 of each module is connected and the inter-module communication port 32 of each module is connected to the inter-module communication port of other modules. Therefore all modules in the engine box are connected in circular ring structure. At least one RFPD 10 in each prototyping engine module (46a–46f) and the inter-box communication port 34 are connected, and the inter-box communication port of each box is interconnected so that the circular ring structure among boxes becomes possible as shown FIGS. 14 and 15.

FIG. 15 is a schematic diagram of another prototyping engine box 48. The engine box in FIG. 15 uses varied prototyping engine module from FIGS. 3, 5, 7, 9, and 11. The only difference of the prototyping engine box in FIGS. 15 and 14 is that the prototyping engine box in FIG. 15 has box communication ports 34 in pair.

FIG. 16 is schematic diagram of prototyping engine cabinet 50. As shown in FIG. 16 the prototyping engine cabinet 50 in accordance with the present invention is formed by at least two prototyping engine box 48, at least one box connecting RFPD, at least one output probe line and input probe line connected to at least one box connecting RFPD 56, and at least one box connecting inter-RFPD communication port 36 connected to at least one box connecting RFPD 56. FIG. 16 is composed of 8 engine boxes and box connecting RFPDs in respect to the engine boxes. Modules of specified engine box 48 are connected to box connecting RFPDs 56 through inter-box communication port 34, an each of box connecting RFPDs are connected in circular ring structure through box connecting inter-RFPD communication port 36. The number RFPDs is not limited to one even through there is one box connecting RFPD 56 connected to specified boxes through inter-box communication ports.

FIG. 17 is a schematic diagram of another prototyping engine cabinet 50. The difference of the engine cabinet in FIGS. 17 and 16 is that the engine box in FIG. 17 is connected directly without going through box connecting RFPDs. There is inter-box communication port 34 for connecting boxes in the cabinet, and the boxes are connected in circular ring structure.

Referring back to FIG. 1, the server computer 40 partitions and allocates the designed circuit to be verified into partial circuits, and produces additional circuit for R-communication, additional circuit for P-probe, and extended partial circuit of the designed circuit to be verified, and programming pattern for RFPDs which perform the duty of implementing the designed circuit to be verified, additional circuit for connecting logic signal lines among the prototyping engine boxes, the prototyping engine modules or the component devices in an engine module, and additional circuit for probe by prototyping system software installed in the server computer in form of a program. The interface module 42 interfaces the server computer 40 and the prototyping engine, for example, the prototyping engine module (46a–46f), the prototyping engine box (48), or the prototyping engine cabinet (50).

Figure 18:
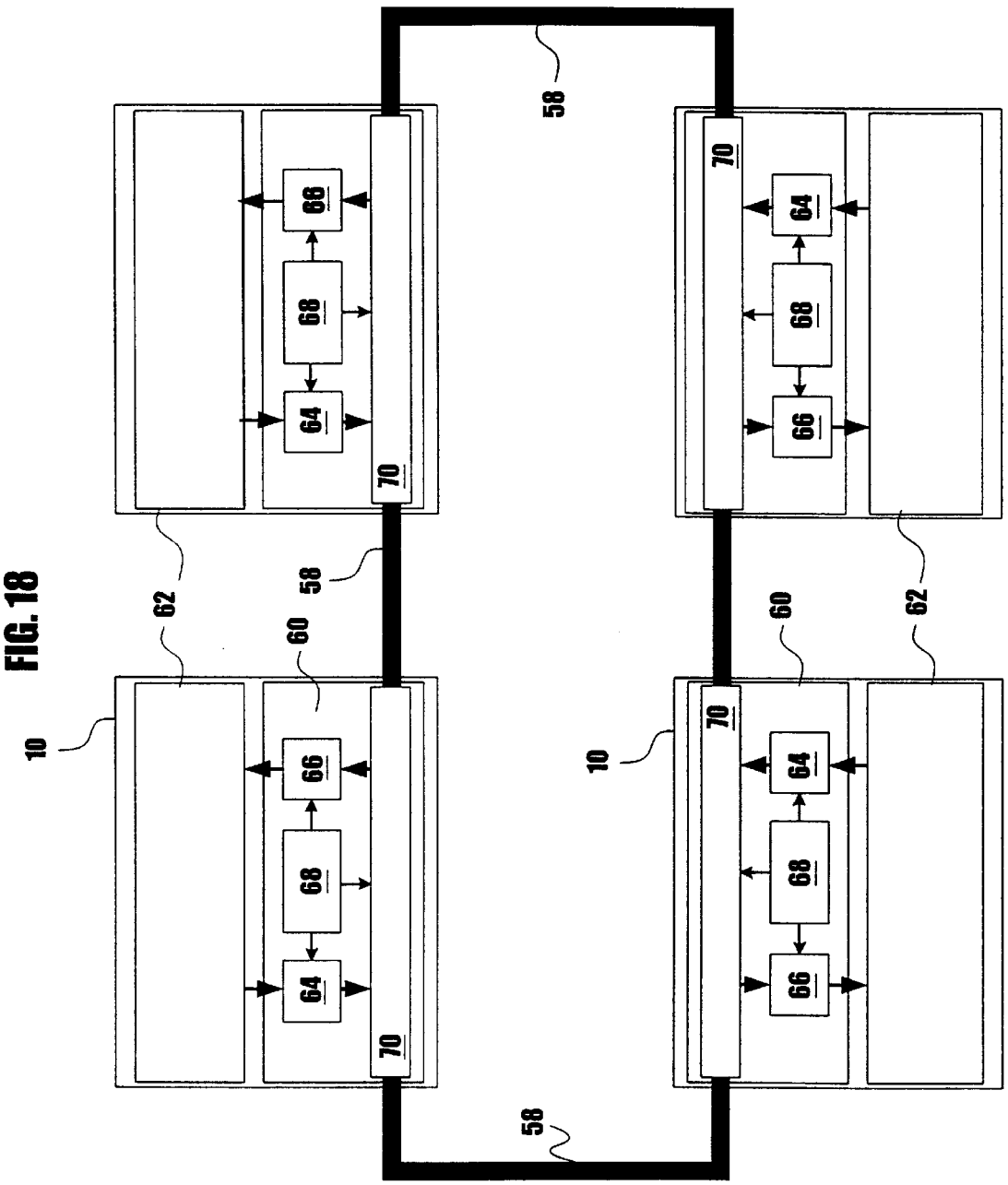
FIG. 18 is a schematic diagram showing and additional circuit for R-communication implemented together with a partial circuit of the designed circuit to be verified inside the RFPD of the prototyping engine module of the present invention.
Figure 19:
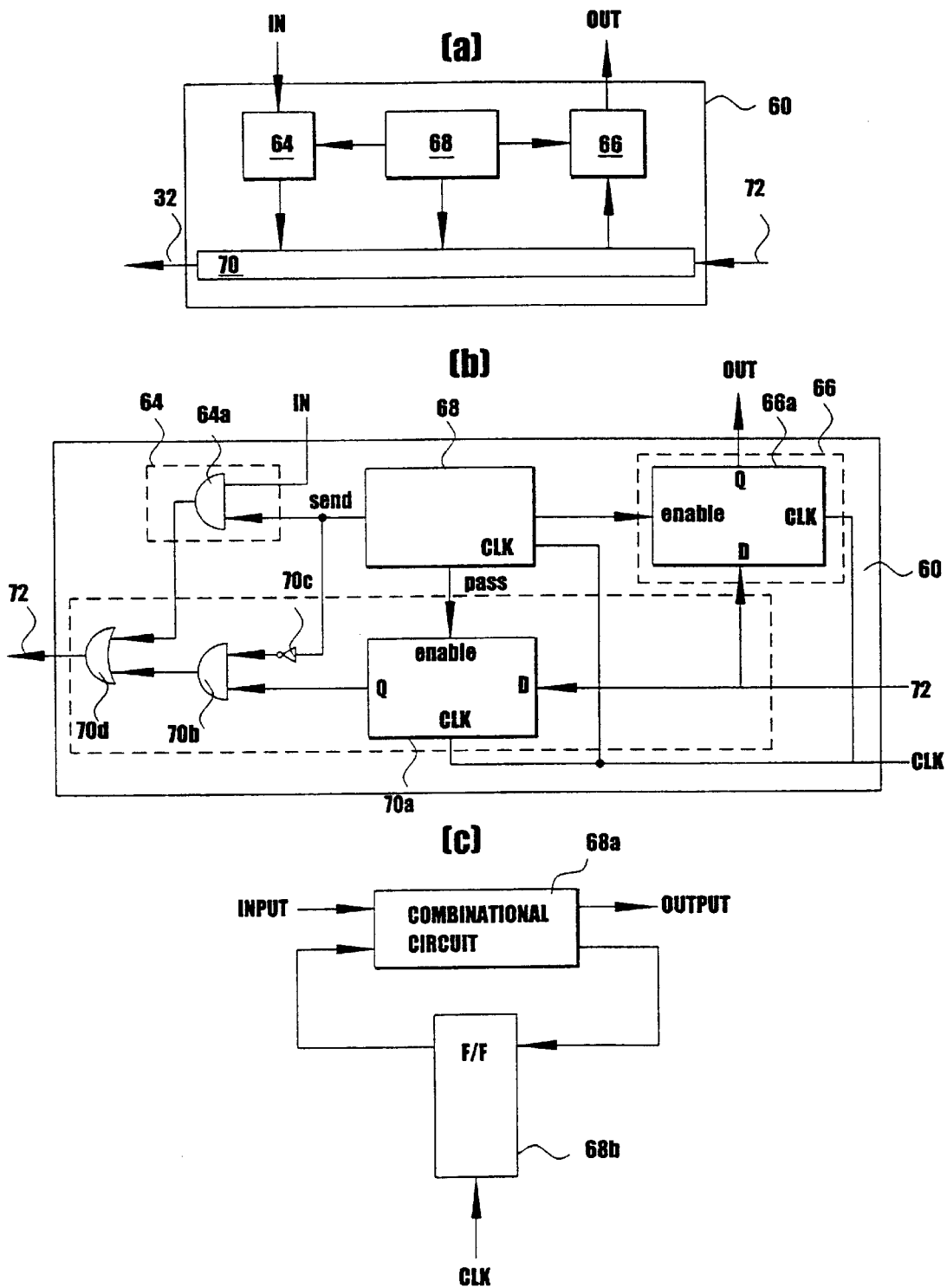
FIG. 19 is a block diagram showing one example of the additional circuit for R-communication implemented together with the partial circuit of the designed circuit to be verified of FIG. 18, where (a) is a block schematic diagram, (b) is a detailed view, and (c) is a block diagram showing one example of a finite state machine.

FIG. 18 is a schematic diagram of additional circuit for R-communication 60 with the partial circuit of the designed circuit to be verified of RFPDs in the prototyping engine 62 module in accordance with the present invention. As shown in FIG. 18, the prototyping system in accordance with the present invention implements additional circuit for R-communication 60 together with the partial circuit of the designed circuit to be verified in RFPDs which are used in the prototyping engine. The additional circuit for R-communication 60 is composed of signal transmitter 64, signal receiver 66, finite state machine 68, and RFPD internal communication channel 70. The additionl circuit for R-communication 60 is produced by the prototyping system software in server computer 40 from the information from partition and allocation after the designed circuit to be verified is partitioned and allocated to each RFPD. The detailed example of the additional circuit for R-communication is given in FIG. 19.

FIG. 19(a) is a schematic block diagram and FIG. 19(b) is a detailed diagram of FIG. 18. As shown in FIG. 19(a), RFPD internal communication channel 70 for R-communication includes D flip-flops 70a. Each of them has an "enable input end connected to RFPD external communication channel 72 through the data input end (D), AND gate 70b which is a part of data input of a multiplexer (70b–70d, 64a) connected to the date output (Q) of the flip-flop 70a, and OR gate 70d which is data output connected to data input of the multiplexer. The signal transmitter 64 is composed of AND gate 64a which is another data input of the multiplexer. A "send" control signal from finite state machine 68 is input to other inputs of the two AND gates 70b and 64a which are the data input portions of the multiplexer, and is applied to the AND gate 64a of the signal transmitter 64 and to AND gate 70b of internal communication channel 70 through inverter 70c. The signal receiver 66 is composed of D flip-flop 66a having an "enable" input which connects the data input D to RFPD external communication channel 72. To control the operation and operation timing point of the flip-flops 70a, 66aby "pass", "receive" and "send" output signals from finite state machine 68, output signals from the finite state machine are connected to the enable inputs of flip-flops and to the selection input of the multiplexer. Therefore, when the output of the finite state machine is in send mode, logic value of the partial circuit 62 of the designed circuit to be verified is output to external channel 72 through signal transmitter 64 which forms a part of input 64a of the multiplexer. When the output of the finite state machine is in receive mode, logic value from the external circuit 72 is input to the partial circuit 62 through flip-flop 66a which forms signal receiver. When the output of the finite state machine is in pass mode, the logic value is passed from external channel 72 of the previous stage to the external channel 72 of next stage through flip-flop 70a and an input of multiplexer 70b in RFPD internal communication channel 70. The basic function of additional circuit for R-communication is to connect logic signal lines of the partial circuits of the designed circuit to be verified which are partitioned and allocated to RFPDs, memories, microprocessors, digital signal processors, application specific non-memory devices in pipeline method. Even though the number of flip-flops of RFPD internal communication channel 70 is one in the Figure, those skilled in the art will know that many flip-flops could be needed depending on the size of the circuit to connect signal lines in the circuit.

Figure 20:
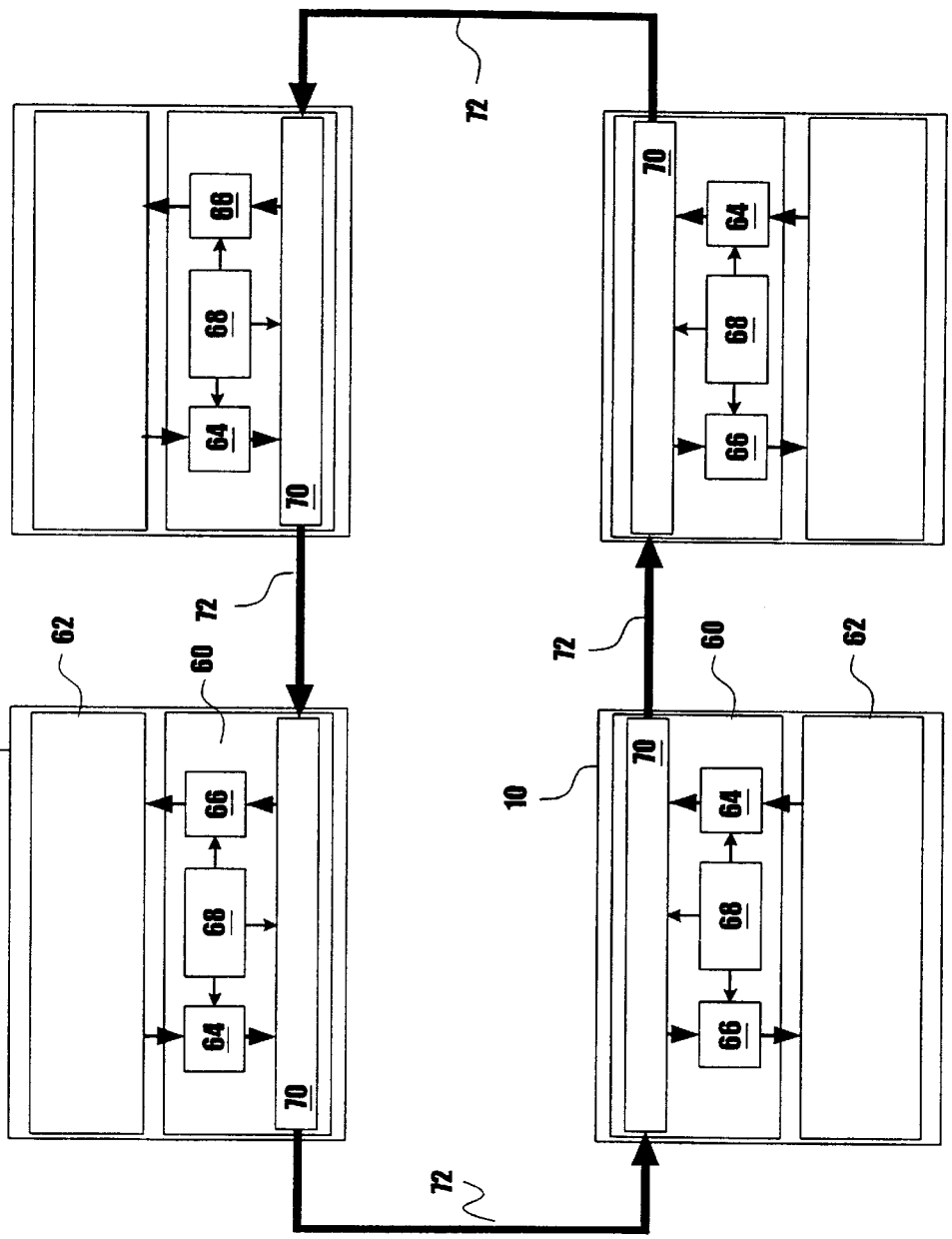
FIG. 20 is a schematic diagram showing the execution situation of a ring topology unidirectional pipeline communication by the additional circuit for R-communication inside an RFPD in the prototyping engine module of the present invention and a RFPD external communication channel.

Referring to FIGS. 18 and 20, to connect logic signal lines among component devices in the prototyping engine, the prototyping system in accordance with the present invention implements the additional circuit for R-communication 60 composed of signal transmitter 64, signal receiver 66, finite state machine 68, RFPD internal communication channel 70 together with the partial circuit of the designed circuit to be verified 62, which is partitioned and allocated, on RFPD 10 of the prototyping engine in which RFPD external communication channel 72 and RFPD internal communication channel 70, which is physically isolated from the partial circuits of the designed circuit to be verified, are shared by all RFPDs in the prototyping engine. RFPD external communication channel and RFPD internal communication channel are formed in pipelined fashion which prevents the collision of the signal values between the stages of pipeline. The transmission and receiving between at least two groups of a signal transmitter and signal receiver in at least two additional circuit for R-communication which is to connect logic signal lines are carried out in parallel with each other. In this case the communication timing which is determined by running a scheduler for R-communication in the prototyping system software between signal transmitter and signal receiver in controlled by finite state machine 68 in additional circuit for R-communication. FIG. 19(c) illustrates an example of finite state machine 68. The finite state machine (68) comprises combinational circuit (68a) and flip-flop (or latch)(68b). The output signal of the flip-flop is combined with an input signal from the outside, and produces an output signal and a feedback with the flip-flop according to each clock (CLK). FIG. 20 illustrates pipelined communication using additional circuit for R-communication. FIG. 20 illustrates ring topology unidirectional pipeline communication by additional circuit for R-communication and RFPD external communication channel 70 in the prototyping engine module.

The connection of logic signal lines among the partial circuit of the designed circuit to be verified could be among the devices on a specified prototyping engine module, among devices on different prototyping engine modules on a specified prototyping engine box, or among devices on different prototyping engine boxes depending on how the designed circuit to be verified is partitioned and allocated. Therefore the prototyping system in accordance with the present invention carries out pipelined ring topology communication among devices on a module (FIG. 21 or 23), pipelined ring topology communication among modules (FIGS. 24 and 25), and pipelined ring topology communication among boxes (FIGS. 26 and 27).

Figure 21:
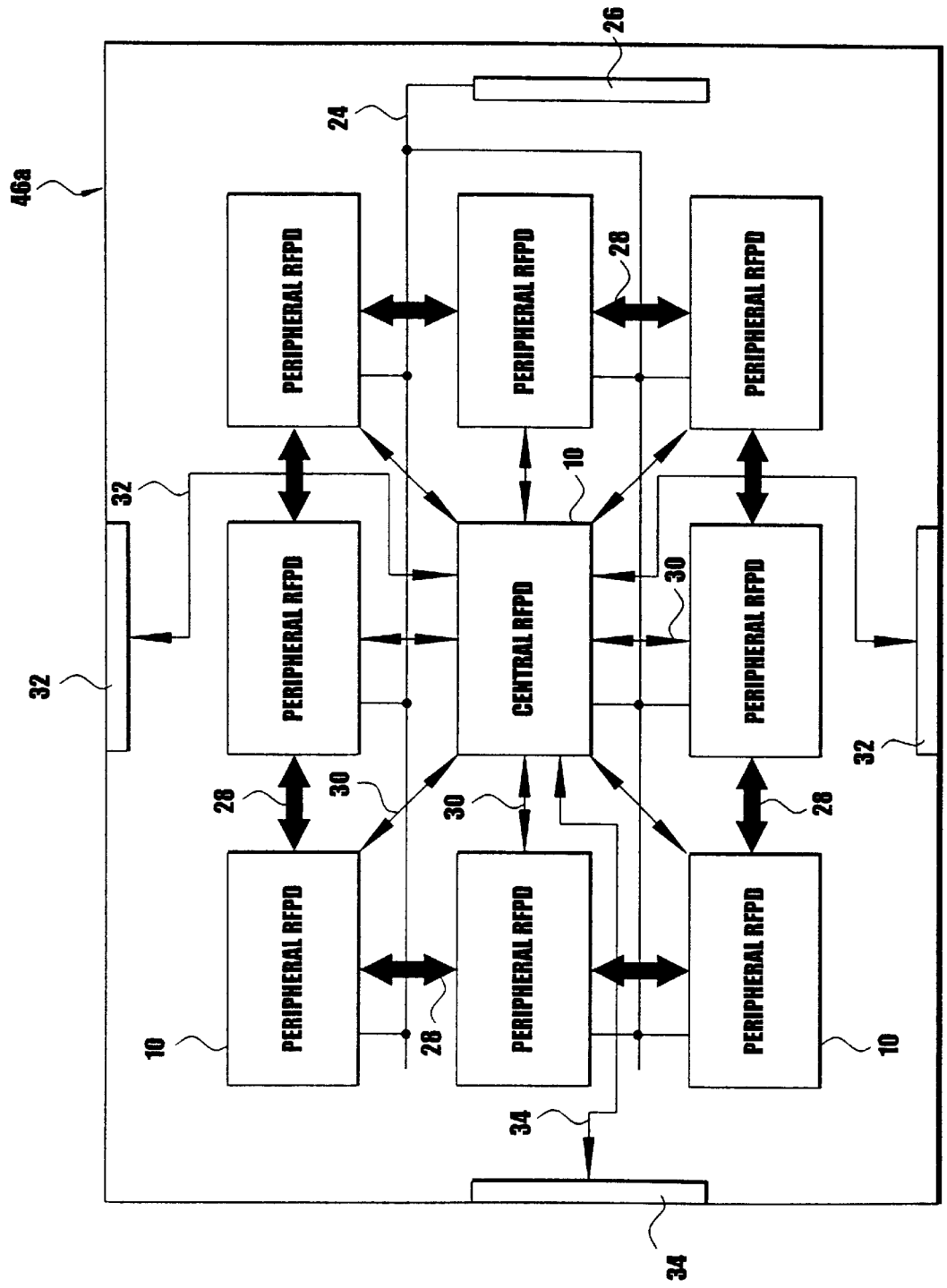
FIG. 21 is a schematic diagram showing one example of connecting at least two RFPDs within the prototyping module of the present invention in circular ring structure.
Figure 22:
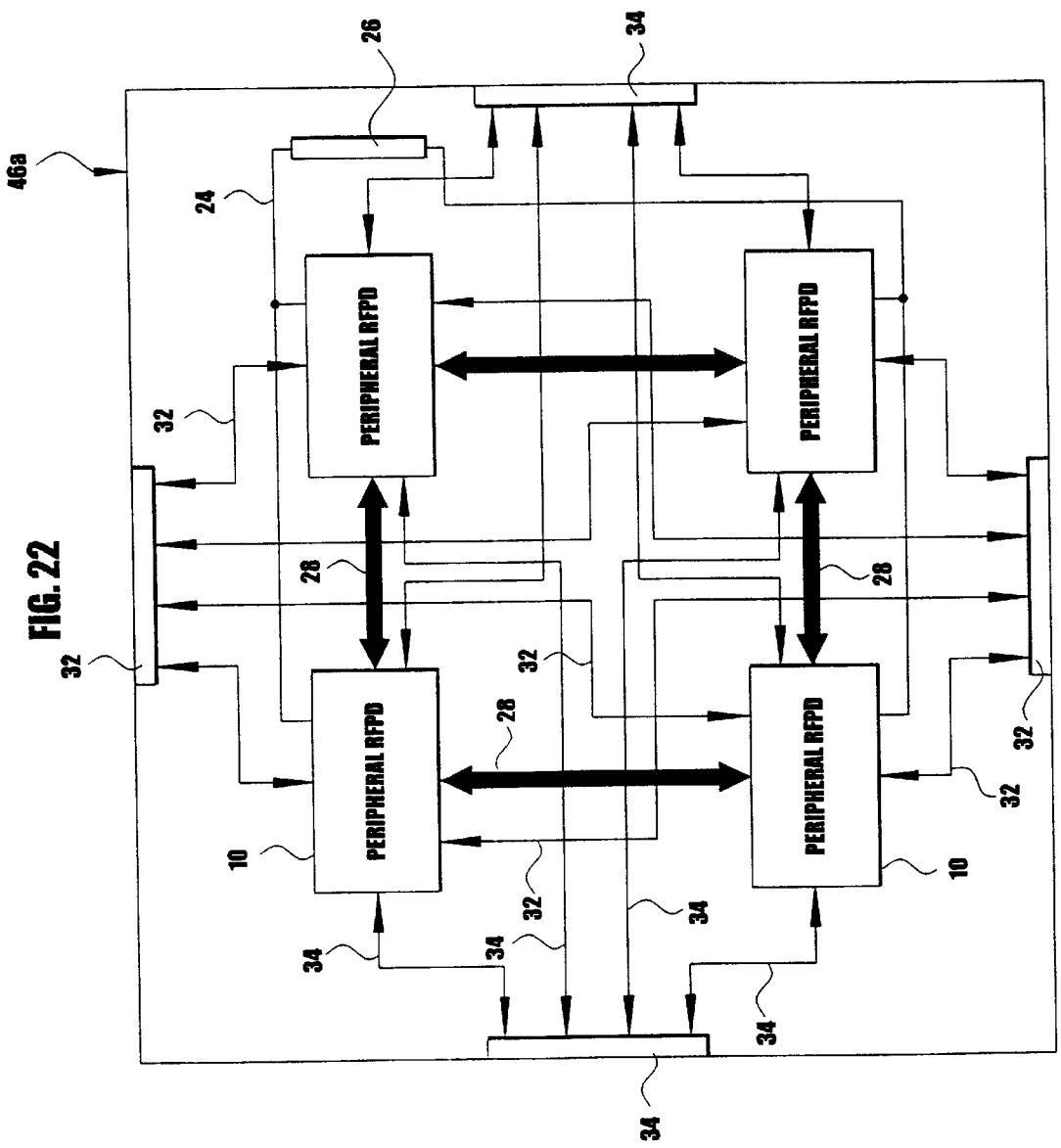
FIG. 22 is a schematic diagram showing another example of connecting at least two RFPDs within the prototyping module in circular ring structure in relation to FIG. 21.
Figure 23:
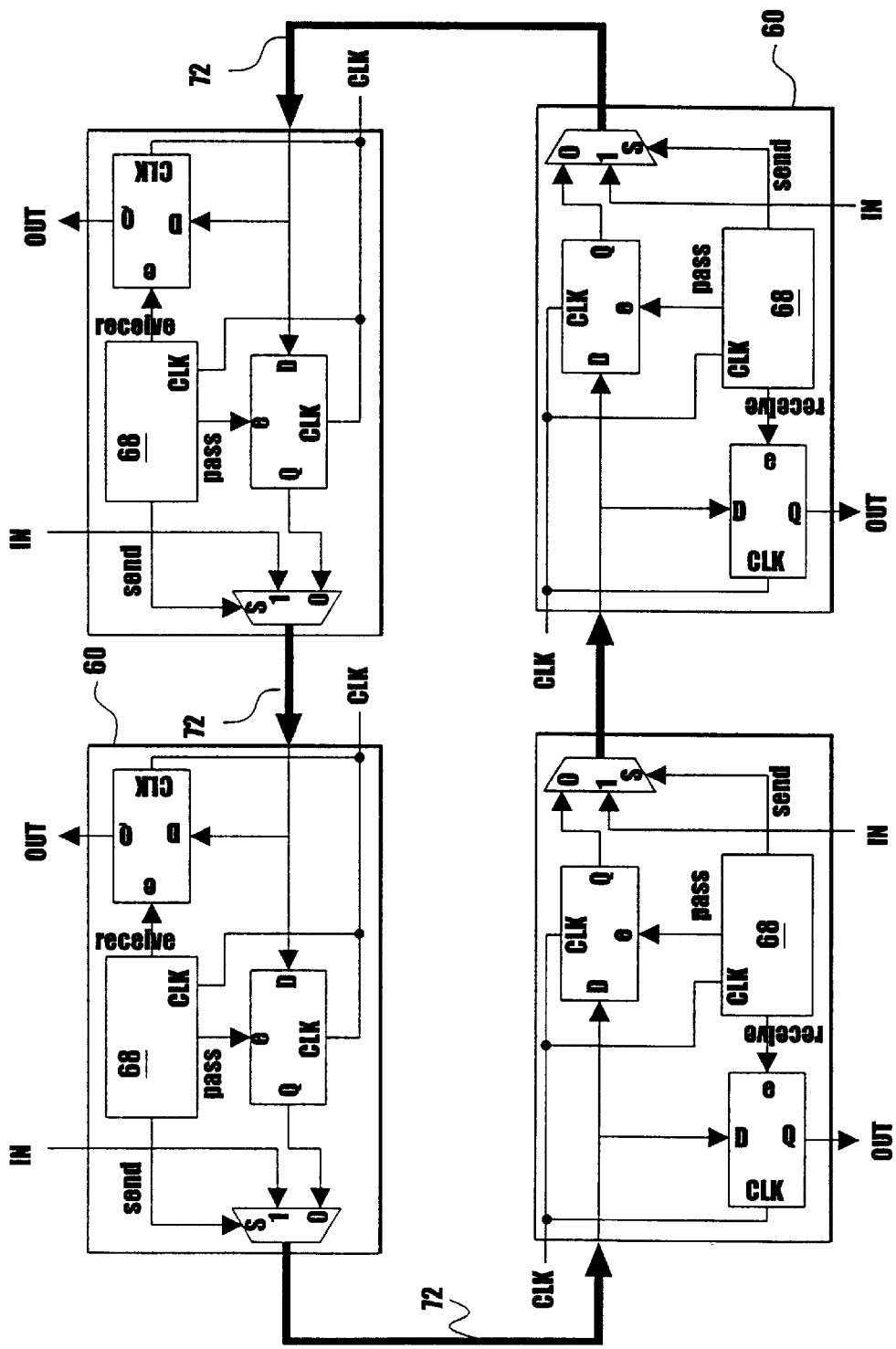
FIG. 23 is a detailed view showing a ring topology pipelined communication channel of the present invention.

FIG. 21 is a schematic diagram of an example of circular ring connection structure of at least two RFPDs in the prototyping engine module in accordance with the present invention. FIG. 22 is a schematic diagram of another example of circular ring connection structure of at least two RFPDs in the prototyping engine module in accordance with the present invention. FIG. 23 is a detailed drawing showing a schematic diagram of pipelined ring topology communication channel in accordance with the present invention. As shown in FIGS. 21 to 23, the prototyping system in accordance with the present invention connects at least two RFPDs in the prototyping engine module in circular ring connection structure (FIG. 21 or 22) for pipelined ring topology communication in the module by using at least one inter-RFPD communication port in the prototyping engine module. The prototyping system in accordance with the present invention further implements additional circuits for R-communication and partial circuits of the designed circuit to be verified on the RFPDs in the prototyping engine module to transmit signal values of different two RFPDs in the prototyping engine module, and forms pipelined ring topology communication channel (FIG. 23) in the prototyping engine module out of the inter-RFPD communication ports and the additional circuits for R-communication. Pipelined ring topology communication between the signal transmitter and the signal receivers in the additional circuits for R-communication comprised of the above-mentioned communication channel makes the delivery of logic values among the partial circuits of the designed circuit to be verified which are partitioned and allocated into one prototyping engine module possible, so that the logical connection among the partial circuits of the designed circuit to be verified is possible.

Figure 24:
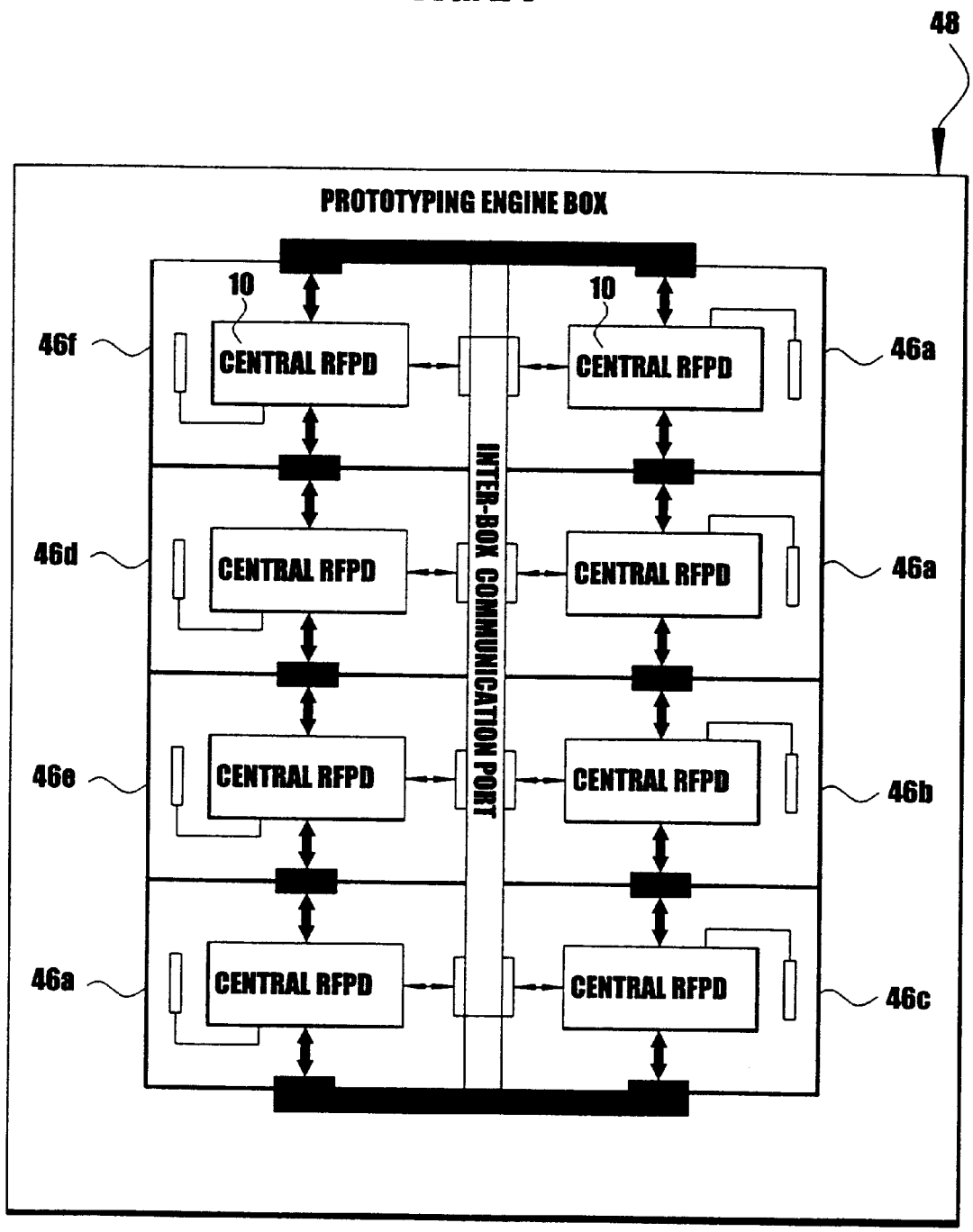
FIG. 24 is a schematic diagram showing an example of connecting at least two prototyping engine modules within the prototyping box of the present invention in circular ring structure.
Figure 25:
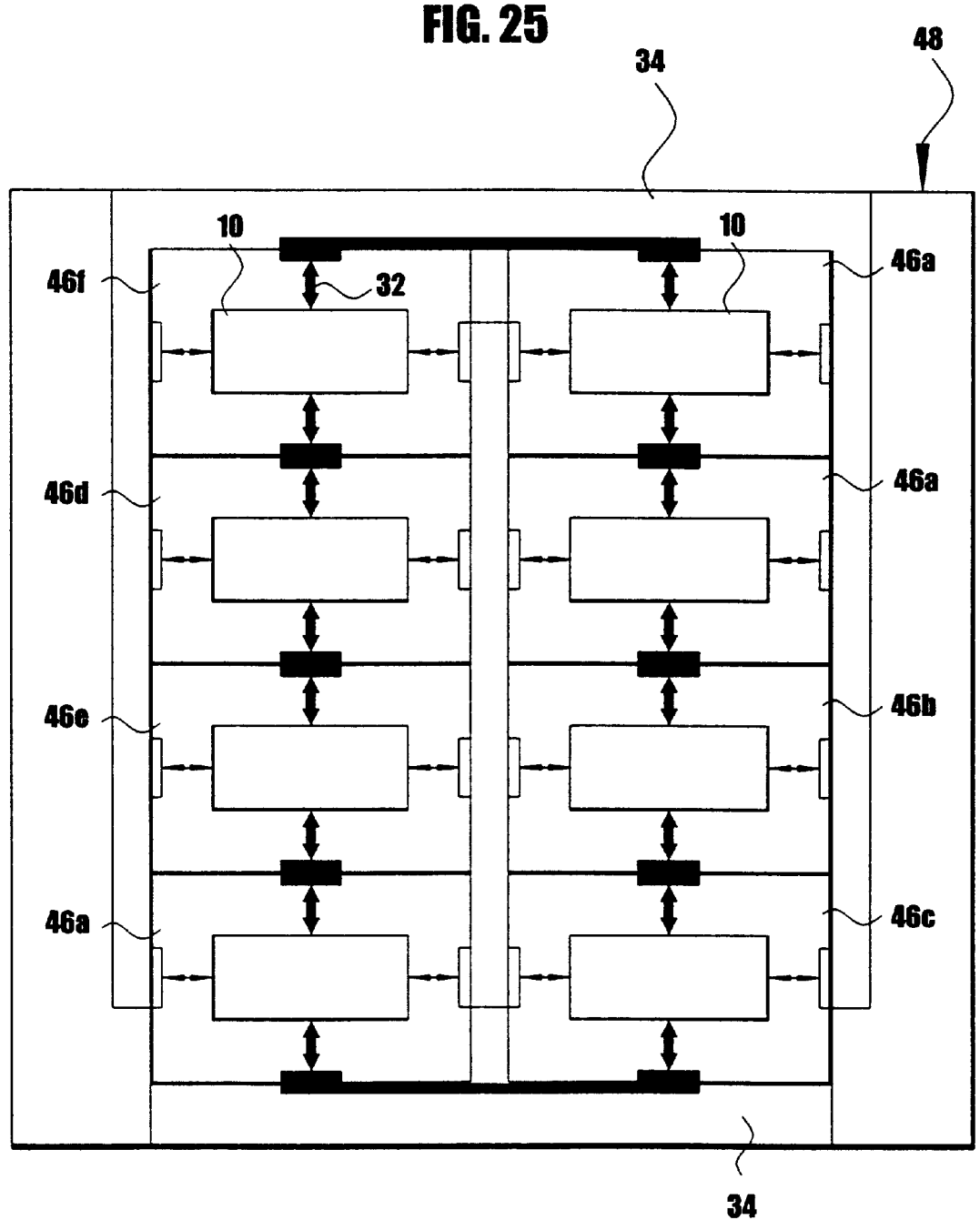
FIG. 25 is a schematic diagram showing another example of connecting at least two prototyping engine modules within the prototyping box in circular ring structure in relation to FIG. 24.

FIG. 24 is a schematic diagram showing an example of circular ring connection structure of at least two prototyping engine modules in the prototyping box in accordance with the present invention. FIG. 25 is a schematic diagram of another an example of circular ring connection structure of at least two prototyping engine modules in the prototyping engine box in accordance with the present invention. As shown in FIGS. 24 and 25, for module-to-module pipelined ring topology communication, at least two prototyping engine modules in the prototyping engine box are needed to be connected in circular ring connection structure by using at least one inter-module communication prot in the prototyping engine box, and pipelined ring topology communication channel for transmitting signal values among RFPDs in the different prototyping engine modules consists of the additional circuit for R-communication in the RFPDs in the different prototyping engine modules of the prototyping engine box and inter-module communication ports composed of the above-mentioned circular ring connection structure with inter-RFPD communication port (FIG. 24), or the additional circuit for R-communication in the RFPDs in the different prototyping engine modules and the inter-module communication ports which formed the above-mentioned circular ring connection structure (FIG. 25). Pipelined ring topology communication between signal transmitter and signal receivers in additional circuit for R-communication comprised of the above-mentioned communication channel makes the delivery of logic values among the partial circuits of the designed circuit to be verified which are partitioned and allocated into different modules in the specified prototyping engine box possible, so that the logical connection among the partial circuits of the designed circuit to be verified is possible.

Figure 26:
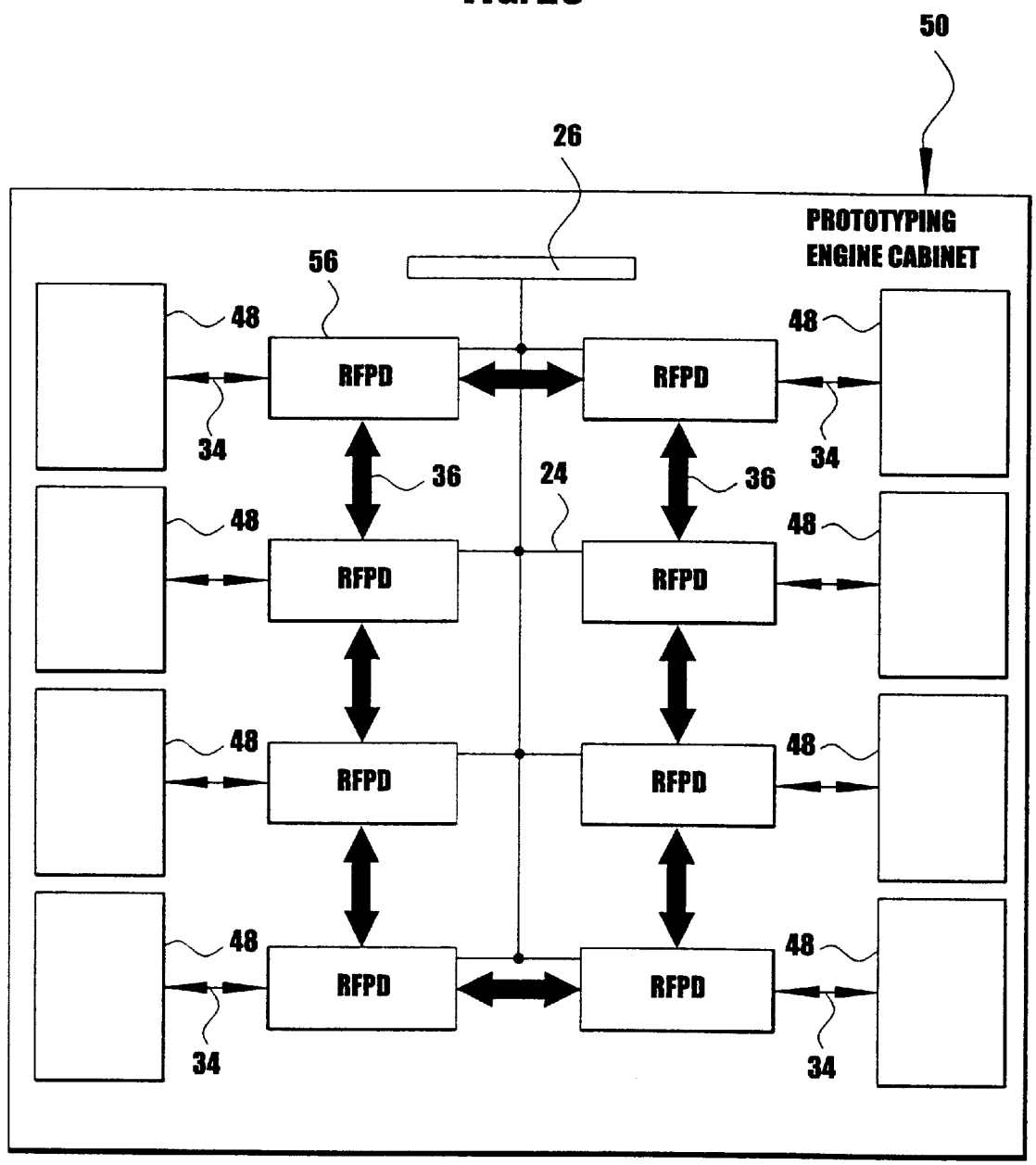
FIG. 26 is a schematic diagram showing an example of connecting prototyping boxes within the prototyping cabinet of thee present invention in circular ring structure.
Figure 27:
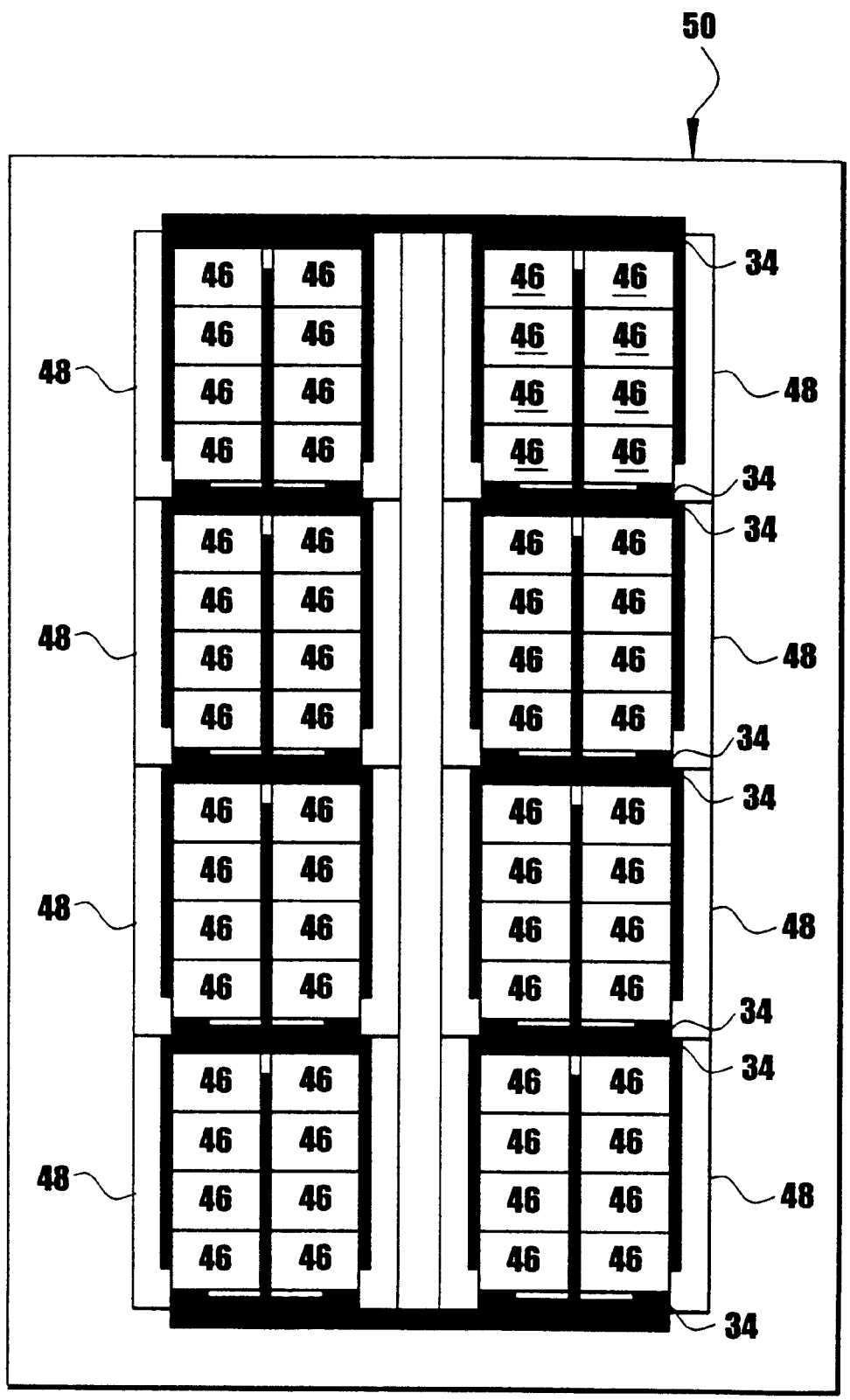
FIG. 27 is a schematic diagram showing another example of connecting the prototyping boxes within the prototyping cabinet in circular ring structure in relation to FIG. 26.

FIG. 26 is a schematic diagram of circular ring connection structure of at least two prototyping engine boxes in the prototyping cabinet in accordance with the present invention. FIG. 27 is a schematic diagram of another an example of circular ring connection structure of at least two prototyping engine boxes in the prototyping cabinet in accordance with the present invention. As shown in FIGS. 26 and 27, for box-to-box pipelined ring topology communication, at least two prototyping engine boxes in the prototyping engine cabinet are needed to be connected in circular ring connection structure by using at least one box connecting inter-RFPD communication port and at least one inter-box communication port (FIG. 26), or at least one inter-box communication port (FIG. 27), and pipelined ring topology communication channel for transmitting signal values among RFPDs in the different prototyping engine boxes consists of the additional circuit for R-communication in the RFPDs in the different prototyping engine boxes of the prototyping engine cabinet and inter-box communication ports which formed the above-mentioned circular ring connection structure with inter-RFPD communication port (FIG. 26), or the additional circuit for R-communication in the RFPDs in the different prototyping engine boxes and the inter-box communication ports which formed the above-mentioned circular ring connection structure (FIG. 27). Pipelined ring topology communication between signal transmitter and signal receivers in additional circuit for R-communication comprised of above-mentioned communication channel makes the delivery of logic values among the partial circuits of the designed circuit to be verified which are partitioned and allocated into different boxes in the specified prototyping engine cabinet possible, so that the logical connection among the partial circuits of the designed circuit to be verified is possible.

Figure 28:
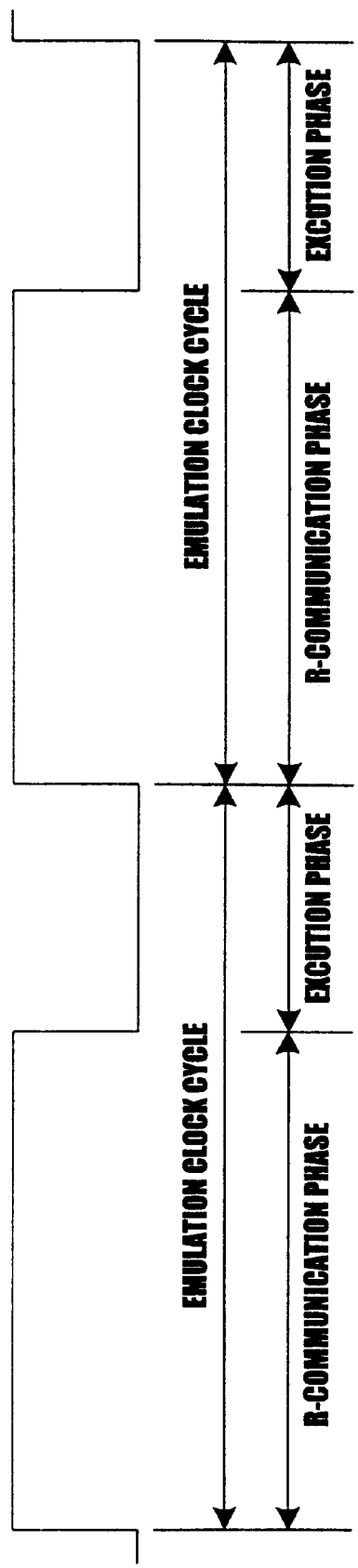
FIG. 28 is a timing diagram for explaining the situation where an emulation clock cycle in the present invention is comprised of an R- communication phase and an execution phase.

The designed circuit to be verified which is partitioned and allocated into the component devices existing in the prototyping engine and implemented together with the additional circuit for R-communication must be functionally equivalent to the original designed circuit to be verified, and to achieve this the prototyping system of the present invention, as shown in FIG. 28, divides each cycle of emulation clock which is applied during emulation into two phases, R-communication phase and executing phase. FIG. 28 is a timing diagram which shows how to form R-communication phase and executing phase of an emulation clock cycle. In R-communication phase, the transmission of signal values for connecting the signal lines among the partial circuits of the designed circuit to be verified is carried out through pipelined communication with ring topology communication channels, and in the execution phase, the partial circuits of the designed circuit to be verified is executed with the transmitted signal values. In this case the finite state machine in the additional circuit for R-communication controls the timing of transmitting and receiving of pipelined ring topology communication between signal transmitter in the specified additional circuit for R-communication and signal receivers in the specified additional circuit for R-communication in R-communication phase.

Providing the additional circuit for R-communication with the designed circuit to be verified on the prototyping engine can provide systematic interface for connection of signal lines. This makes the connection among semiconductor devices such as RFPDs, memories, microprocessors, the digital signal processors, application specific non-memory devices, or among the circuit boards by using these semiconductor devices systematically and hierarchically. The advantage of the present invention is that the devices and the boards can be used in the prototyping engine with ease. And the another advantage of the present invention is that this unique additional circuit for communication has small overhead since the attribute of R-communication applied to it is deterministic in nature, and pipelined ring topology communication channel of ring circular structure greatly increases flexibility and bandwidth of the connection among devices of the prototyping engine, so that the usage rate of RFPDs of the prototyping engine under the limitation of the number of RFPD pins is highly increased.

According to the invention, the prototyping method can include a step for adding an additional circuit for P-probe produced by prototyping system software to the partial circuit of the designed circuit to be verified which are partitioned and allocated to specified RFPD to probe signal lines of the partial circuits. Suppose that the designed circuit to be verified used only D flip-flops.

The additional circuit for P-probe which does not change the logical functionality of the designed circuit to be verified at normal mode and adds this additional circuit to the designed circuit to be verified. To achieve this, it is needed to check each of the signal lines which are selected to be probed in certain order, and decide whether the fan-in element which drives the signal lines is flip-flop (called "fan-in flip-flop"), combinational gate, or latch. If the fan-in element is a combinational gate or a latch, double input D flip-flop (called "fan-out flip-flop") having the signal lines as one data input (FIG. 29(a)) is newly added. If the fan-in element is a flip-flop, it is replaced by double input D flip-flop, and all other flip-flops existing in the circuit, which are not fan-out flip-flop are replaced by D flip-flops with enable input (FIG. 29 (b)). FIG. 29 (a) and FIG. 29 (b) represents the symbol and functionality of double input D flip-flop 75 having two data inputs and one extra selection input, and FIG. 29 (c) and FIG. 29 (d) represents the symbol and functionality of a D flip-flop 76 having one data input and one extra enable input. The characteristic table of the double input D flip-flop is shown in Table 1:

TABLE 1

| $\overline{N}/P$ | D1 | D2 | CLK | Q |
|---|---|---|---|---|
| 0 | 0 | — | ↑ | 0 |
| 0 | 1 | — | ↑ | 1 |
| 1 | — | 0 | ↑ | 0 |
| 1 | — | 1 | ↑ | 1 |

Figure 30:
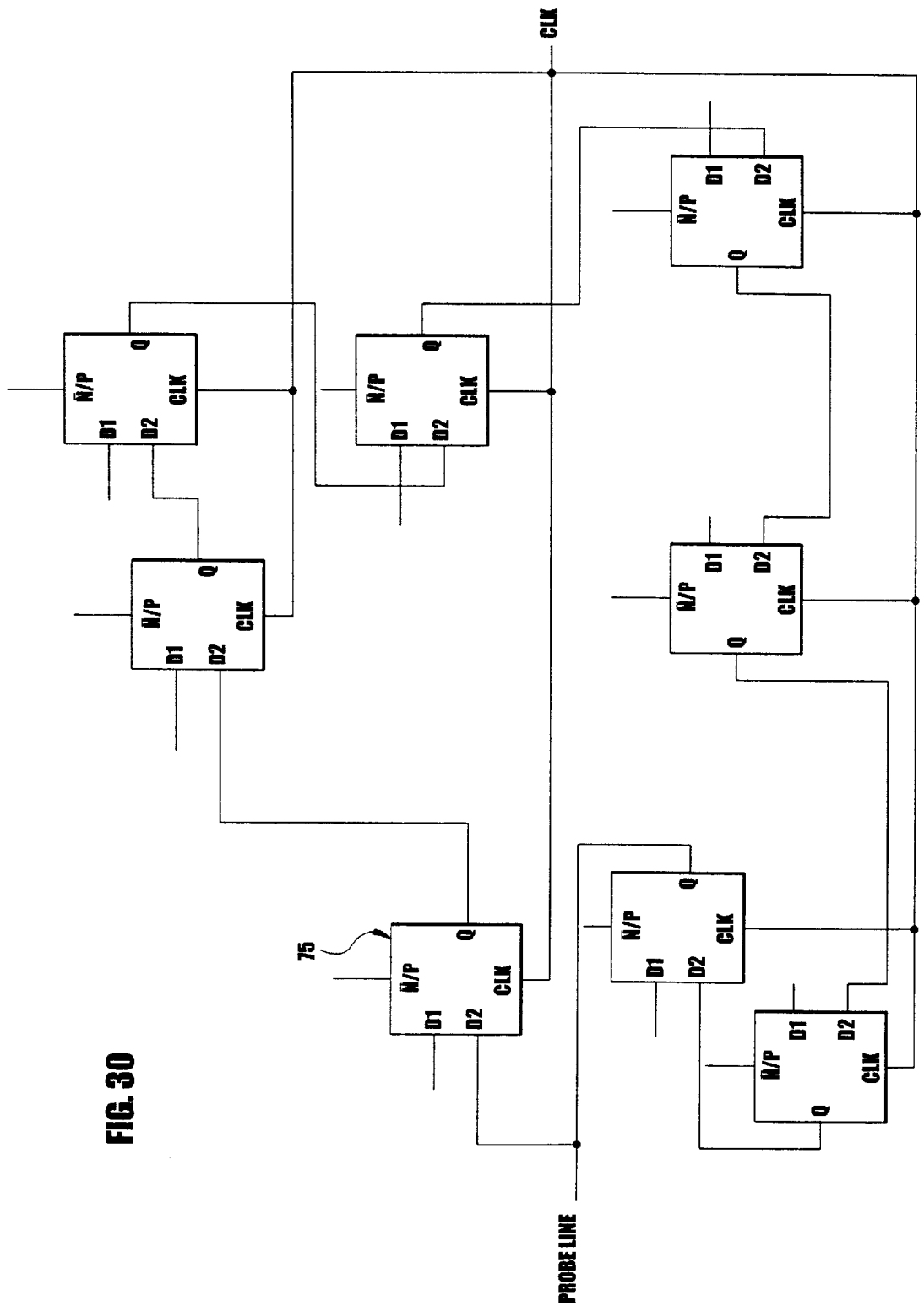
FIG. 30 is a schematic diagram showing an example of a circular ring feedback register array structure of an additional circuit for P-probe.
Figure 31:
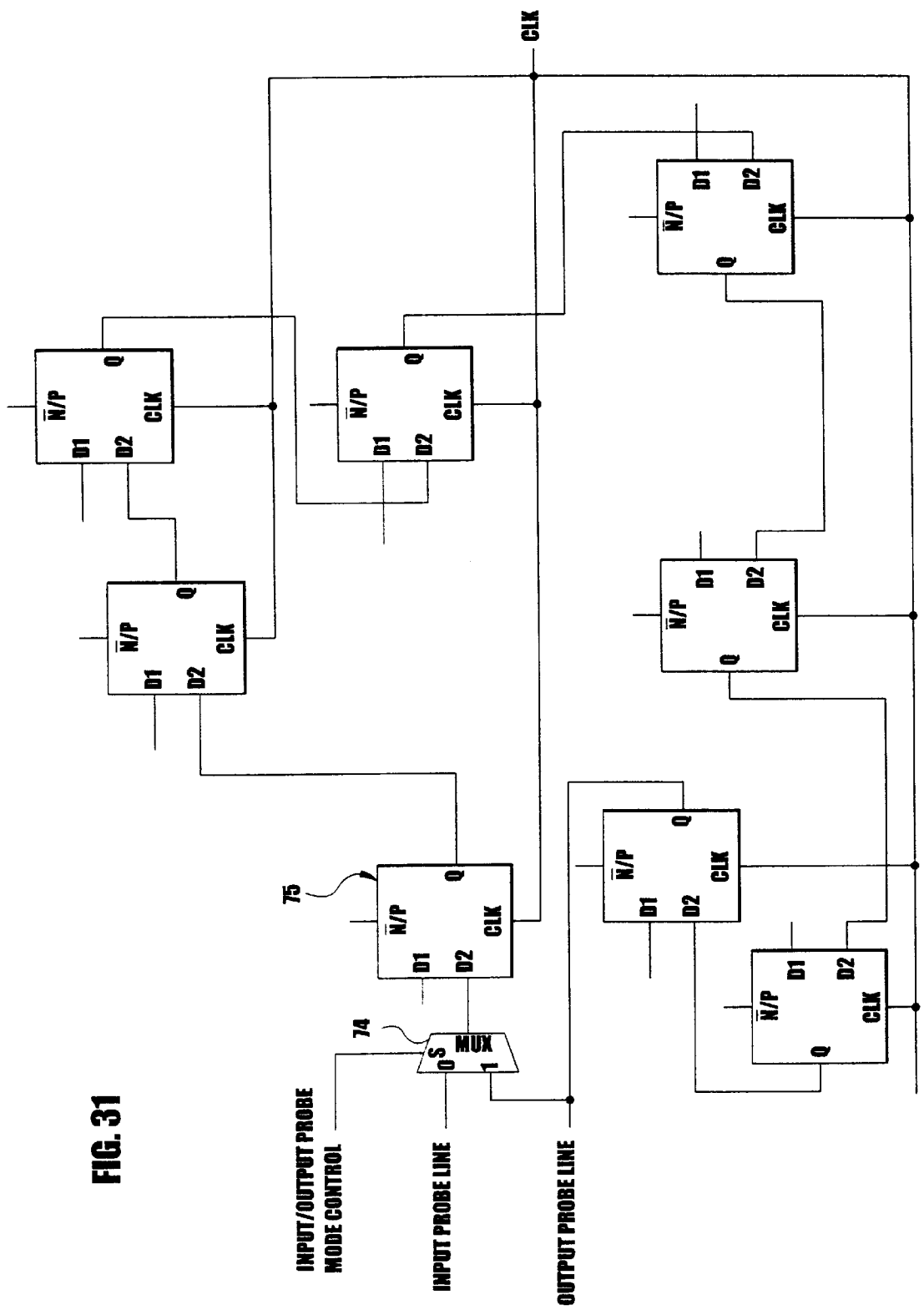
FIG. 31 is a schematic diagram showing another example of a circular ring feedback register array structure in relation to FIG. 30.
Figure 32:
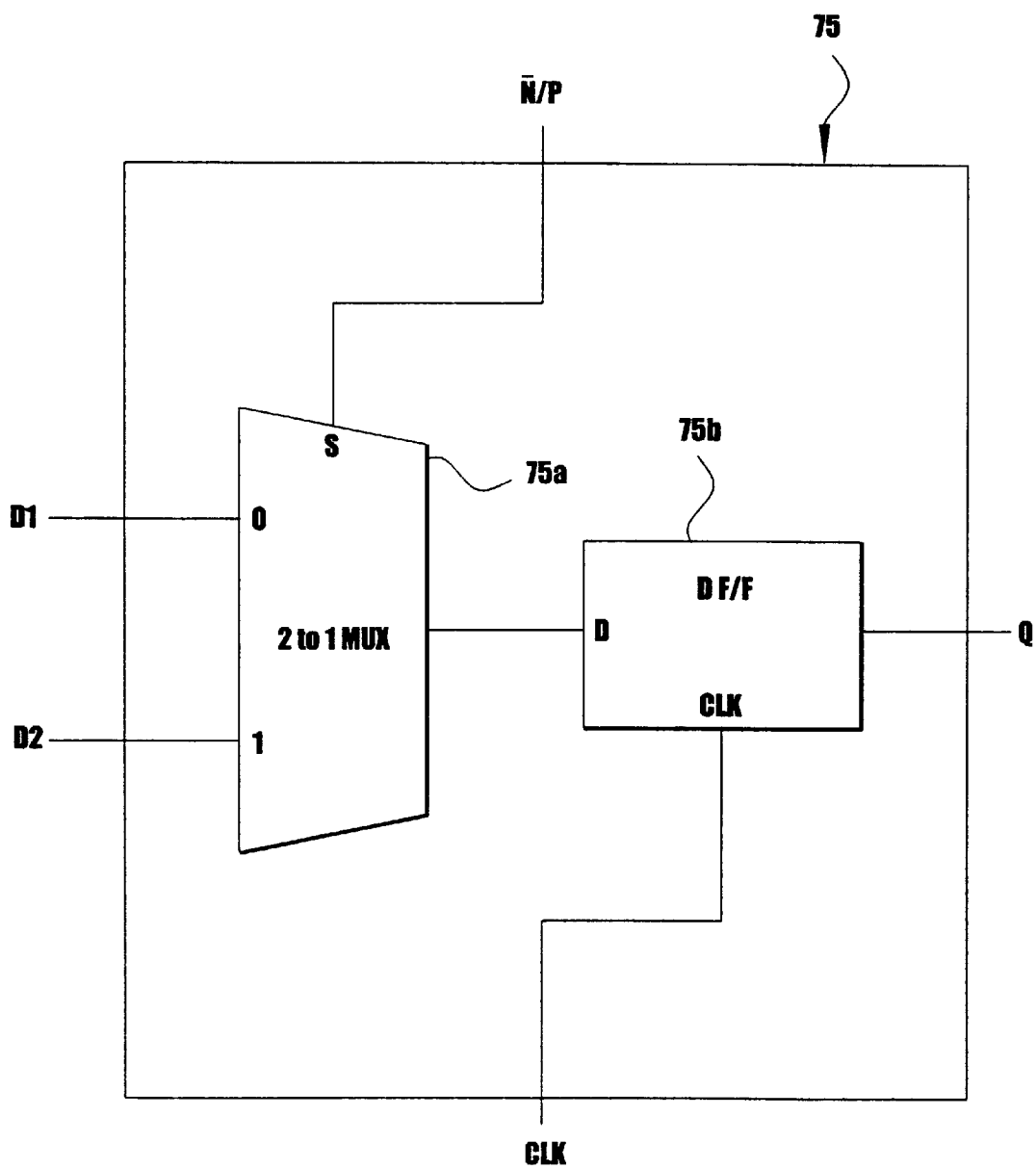
FIG. 32 is a schematic diagram showing an example of implementing the double input D flip-flop shown in FIG. 29 (*a*).

And, as shown in FIGS. 30 and 31, for all the fan-in flip-flops and all the fan-out flip-flops existing in the circuit to be logically composed of at least one circular ring register array structure in the probe mode, additional double input D flip-flops can be added to the circular ring register array structure so that the length of the longest of at least one circular ring register array structure can be positive multiples of the lengths of the rest of circular ring register array structures, and an extended partial circuit of the designed circuit to be verified is produced by augmenting the circular ring register array structure produced by the prototyping system software so as to minimize the length of the longest circular ring register array structures. To achieve this, general single input port flip-flops should be replaced by double input port flip-flops, and the general symbol and functionality of double input port flip-flops are illustrated in FIG. 29 as mentioned in the above. FIG. 32 represents a detailed embodiment of the double input port flip-flops. The double input port flip-flop comprises 2×1 multiplexer 75a and D flip-flop 75b. The multiplexer 75a has two input signals D1 and D2, one selection input end (S) which receives signal/P and one output which is connected to the input end (D) of the D flip-flop (75b). The D flip-flop outputs Q signal with each clock signal (CLK). Therefore, double input port flip-flop 75 receives two input signals D1 and D2 and selection signal/P and output signal Q.

FIG. 30 is a schematic diagram of an example of circular ring register array structure representing the additional circuit for P-probe. FIG. 31 is a schematic diagram of another an example of circular ring register array structure of FIG. 30. FIG. 32 is a schematic diagram of an example of double input D flip-flop 75 of FIG. 29(a).

As shown in FIG. 30, the output (Q) of each double input D flip-flop 75 is connected to input line D2 of the flip-flop of the following stage, and input line D2 of the flip-flop (75) is connected to the output (Q) of the antecedent flip-flop. And, the connections are repeated so that circular ring connection structure can be formed and makes the closed register circulating operation possible. A "probe line" is connected to the input line D2 of a specific flip-flop. In FIG. 31, the input line D2 of a flip-flop 75 is disconnected from the circular ring connection structure of FIG. 30, and then a multiplexer 74 added such a way that the output of the multiplexer is connected to the input line D2 of the flip-flop 75. And, instead of the input of the specific flip-flop in FIG. 30, one of the data input lines of the multiplexer (74) is connected to the output line of another flip-flop which was connected to the input line (D2) of the flip-flop. Another data input line of the multiplexer is connected to an external input probe line, and the selection input line of the multiplexer is connected to an input/output probe mode control line. Not only closed register circulation but open register shifting can be operated depending on the value of input/output probe mode control line.

Figure 33:
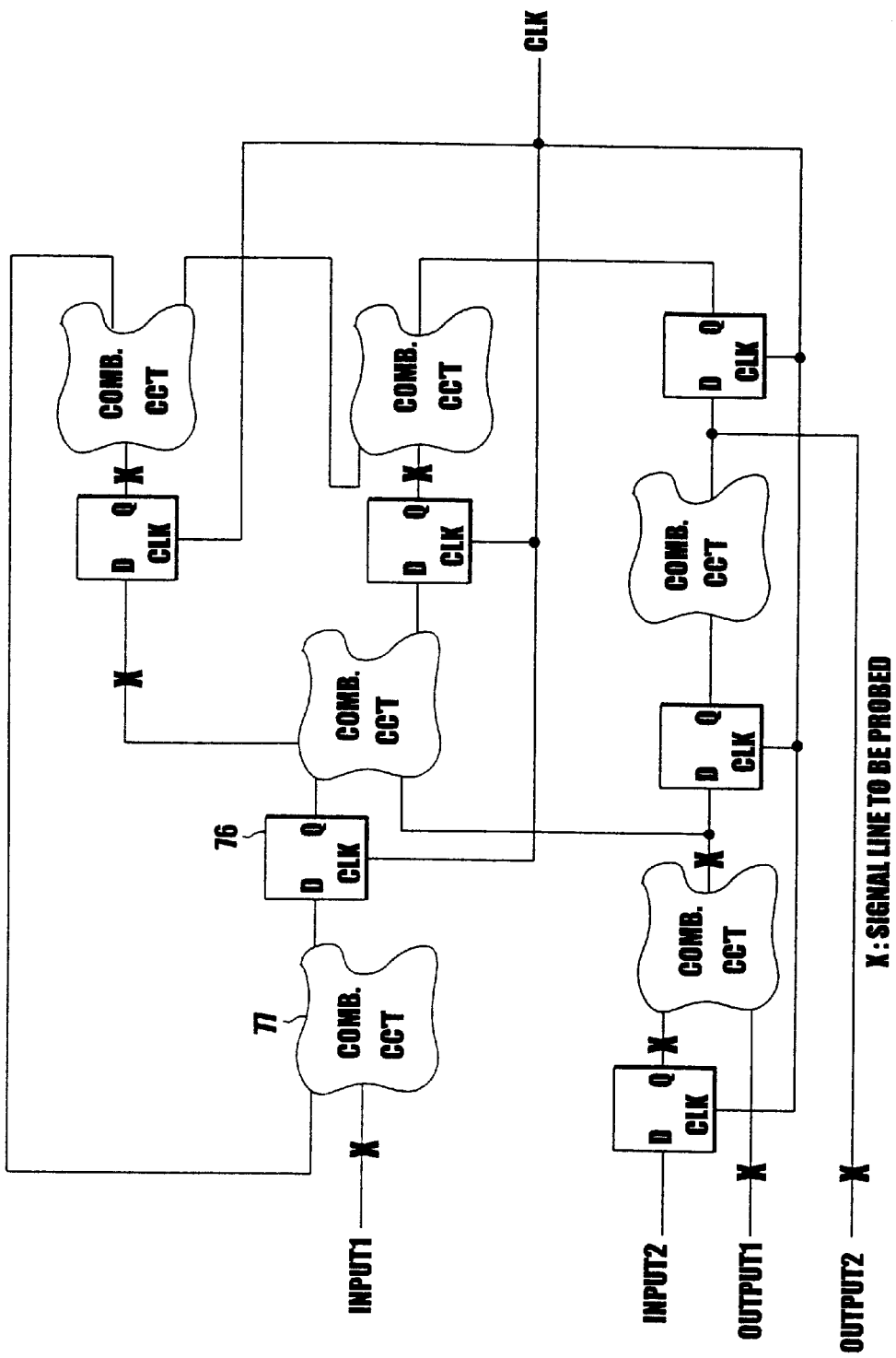
FIG. 33 is a schematic diagram representing an example of the partial circuit of the designed circuit to be verified shown in FIG. 18.
Figure 34:
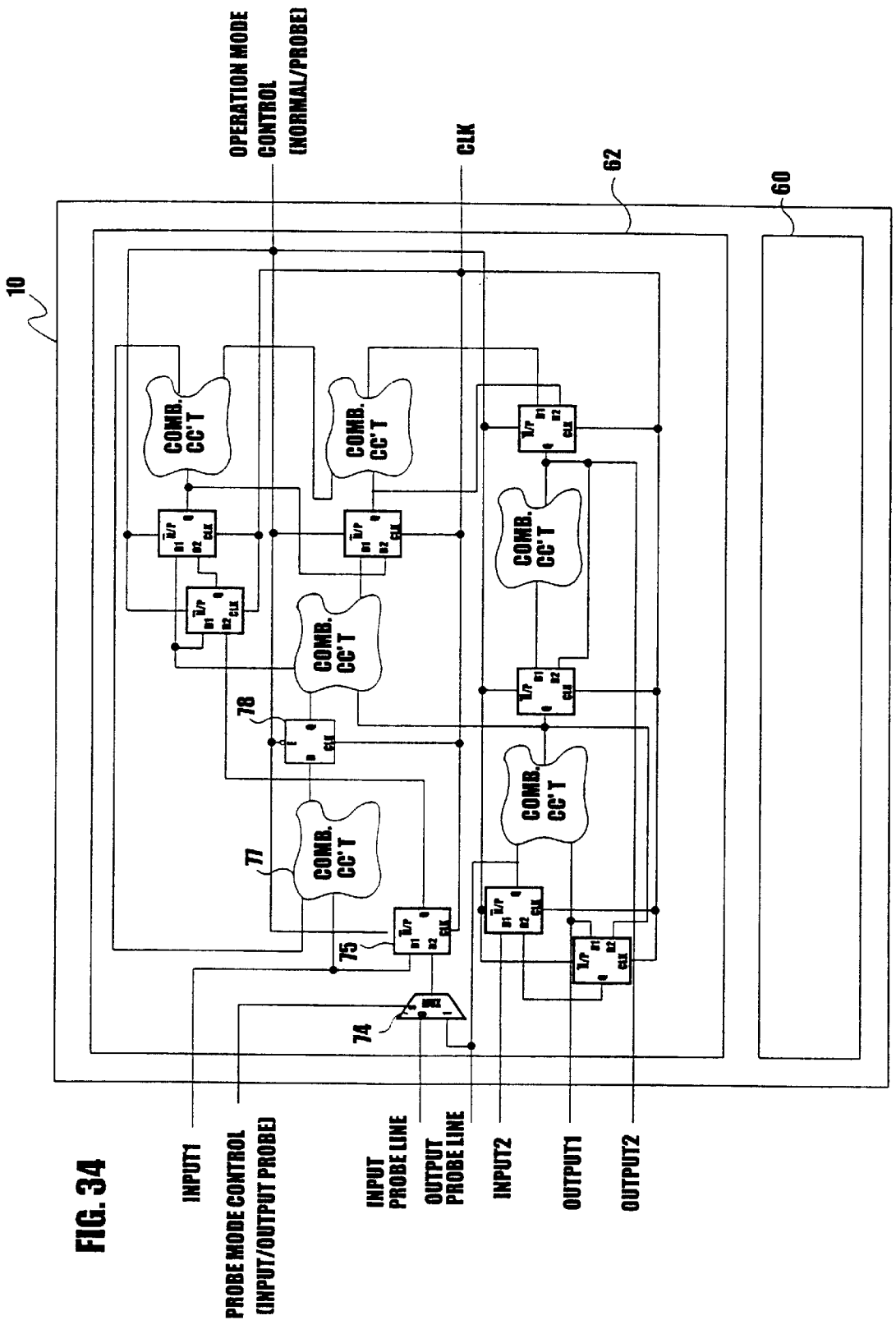
FIG. 34 is a schematic diagram representing an example of the partial circuit shown in FIG. 33 which includes additional circuit for P-probe, and resulting in a circular ring feedback register array in probe mode.

FIG. 33 is an example of a schematic diagram of the partial circuit of the designed circuit to be verified of FIG. 18. FIG. 34 is a schematic diagram in which the partial circuit for P-probe by producing the circular ring register array is added to the partial circuit shown in FIG. 33.

The partial circuit (62) comprises combinational circuits 77 and D flip-flop which are connected with each other. The specific combinational circuits and specific D flip-flop are connected external input or output signal (INPUT1, INPUT2, OUTPUT1 and OUTPUT2), and signal lines to be probed are marked as "X".

The additional circuit for P-probe is added to the circuit shown in FIG. 33 which is considered to be the designed circuit to be verified in FIG. 34.

In FIG. 34, if the signal lines needed to be probed existing in the circuit of FIG. 33 are driven by a fan-in flip-flop, the fan-in flip-flop is replaced with a double input flip-flop 75. If the driving element of signal lines needed to be probed is not flip-flop, circular ring connection structures as shown in FIG. 31 are produced with newly added double input flip-flop. If the input probe is needed, a multiplexer 74 is introduced. The rest of the flip-flops are replaced with the flip-flop having enable input ends (E).

Additional circuit for P-probe performs a closed register circulating operation after the operation has been completed while enforcing the logic values of flip-flops not included in the serial circular register to be kept to the logic values just before the circulating operation in the output probe mode, and an opened register shifting operation after the operation has been completed while enforcing the logic values of flip-flops not included in the serial shift register to be kept to the logic values just before the shifting operation in the input probe mode. Also, additional circuit for P-probe produces an additional circuit for probe which does not alter the logical functionality of a designed circuit to be verified in normal mode.

The programming pattern for produced extended partial circuit of the designed circuit to be verified is generated, downloaded, and implemented on the associated RFPD through interface module and system interface port from server computer. When output probing of the signal line is needed, the associated RFPD is switched from normal mode to output probing mode under control of prototyping system software. And, if the probing clock is applied to RFPDs, the signal values of the signal lines needed to be probed are transmitted to the server computer via at least one of the output probe lines which is connected to the output of one flip-flop existing in at least one circular ring register array structure through system interface port and interface module. After the end of application of probing clock the signal values of all the fan-in flip-flops and all the fan-out flip-flops existing in RFPD have the same signal values as the values at the very end of normal mode just before switching to probing mode, and thereby the operation in the subsequent correct normal mode is guaranteed. Also, if input probing is needed, data for input probe is produced under control of the prototyping system software, and the mode is switched to input probing mode. As probing clock is applied, input probing data transmitted from server computer through interface module and system interface port and at least one input probe line logically connected through multiplexer for input probing 74 to the input of a flip-flop existing in at least one circular ring register array structure, and is latched into the flip-flops existing in at least one circular ring register array structure, so that signal lines needed to be input-probed have input probe signal values of input probing data.

The commercial RFPDs have several number of flip-flops, and these flip-flops are all D flip-flops. If the flip-flops used in the design are not D, but RS, JK, T and so on, the equivalent circuit which is functionally the same as the RS, JK, T or other types of flip-flops except for D flip-flop is constructed with the D flip-flop and simple combinational circuits, and the equivalent circuit is implemented. This means that any kind of flip-flops can be used in producing additional circuit for P-probe.

Figure 35B:
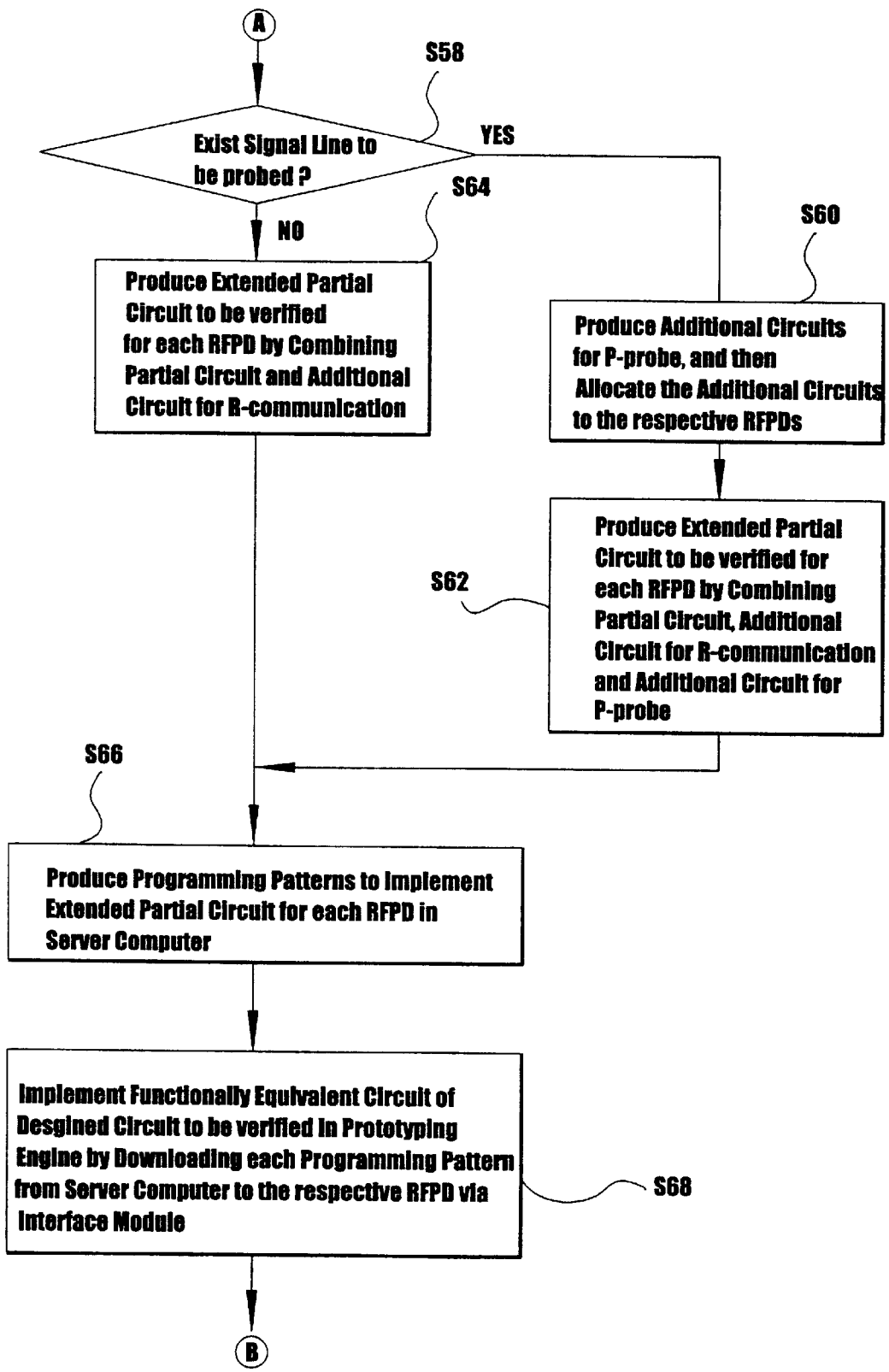
Figure 35C:
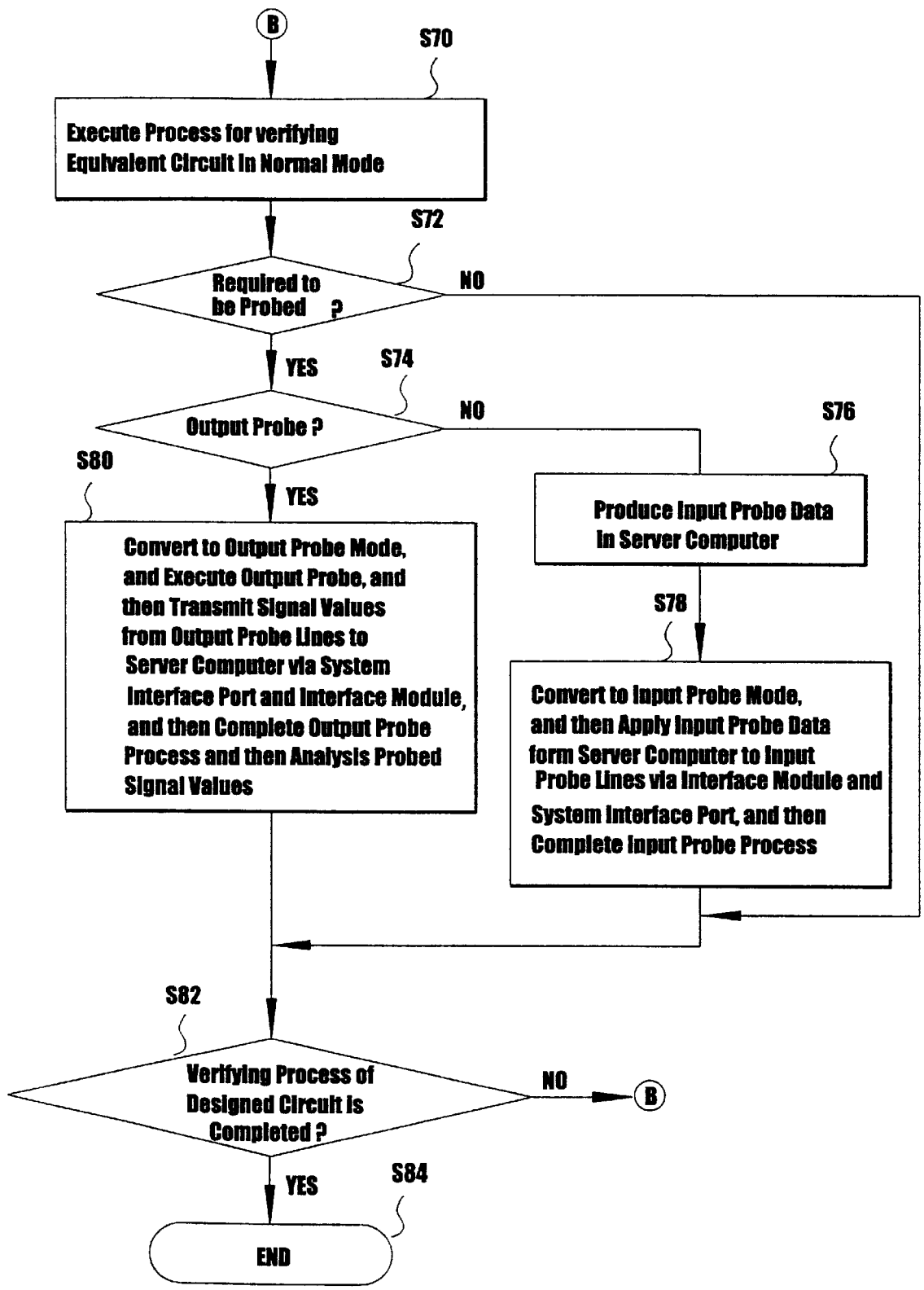

FIG. 35 is a flowchart representing the steps of prototyping method in accordance with the present invention, and the prototyping is executed by the server computer 40 shown in FIG. 1.

In 50th step S50, the designed circuit to be verified and the ASIC vendor library are input by server computer 40. In 52nd step S52, if there exist signal lines needed to be probed, these are inputs by the server computer 40. In 54th step S54, server computer 40 executes the first partitioning and allocating step which partitions the designed circuit to be verified into partial circuits and allocates the partitioned partial circuits to the prototyping boxes, the second partitioning and allocating step which re-partitions the partial circuit to be verified and allocates the re-partitioned circuits to the engine modules, and the third partitioning and allocating step which further re-partitions the second partial circuit to be verified and allocates the further re-partitioned circuits to the component devices including RFPDs on prototyping engine module by executing prototyping system software. In 56th step S56, server computer 40 produces additional circuits for R-communication which are for communication among component devices in the different prototyping boxes, additional circuits for R-communication which are for communication among devices in the different prototyping engine modules, and additional circuits for R-communication which are for communication among the component devices in a prototyping engine module, and allocates these additional circuits for R-communication to corresponding RFPDs in the prototyping engine. The server computer (40) checks whether signal lines needed to be probed exist or not, in 58th step S58. If signal lines needed to be probed are detected, server computer 40 produces additional circuits for P-probe for the partitioned partial circuits and allocates the additional circuits for P-probe to the RFPDs in the prototyping engine by executing the prototyping system software, in 60th step S60. The server computer (40) produces extended partial circuits of the designed circuit to be verified by merging the partial circuits of the designed circuit to be verified, additional circuits for R-communication, and additional circuits for P-probe for the RFPDs by executing the prototyping system software, in the 62nd step. But if signal lines needed to be checked are not detected in 58th step, the server computer (40) proceeds to 64th step (S64) and produces extended partial circuits of the designed circuit to be verified by merging partial circuits of the designed circuit to be verified and additional circuits for R-communication for the RFPDs by executing the prototyping system software. In 66th step S66, server computer 40 produces programming patterns for implementing extended partial circuits of the designed circuit to be verified in RFPDs in the prototyping engine by executing the prototyping system software. In 68th step S68, the server computer downloads the programming pattern to each RFPD through interface module 42 and system interface port 26 and implements the functionally equivalent circuit with the designed circuit to be verified by executing the prototyping system software. In 70th step S70, the prototyping system verifies the circuit implemented in an emulation engine in normal mode. Then, in the 72nd step S72, it is determined whether probing is necessary or not, and in case that the probing is necessary, it proceeds to the 74th step (S74), and if not, to the 82nd step (S82). In the 74th step S74, it is investigated whether the necessary probing is input probing or output probing (S74). If it is input probing, it proceeds to the 76th step (S76), and if not, to the 80th step (S80). In the 80th step S80, the server computer (40) executes the prototyping system software when output probing is needed to switch to the output probing mode, and performs the output probing process using additional circuits for P-probe in the RFPDs, and the server computer (40) reads the signal values which appear at the output probe lines having at least one value at the pre-determined time frame through system interface port (26) and interface module 42. Then, the server computer (40) analyzes the probed output values using the prototyping system software. In the 76th step S76, the server computer (40) creates the input probing data when the input probing is necessary (S76). Thereafter, in the 78th step, the server computer (40) executes the prototyping system software to switch to the input probing mode and applies the input probing data to the input probe line while synchronizing with the clock through interface module 42 and system interface port 26 so as to finish the input probing. On the other hand, in case that the above-mentioned probing is finished (S78 and S80), or there is no need for probe, the server computer (40) investigates whether the design verification is finished or not (S82). The server computer (40) finishes the whole process if the design verification is finished, and if not, it proceeds to the 70th step.

FIG. 36 illustrates the prototyping method according to the invention. This shows the state in which the original designed circuit is partitioned to partial circuits of the designed circuit to be verified.

Figure 37:
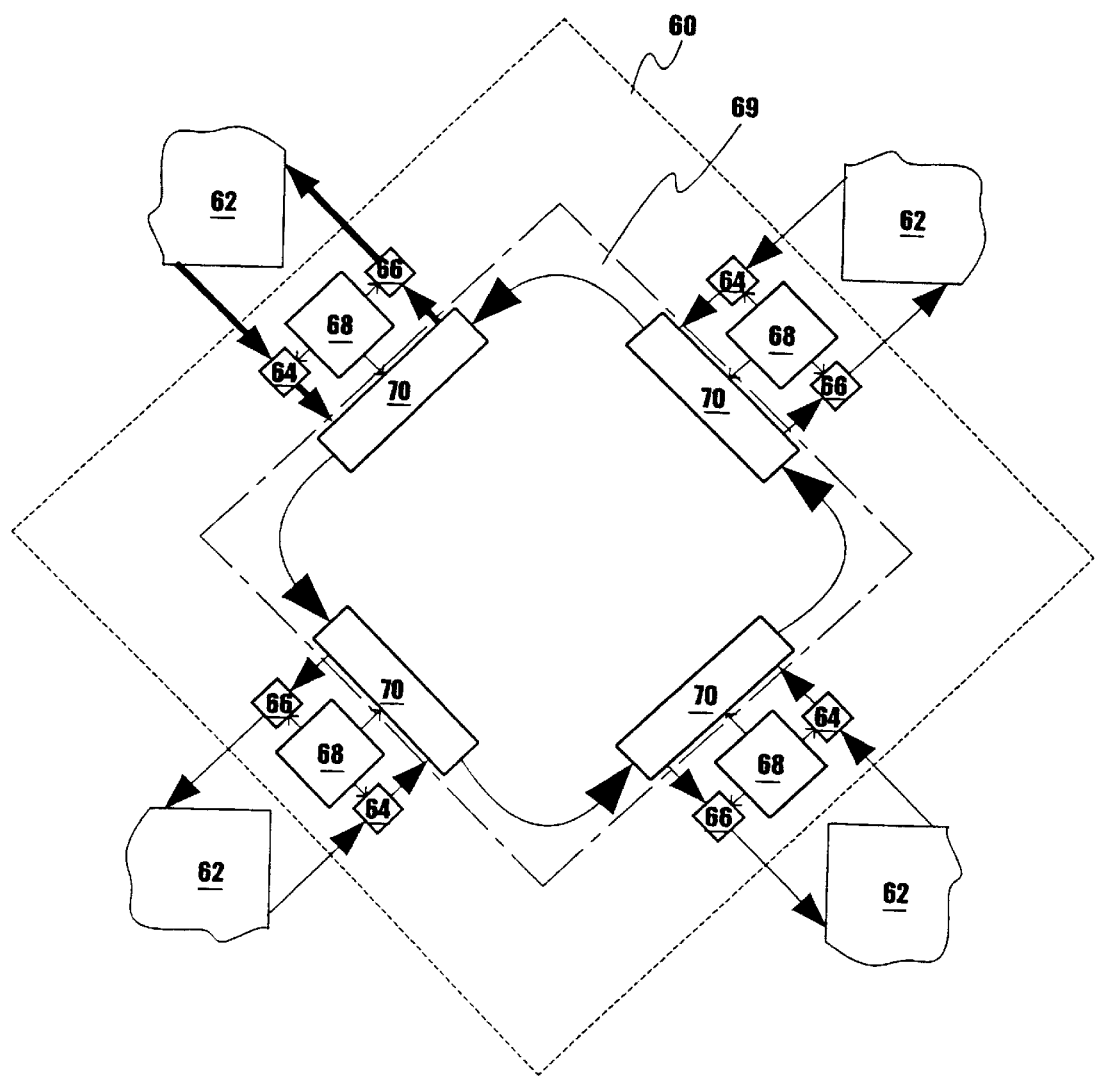
FIG. 37 is a schematic diagram representing a method of performing prototyping by producing an functionally equivalent circuit with the designed circuit to be verified by adding an additional circuit for R-communication to the partial circuits of the designed circuit to be verified.
Figure 38:
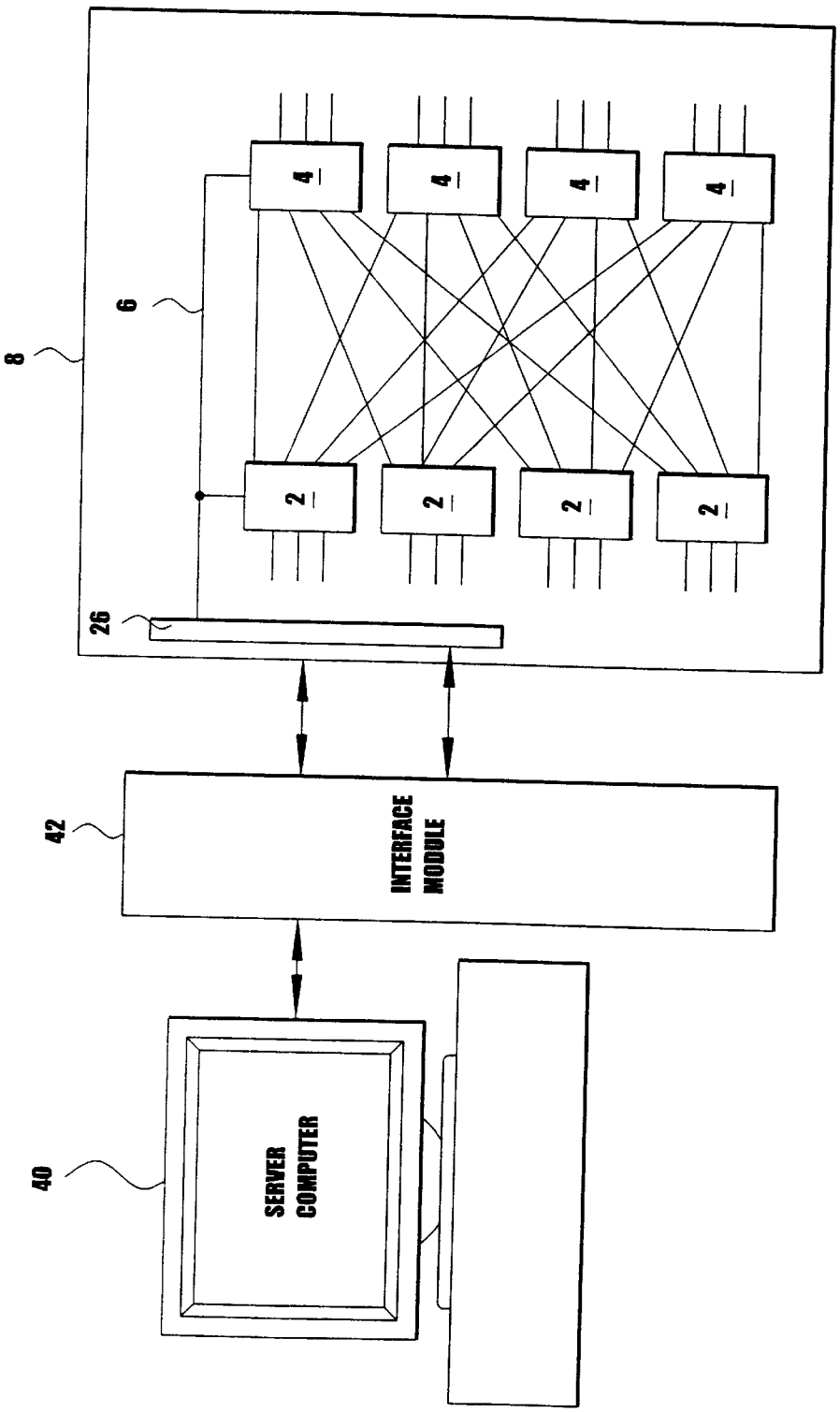
FIG. 38 is a schematic diagram of the conventional prior art prototyping system.

FIG. 37 schematically shows the prototyping method using the functionally equivalent circuit in which the additional circuit for R-communication (60) is augmented to the partial circuits of the designed circuit to be verified (62) in FIG. 36, and creates the circuits functionally equivalent to the original designed circuit. With the additional circuit for R-communication (60), composed of signal transmitter, signal receivers, finite state machines and communication channels, connecting signal lines among partial circuits of a designed circuit to be verified is accomplished through pipelined communication with ring topology communication channels. The timing of pipelined communication connecting the signal lines among the partial circuits of the circuit to be verified is controlled by the finite state machines in the partial circuits for R-communication.

As will be appreciated from the foregoing description, it will be apparent to those skilled in the art that various changes and modifications can be made without departing from the spirit of the present invention. Thus, the scope of the invention is not limited to the foregoing of the present embodiments.

What is claimed is:

1. A prototyping system including a prototyping engine, a server computer and an interface module,
   - wherein the prototyping engine comprises a plurality of component devices and communication ports connecting the component devices, each of the component devices comprising an additional circuit for R-communication for transmitting signal values among the component devices in said prototyping engine by using said communication ports, said R-communication being carried out by said additional circuit and PCB traces which connect the component devices on a PCB;
   - wherein the server computer partitions a predetermined designed circuit to be verified into a plurality of partial circuits and allocates said partial circuits to the respective component devices in the prototyping engine; and
   - wherein the interface module takes care of interface between the server computer and the prototyping engine.

2. The prototyping system as set forth in claim 1, said prototyping engine being comprised of a reconfigurable logic module, each of the component devices in the reconfigurable logic module being a Reusable Field Programmable Device (RFPD) capable of implementing various forms of digital hardware through programming each said device, and each RFPD including at least one inter-RFPD communication port connected to an input/output terminal thereof.

3. The prototyping system as set forth in claim 2, said RFPD being a field programmable gate array.

4. The prototyping system as set forth in claim 2, said RFPD being a complex programmable logic device.

5. The prototyping system as set forth in claim 1, said prototyping engine being comprised of a prototyping engine box, each of the component devices in said engine box being a prototyping engine module which includes at least one inter-module communication port connected to an input/output terminal thereof, and said prototyping engine module including at least one RFPD (Reusable Field Programmable Device).

6. The prototyping system as set forth in claim 5, wherein said prototyping engine box has at least two prototyping engine module, said at least two prototyping engine modules in the prototyping engine box being connected in circular ring structure by using said inter-module communication ports, and, in order to transmit signal values between a RFPD in a predetermined prototyping engine module and a RFPD in another prototyping engine module, a pipelined ring topology communication channel being comprised of additional circuit for R-communications of said RFPDs in said prototyping engine modules and said inter-module communication ports in said circular ring topology is provided.

7. The prototyping apparatus as set forth in claim 1, said prototyping engine being comprised of a prototyping engine cabinet, each of the component devices in said engine cabinet being a prototyping engine box which includes at least one inter-box communication port connected to an input/output terminal thereof, said prototyping engine box including at least two prototyping engine modules, and said prototyping engine module including at least one RFPD (Reusable Field Programmable Device).

8. The prototyping system as set forth in claim 7, wherein said prototyping engine cabinet has at least two prototyping engine boxes, said prototyping engine cabinet further including at least one RFPD for box connection, and all RFPDs in each engine box being connected to the respective RFPD for box connection through said at least one inter-box communication port.

9. The prototyping system as set forth in claim 7, said at least two prototyping engine boxes in the prototyping engine cabinet being connected in circular ring structure by using said inter-box communication ports, and then, in order to transmit signal values between a RFPD in a predetermined prototyping engine box and a RFPD in another prototyping engine box, a pipelined ring topology communication channel being comprised of additional circuit for R-communications of said RFPDs in said prototyping engine boxes and said inter-box communication ports in said circular ring topology is provided.

10. The prototyping system as set forth in claim 7, said at least one prototyping engine module being one of a reconfigurable logic module, a memory device mounted module, a microprocessor mounted module, a digital signal processor mounted module, an application specific non-memory device mounted module, or an input/output port mounted module,
   - said reconfigurable logic module including at least two RFPDs, at least one inter-RFPD communication port which is connected to the input/output terminal of each of said at least two RFPDs, at least one inter-module communication port which is connected to an input/output terminal of each of said at least two RFPDs, and at least one inter-box communication port which is connected to an input/output terminal of each of said at least two RFPDs,
   - said memory device mounted module including at least one RAM or ROM memory device, at least one RFPD connected to said at least one memory device, at least one inter-RFPD communication port which is connected to an input/output terminal of said at least one RFPD connected to said memory device, at least one inter-module communication port which is connected to an input/output terminal of said at least one RFPD connected to said memory device, and at least one inter-box communication port which is connected to the input/output terminal of said at least one RFPD connected to said memory device, said microprocessor mounted module including at least one microprocessor, at least one RFPD connected to said at least one microprocessor, at least one inter-module communication port which is connected to an input/output terminal of said at least one RFPD connected to said microprocessor, and at least one inter-box communication port which is connected to an input/output terminal of said at least one RFPD connected to said microprocessor, said digital signal processor mounted module including at least one digital signal processor, at least one RFPD connected to said at least one digital signal processor, at least one inter-module communication port which is connected to an input/output terminal of said at least one RFPD connected to said signal processor, and at least one inter-box communication port which is connected to an input/output terminal of said at least one RFPD connected to said signal processor, and said application specific non-memory device mounted module including at least one application specific non-memory device, at least one RFPD connected to said at least one application specific non-memory device, at least one inter-module communication port which is connected to an input/output terminal of said at lest one RFPD connected to said non-memory device, and at least one inter-box communication port which is connected to an input/output terminal of said at least one RFPD connected to said non-memory device, and said input/output port mounted module including at least one input/output port, at least one RFPD connected to said at least one input/output port, at least one inter-module communication port which is connected to an input/output terminal of said at least one RFPD connected to said input/output port, and at least one inter-box communication port which is connected to an input/output terminal of said at least one RFPD connected to said input/output port.

11. The prototyping system as set forth in claim 1, wherein the partial circuit of said designed circuit to be verified, which is implemented by partitioning and allocating to the components devices in the prototyping engine for connecting logic signal lines among said component devices of the prototyping engine, is physically isolated from communication channel composed of a plurality of external communication channels and a plurality of internal communication channels, and wherein each of external communication channels and a plurality of internal communication channels is shared among all of the component devices in the prototyping engine.

12. The prototyping system as set forth in claim 11, wherein said communication channel composed of the external communication channels and the internal communication channels is comprised as pipeline, and carries out connecting logic signal lines among the component devices in the prototyping engine by communication in pipelined fashion in which signal values are transmitted and received in parallel between at least two pairs of a signal transmitter and a signal receiver group in at least two additional circuits for R-communication.

13. The prototyping system as set forth in claim 1, further comprising at least two of said plurality of component devices in the prototyping engine being connected in circular ring structure by using said communication ports among the component devices, and, in order to transmit signal values between a component device and another component device, a pipelined ring topology communication channel comprised of additional circuit for R-communications of said component devices in said prototyping engine and said communication ports in said circular ring structure is provided.

14. The prototyping system as set forth in claim 1, said additional circuit for R-communication in the component device being composed of a signal transmitter, a signal receiver, a finite state machine and an internal communication channel of the component device.

15. The prototyping system as set forth in claim 14, wherein said internal communication channel of the additional circuit for R-communication includes at least one flip-flop having an enable input which connects its data input to the external communication channel and one side data input of a multiplexer connected to a data output of the flip-flop, wherein said signal transmitter is comprised of other side data input of the multiplexer having a selection input, wherein said signal receiver is comprised of a D flip-flop having an enable input which connects its data input to the external communication channel, and an output from the finite state machine is connected to said enable input of each flip-flop of the additional circuit and said input of the multiplexer in order to control operations and timings of said signal transmitter, signal receiver and internal communication channel of the component device by output signals of the finite state machine.

16. The prototyping system as set forth in claim 1, said additional circuit for R-communication being implemented by execution of prototyping system software by the server computer.

17. The prototyping system as set forth in claim 16, said prototyping system software including a scheduler for R-communication and a synthesizer of additional circuit for R-communication.

18. A prototyping system including a prototyping engine, a server computer and an interface module, wherein the prototyping engine comprises a plurality of component devices, communication ports connecting the component devices and at least one probe line connected to inputs/outputs of the component devices, each of the component devices comprising an additional circuit for P-probe to a designed circuit to be verified;

wherein the server computer partitions a predetermined designed circuit to be verified into a plurality of partial circuits for the component devices in said engine and allocates said partial circuits to respective RFPDs (Reusable Field Programmable Devices) in the engine; and wherein the interface module takes care of interface between the server computer and the prototyping engine, wherein said additional circuit for P-probe performs a closed register circulating operation after the circulating operation has been completed while enforcing logic values of flip-flops not included in a serial circular register to be kept to the logic values just before the circulating operation in an output probe mode, and an opened register shifting operation after the shifting operation has been completed while enforcing logic values of flip-flops not included in a serial shift register to be kept to logic values just before the shifting operation in an input probe mode; and wherein said additional circuit for P-probe produces an additional circuit for probe which does not alter logical functionality of a designed circuit to be verified in normal mode.

19. The prototyping system as set forth in claim 18, including prototyping system software of the system including a synthesizer of additional circuit for probing in order to produce the additional circuit for P-probe.

20. The prototyping system as set for the in claim 18, said at least one probe line being implemented as a unidirectional input probe line and a unidirectional output probe line independent of said unidirectional input probe line.

21. The prototyping system as set forth in claim 18, said input/output probe line being implemented as a bidirectional probe line which combines an output probe line and an input probe line.

22. The prototyping system as set forth in claim 18, wherein a partial circuit of the designed circuit to be verified and said additional circuit for P-probe being implemented in a component devices in the prototyping engine.

23. A prototyping system including a prototyping engine, a server computer and an interface module, wherein the prototyping engine comprises a plurality of component devices, communication ports connecting the component devices and at least one probe line connected to inputs/outputs of the component devices, each of the component devices comprising an additional circuit for P-probe to a designed circuit to be verified;

wherein the server computer partitions a predetermined designed circuit to be verified into a plurality of partial circuits for the component devices in said engine and allocates said partial circuits to respective RFPDs (Reusable Field Programmable Devices) in the engine; and wherein the interface module takes care of interface between the server computer and the prototyping engine, wherein in probe mode, said additional circuit for P-probe becomes at least one circular ring feedback register array structure, either with same number of flip-flops in circular ring feedback register array structure, or with number of flip-flops in longest circular ring feedback register array structure being positive multiples of that of other circular ring feedback register array structure(s), formed by the signal lines to be probed and flip-flops having double data inputs with the partial circuit of the designed circuit to be verified, allocated to the component devices, and an output of a predetermined flip-flop existing in circular ring feedback register array structure being logically connected to at least one output probe line of the component devices in output probe mode, and an input of the one flip-flop existing in said at least one circular ring feedback register array structure being logically connected to said at least one input probe line in input probe mode, and wherein in normal mode, the partial circuit of the designed circuit to be verified augmented by said additional circuit for P-probe becomes a functionally equivalent circuit to the partial circuit of the designed circuit to be verified allocated to the respective component devices.

24. The prototyping system as set forth in claim 23, wherein said circular ring feedback register array structure of said additional circuit for P-probe being comprised of serially connecting flip-flops each having double inputs.

25. The prototyping system as set forth in claim 24, wherein a single clock can be applied to all clock inputs of the flip-flops having double inputs of the circular ring feedback register array structure of said additional circuit for P-probe in probe mode.

26. The prototyping system as set forth in claim 23, said circular ring feedback register array structure of said additional circuit for P-probe being comprised of serially connecting flip-flops each having double inputs and one side input and output of a multiplexer and by connecting other side input of the multiplexer to an input probe line.

27. A prototyping method comprising steps for:

inputting a designed circuit to be verified in server computer;

partitioning said input designed circuit into a plurality of first partial circuits and allocating each of the first partial circuits to respective one of a plurality of component devices;

producing additional circuit for R-communication which carries out communication among the component devices in order to make a circuit produced through communication among the component devices to be functionally equivalent to the designed circuit to be verified;

producing a plurality of programming patterns by producing a plurality of first extended partial circuits of the designed circuit to be verified by combining each of the first partial circuits which is needed to be implemented in respective component devices and the additional circuit for R-communication, and by implementing said each of the first extended partial circuits to respective component device;

downloading each of the produced programming patterns from the server computer to respective component device in a prototyping engine through the interface module and enforcing an equivalent circuit to the designed circuit to be verified to be implemented in the prototyping engine; and executing verification of the designed circuit to be verified by applying input stimuli to said implemented equivalent circuit and observing output responses from said implemented equivalent circuit.

28. The prototyping method as set forth in claim 27, said prototyping engine being comprised of a reconfigurable logic module, each of the component devices in the reconfigurable logic module being a Reusable Field Programmable Device (RFPD) capable of implementing various forms of digital hardware through programming each said device, and each RFPD including at least one inter-RFPD communication port connected to an input/output terminal thereof.

29. The prototyping method as set forth in claim 27, said prototyping engine being comprised of a prototyping engine box, each of the component devices in said engine box being a prototyping engine module which includes at least one inter-module communication port connected to an input/output terminal thereof, and said prototyping engine module including at least one RFPD, said method further including a step for re-partitioning said partitioned partial circuit for a predetermined prototyping engine module into a plurality of second partial circuits and re-allocating each of the second partial circuits to respective RFPDs (Reusable Field Programmable Devices) and other component devices in said predetermined prototyping engine module.

30. The prototyping method as set forth in claim 29, said prototyping engine being comprised of a prototyping engine cabinet, each component device in said engine cabinet being a prototyping engine box which includes at least one inter-box communication port connected to an input/output terminal thereof, said prototyping engine box including at least two prototyping engine modules, and said prototyping engine module including at least one RFPD (Reusable Field Programmable Device), said method further including steps of:

re-partitioning said partitioned partial circuit for a predetermined prototyping engine box into a plurality of second partial circuits and re-allocating each of the second partial circuits to respective prototyping engine modules in said predetermined prototyping engine box; and re-partitioning again said re-partitioned second partial circuit for the predetermined prototyping engine module in said box into a plurality of third partial circuits and re-allocating again each of the third partial circuits to respective RFPDs and other component devices in said predetermined prototyping engine module.

31. The prototyping method as set forth in claim 27, said step for inputting said designed circuit comprising the step for inputting a ASIC vendor library title into the server computer.

32. The prototyping method as set forth in claim 27, said prototyping engine further comprising at least one probe line connected to input/output portions of the component devices, and each of the component devices further comprising an additional circuit for P-probe, said step for inputting said designed circuit comprising a step of inputting signal lines to be probed which exist in the designed circuit to be verified into the server computer, said method further including a step of determining whether each of the signal lines to be probed is input probe signal line or output probe signal line; and said step for producing said plurality of programming patterns including a step of producing a plurality of second extended partial circuits of the designed circuit to be verified by combining each of the first extended partial circuits which is needed to be implemented in respective component devices and the additional circuit for P-probe, and by implementing said each of the second extended partial circuits to respective component device, so that signal values on some output-probe signal lines in a predetermined time frame appear at output probe line during a certain time period only and some input-probe signal lines have signal values on input probe line applied at the predetermined time period thereto.

33. The prototyping method as set forth in claim 32, said method further including a step of enforcing signal values on the output-probe signal lines at the predetermined time frame to appear on the output probe lines of the component devices having the signal lines inside by using additional circuit for P-probe, transmitting the signal values appearing on the output probe lines to the server computer through a system interface port and an interface module, and analyzing the transmitted values for output-probe signal lines, and producing data for input probe on the server computer, and then applying data for input probe to input probe lines in the component devices through the system interface port and the interface module at least with synchronizing with probe clocks, and then enforcing the signal values of the input probe signal lines to have the input probe values transmitted via the input probe lines.

34. A method for connecting signal lines among partial circuits of a designed circuit to be verified, including steps of:

partitioning the designed circuit to be verified into a plurality of partial circuits of the designed circuit to be verified; and producing a plurality of circuits to be functionally equivalent to the designed circuit by combining each of the partial circuits of the designed circuit to be verified and an additional circuit for R-communication.

35. The method as set forth in claim 34, said additional circuit for R-communication being composed of a plurality of signal transmitters, a plurality of signal receivers, a plurality of finite state machines and communication channels.

36. The method as set forth in claim 34, said method for connecting signal lines among partial circuits of a designed circuit to be verified being executed through pipelined communication with ring topology communication channels.

37. The method as set forth in claim 36, wherein timing of pipelined communication for connecting the signal lines among the partial circuits of the designed circuit to be verified being controlled by finite state machines in the partial circuits for R-communication.

38. The method as set forth in claim 34, wherein a cycle of emulation clock being comprised of a R-communication phase and an execution phase, wherein in the R-communication phase, transmission of signal values for connecting signal lines among the partial circuits of the designed circuit to be verified is carried out through pipelined communication with ring topology communication channels, and wherein in the execution phase, the partial circuits of the designed circuit to be verified is executed with the transmitted signal values.

* * * * *